US012419067B2

(12) United States Patent
Abe et al.

(10) Patent No.: US 12,419,067 B2
(45) Date of Patent: Sep. 16, 2025

(54) SEMICONDUCTOR DEVICE

(71) Applicant: FUJI ELECTRIC CO., LTD., Kawasaki (JP)

(72) Inventors: Hitoshi Abe, Matsumoto (JP); Hiroshi Miyata, Matsumoto (JP); Hidenori Takahashi, Matsumoto (JP); Seiji Noguchi, Matsumoto (JP); Naoya Shimada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 26 days.

(21) Appl. No.: 17/403,666

(22) Filed: Aug. 16, 2021

(65) Prior Publication Data
US 2021/0376132 A1    Dec. 2, 2021

Related U.S. Application Data

(60) Division of application No. 15/416,453, filed on Jan. 26, 2017, now Pat. No. 11,127,844, which is a
(Continued)

(30) Foreign Application Priority Data

Feb. 3, 2015   (JP) .................................. 2015-019372

(51) Int. Cl.
*H10D 12/00*    (2025.01)
*H01L 21/768*   (2006.01)
(Continued)

(52) U.S. Cl.
CPC ..... *H10D 12/481* (2025.01); *H01L 21/76897* (2013.01); *H10D 12/038* (2025.01);
(Continued)

(58) Field of Classification Search
CPC ........... H01L 29/7397; H01L 21/76897; H01L 29/0619; H01L 29/0696; H01L 29/0804;
(Continued)

(56) References Cited

U.S. PATENT DOCUMENTS

| 5,473,176 A | 12/1995 | Kakumoto |
| 6,403,459 B1 * | 6/2002 | Ohashi .............. H01L 21/76834 438/626 |

(Continued)

FOREIGN PATENT DOCUMENTS

| CN | 103035692 A | 4/2013 |
| CN | 103828060 A | 5/2014 |

(Continued)

OTHER PUBLICATIONS

Fukuda, et al., "CSTBT™ (III) having wide SOA under high temperature condition", Proceedings of the 23rd International Symposium on Power Semiconductor Devices & IC's May 23-26, 2011 San Diego, CA, pp. 132-135.

(Continued)

*Primary Examiner* — Ori Nadav

(57) ABSTRACT

A semiconductor device includes a plurality of first trenches each having a stripe-shape, extending in parallel to each other, a first mesa region, a second mesa region, a first interlayer insulating film covering the first mesa region and the second mesa region, and a first contact hole penetrating the first interlayer insulating film to the first mesa region, and extending along a longitudinal direction of the first trenches. The first mesa region includes emitter regions of a first conductivity type periodically provided along the longitudinal direction of the first trenches in a plan view, contact regions of a second conductivity type provided such that each of the emitter regions is interposed between the contact regions along the longitudinal direction in the plan view, and a base region of the second conductivity type
(Continued)

provided immediately below the emitter regions and the contact regions.

25 Claims, 60 Drawing Sheets

Related U.S. Application Data continuation of application No. PCT/JP2016/000562, filed on Feb. 3, 2016.

(51) Int. Cl.

| | | |
|---|---|---|
| *H10D 12/01* | (2025.01) | |
| *H10D 62/10* | (2025.01) | |
| *H10D 62/13* | (2025.01) | |
| *H10D 62/17* | (2025.01) | |
| *H10D 64/01* | (2025.01) | |
| *H10D 64/27* | (2025.01) | |
| *H10D 64/62* | (2025.01) | |
| *H10D 8/00* | (2025.01) | |
| *H10D 84/80* | (2025.01) | |

(52) U.S. Cl.
CPC ......... *H10D 62/106* (2025.01); *H10D 62/127* (2025.01); *H10D 62/133* (2025.01); *H10D 62/137* (2025.01); *H10D 62/177* (2025.01); *H10D 62/393* (2025.01); *H10D 64/01* (2025.01); *H10D 64/513* (2025.01); *H10D 64/516* (2025.01); *H10D 64/518* (2025.01); *H10D 64/62* (2025.01); *H10D 8/422* (2025.01); *H10D 84/811* (2025.01)

(58) Field of Classification Search
CPC ............. H01L 29/0821; H01L 29/1004; H01L 29/1095; H01L 29/401
USPC ......................................................... 257/139
See application file for complete search history.

(56) References Cited

U.S. PATENT DOCUMENTS

| | | | |
|---|---|---|---|
| 9,178,050 B2 | 11/2015 | Higuchi et al. | |
| 2004/0164349 A1 | 8/2004 | Nishiwaki et al. | |
| 2009/0179260 A1 | 7/2009 | Kobayashi | |
| 2010/0193796 A1 | 8/2010 | Nakano | |
| 2011/0241098 A1 | 10/2011 | Park et al. | |
| 2012/0146091 A1* | 6/2012 | Tanabe | H01L 29/66348 |
| | | | 257/E29.197 |
| 2013/0082302 A1 | 4/2013 | Nakamura et al. | |
| 2013/0234200 A1 | 9/2013 | Fuji | |
| 2014/0217464 A1* | 8/2014 | Higuchi | H01L 29/0834 |
| | | | 257/139 |
| 2014/0339602 A1* | 11/2014 | Higuchi | H01L 29/0808 |
| | | | 257/141 |
| 2015/0008478 A1 | 1/2015 | Cheng et al. | |
| 2016/0005844 A1 | 1/2016 | Kimura et al. | |
| 2016/0043205 A1 | 2/2016 | Kamata | |
| 2016/0163649 A1 | 6/2016 | Oosuka et al. | |

FOREIGN PATENT DOCUMENTS

| | | |
|---|---|---|
| DE | 11 2012 004 026 T5 | 7/2014 |
| EP | 0 962 987 A2 | 12/1999 |
| JP | 4-258153 | 9/1992 |
| JP | 6-13621 | 1/1994 |
| JP | 8-274301 | 10/1996 |
| JP | 2004-14763 | 1/2004 |
| JP | 2004-259934 | 9/2004 |
| JP | 2006-210547 | 8/2006 |
| JP | 2011-181840 | 9/2011 |
| JP | 2012-69861 | 4/2012 |
| JP | 2013-84904 | 5/2013 |
| JP | 2013-175707 | 9/2013 |
| JP | 2013-187440 | 9/2013 |
| JP | 2014-27076 | 2/2014 |
| JP | 2014-241426 | 12/2014 |
| WO | 2013-046578 A1 | 4/2013 |
| WO | 2014/125584 A1 | 8/2014 |

OTHER PUBLICATIONS

International Search Report dated May 10, 2016, in corresponding International Application No. PCT/JP2016/000562.
International Preliminary Report on Patentability mailed Aug. 17, 2017, in corresponding International Patent Application No. PCT/JP2016/000562 (in English).
Chinese Office Action dated Feb. 20, 2019, from Chinese Patent Application No. 201680002154.1, 21 pages Including machine translation.
Notice of Allowance dated May 17, 2021, from U.S. Appl. No. 15/416,453.
Advisory Action dated Feb. 17, 2021, from U.S. Appl. No. 15/416,453.
Final Office Action dated Dec. 7, 2020, from U.S. Appl. No. 15/416,453.
Office Action dated Feb. 15, 2019, from U.S. Appl. No. 15/416,453.
Advisory Action dated Dec. 10, 2018, from U.S. Appl. No. 15/416,453.
Final Office Action dated Oct. 3, 2018, from U.S. Appl. No. 15/416,453.
Office Action dated Jan. 11, 2018, from U.S. Appl. No. 15/416,453.
German Office Action issued in German Application No. 11 2016 000 071.5 dated Jul. 13, 2023.

\* cited by examiner

SEMICONDUCTOR DEVICE

INCORPORATION BY REFERENCE

This application is a Divisional of U.S. patent application Ser. No. 15/416,453 filed on Jan. 26, 2017, which is a Continuation of International Application No. PCT/JP2016/000562 filed on Feb. 3, 2016, and which claims the benefit of priority under 35 USC 119 to Japanese Patent Application No. 2015-019372 filed Feb. 3, 2015. The contents of U.S. patent application Ser. No. 15/416,453, International Application No. PCT/JP2016/000562, and Japanese Patent Application No. 2015-019372 are each incorporated herein by reference in their entirety.

BACKGROUND

1. Field of the Invention

The present invention relates to a semiconductor device and a method for manufacturing the same, and more particularly, to techniques that can be effectively applied to semiconductor devices related to, for example, a trench insulated-gate bipolar transistor (IGBT) and a method for manufacturing the semiconductor devices.

2. Description of the Related Art

A trench IGBT, in which a trench is buried in a main surface of a semiconductor substrate and a gate electrode is buried in the trench through a gate insulating film, has been known. In recent years, since the increase of channel integration density and the reduction of an on-state voltage by the trench IGBT are possible, the fields to which the trench IGBT is applied have increased as compared to a planar IGBT. In addition, as the trench IGBT, an IGBT structure in which n-type emitter regions and p-type contact regions are alternately arranged in island regions interposed between adjacent trenches along the longitudinal direction of the island regions has been known. In the IGBT, the emitter-injection width of a p-n junction interface between the n-type emitter region and the p-type base region in the longitudinal direction of the island region is reduced to decrease the gate width. Therefore, improving latch-up immunity to a parasitic thyristors is possible.

However, in a vertical trench IGBT disclosed in JP 2013-187440 A, an emitter-injection width relatively depends on the width—emitter-region contact-width—of the surface of an n-type emitter region which is defined in the longitudinal direction of the island region. Therefore, when the emitter-injection width is reduced to decrease the gate width, the surface area of the n-type emitter region is reduced and the contact resistance between the n-type emitter region and an emitter electrode electrically connected to the n-type emitter region increases. As a result, the on-state voltage increases.

In particular, in the trench IGBT, the width of the island region tends to be reduced so as to increase the number of island regions, in order to increase current density. Therefore, when the width of the island region is reduced, the surface area of the n-type emitter region is reduced and the contact resistance between the n-type emitter region and the emitter electrode increases. Therefore, maximizing the surface area of the emitter region in order to scale down the island region is necessary.

SUMMARY

An object of the invention is to provide a technique that can improve the latch-up immunity of an IGBT used in an individual device or a power IC or a semiconductor device which operates similarly to the IGBT and can reduce an on-state voltage.

In order to achieve the object, an aspect of the semiconductor device according to the present invention includes: a drift layer of a first conductivity type; a mesa region that is interposed between adjacent trenches on the drift layer; a gate electrode buried in each trench through a gate insulating film; a base region of a second conductivity type buried in the mesa region; a plurality of emitter regions of the first conductivity type that are periodically buried in a surface layer portion of the base region along a longitudinal direction of the trench; and contact regions of the second conductivity type that are alternately buried in the longitudinal direction together with the emitter regions such that each emitter region is interposed between the contact regions, are deeper than the emitter region, and extend immediately below the emitter region so as to be separated from each other, a contact-region contact-width in the longer direction defined in a surface of the contact region being less than an emitter-region contact-width in the longer direction defined in a surface of the emitter region.

In another aspect of the disclosure, a semiconductor device having a transistor portion includes a plurality of first trenches each having a stripe-shape, extending in parallel to each other, a first mesa region composed of a minute-pattern with a width of 0.1 micro meters to 1.0 micro meter, a second mesa region composed of a minute-pattern with a width of 0.1 micro meters to 1.0 micro meter, a first interlayer insulating film covering the first mesa region and the second mesa region, and a first contact hole penetrating the first interlayer insulating film to the first mesa region, and extending along a longitudinal direction of the first trenches. The first mesa region includes emitter regions of a first conductivity type periodically provided along the longitudinal direction of the first trenches in a plan view, contact regions of a second conductivity type provided such that each of the emitter regions is interposed between the contact regions along the longitudinal direction in the plan view, and a base region of the second conductivity type provided immediately below the emitter regions and the contact regions.

An aspect of the method for manufacturing a semiconductor device according to the present invention includes: forming a base region of a second conductivity type in a surface layer portion of a semiconductor substrate of a first conductivity type; selectively implanting first impurity ions of the second conductivity type into a plurality of regions periodically buried in a surface layer portion of the base region along one direction; selectively implanting second impurity ions of the first conductivity types into the surface layer portion of the base region between the plurality of regions having the first impurity ions implanted along the one direction in a pattern that is arranged at a greater interval than an array pattern of the plurality of regions and is arranged at the same pitch as the plurality of regions and with a lower acceleration energy than the first impurity ions; and activating the first and second impurity ions such that a contact region of the second conductivity type is formed in the region having the first impurity ions implanted and an emitter region of the first conductivity type is formed in the region having the second impurity ions implanted.

DETAILED DESCRIPTION

Figure 1:
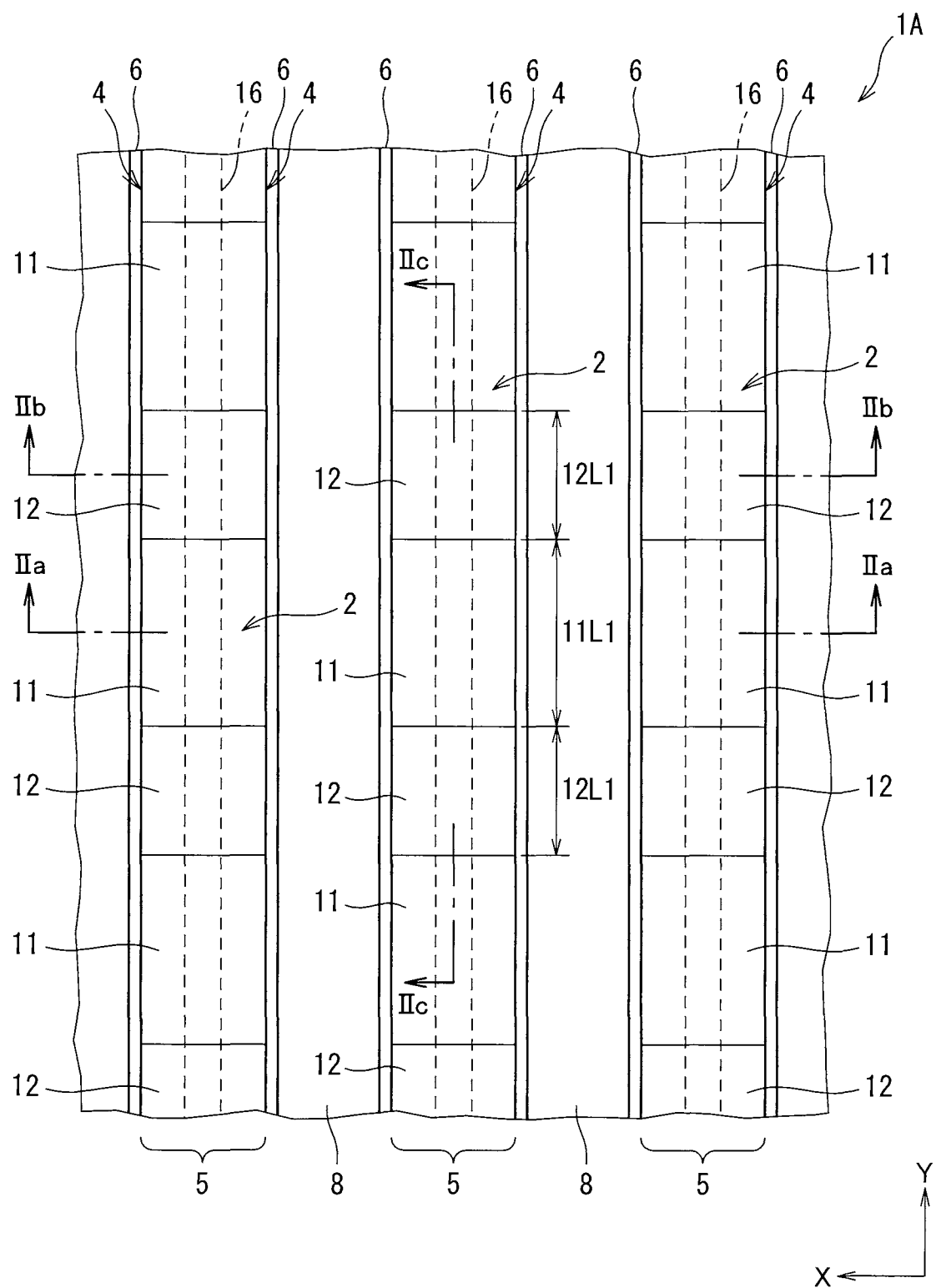
FIG. 1 is a plan view illustrating a main portion of a semiconductor device according to a first embodiment of the present invention.

Hereinafter, semiconductor devices according to first to fourth embodiments of the present invention will be described with reference to the drawings. In the following first to fourth embodiments, examples in which a first conductivity type is an n-type and a second conductivity type is a p-type will be described. However, the relationship between the conductivity types may be reversed such that the first conductivity type is the p-type and the second conductivity type is the n-type. In the specification and the accompanying drawings, the majority carriers are electrons in the layers or regions having "n" appended thereto, and the majority carriers are holes in the layers or regions having "p" appended thereto. In addition, symbols "+" and "−" labeled to n or p means that the impurity concentration of a semiconductor region is higher and lower than that of a semiconductor region without the symbols.

In the following description, the terms "top" and "bottom" in, for example, "top surface" and "bottom surface" are defined depending on cross-sectional views. For example, when the direction of a semiconductor integrated circuit is changed by 90° and is then observed, the terms "top" and "bottom" change to "left" and "right", respectively. When the direction of the semiconductor integrated circuit is changed by 180° and is then observed, the terms "top" and "bottom" are reversed.

In the description of the following first to fourth embodiments and the accompanying drawings, the same components are denoted by the same reference numerals and the description thereof will not be repeated. In addition, in the accompanying drawings described in the first to fourth embodiments, for ease of viewing or understanding, a scale and a dimensional ratio are different from the actual scale and dimensional ratio. The present invention is not limited to the following first to fourth embodiments as long as it does not depart from the scope and spirit thereof.

In the following embodiments, the first and second directions which are orthogonal to each other in the same plane are referred to as an X direction and a Y direction, respectively. In FIGS. 1, 12, 13, 15, 29, 32, 37, and 45, the horizontal direction is defined as the X direction and the vertical direction is defined as the Y direction.

In FIGS. 2, 3, 7-11, 13, 16-19, 21-27, 30, 31, 33-36, 38-44, and 47-60, the horizontal direction is defined as the X direction. In FIGS. 4-6, 14, 17, 20, and 46, the horizontal direction is defined as the Y direction.

Figure 5:
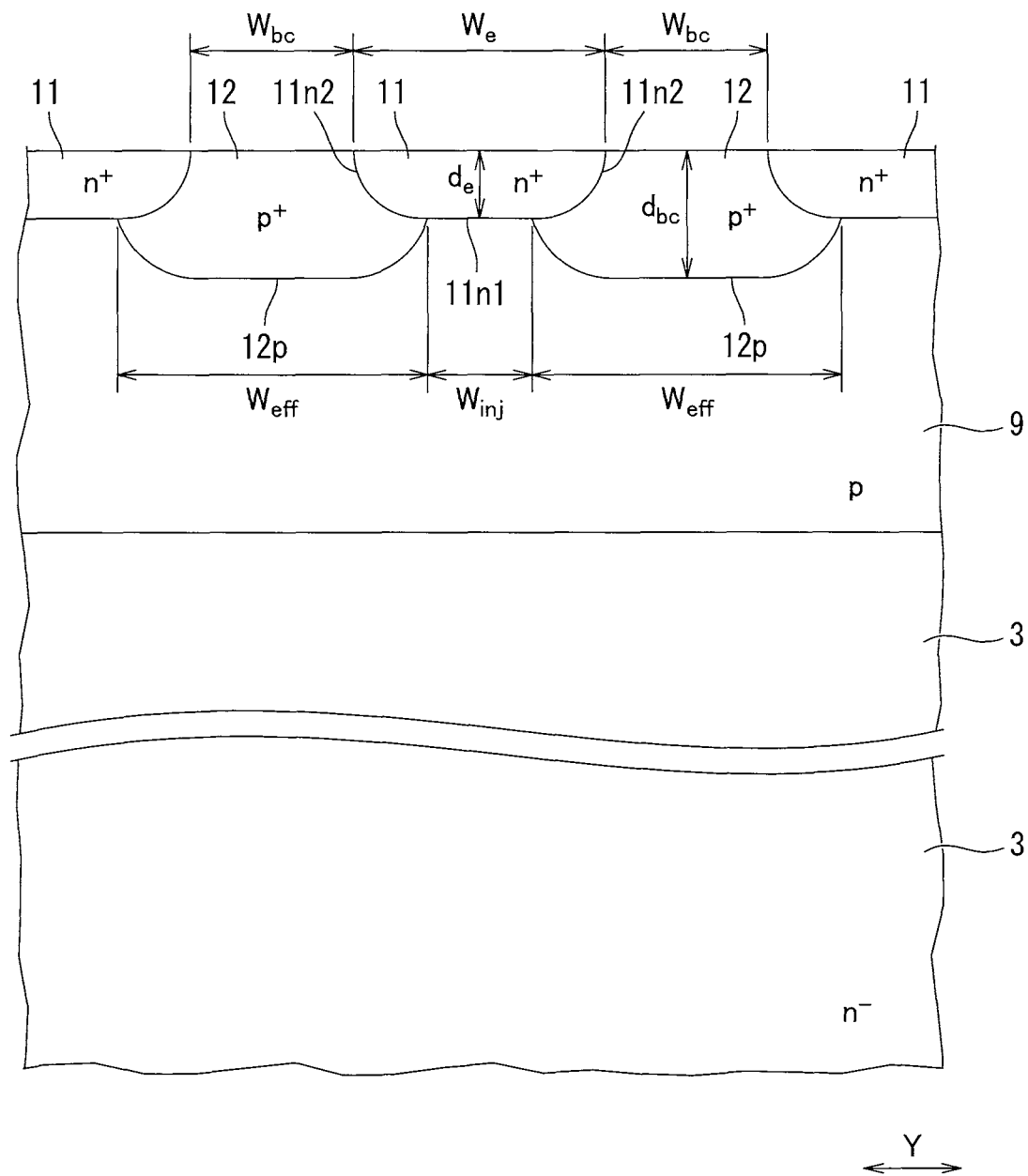
FIG. 5 is an enlarged cross-sectional view illustrating a portion of FIG. 4.
Figure 6:
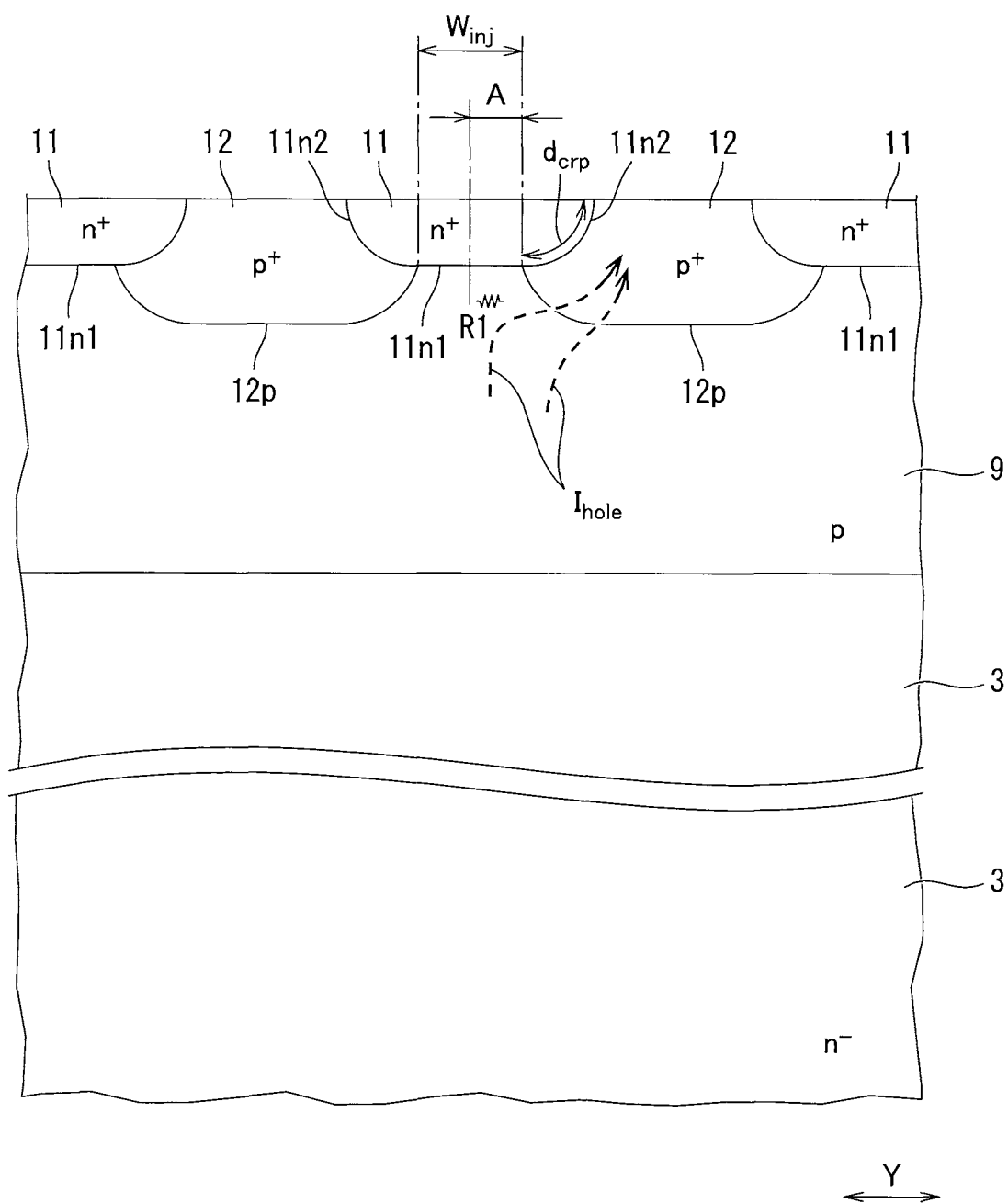
FIG. 6 is an enlarged cross-sectional view illustrating a portion of FIG. 4.

In FIGS. 5 and 6, for ease of viewing of the drawings, hatching indicating a cross-section is omitted.

First Embodiment

<Structure of Semiconductor Device According to First Embodiment>

As an example of a semiconductor device 1A according to a first embodiment of the present invention, a trench IGBT will be described, in which a drift layer 3 of the trench IGBT is implemented by a portion of a semiconductor substrate, as illustrated in FIGS. 1-4.

Figure 2:
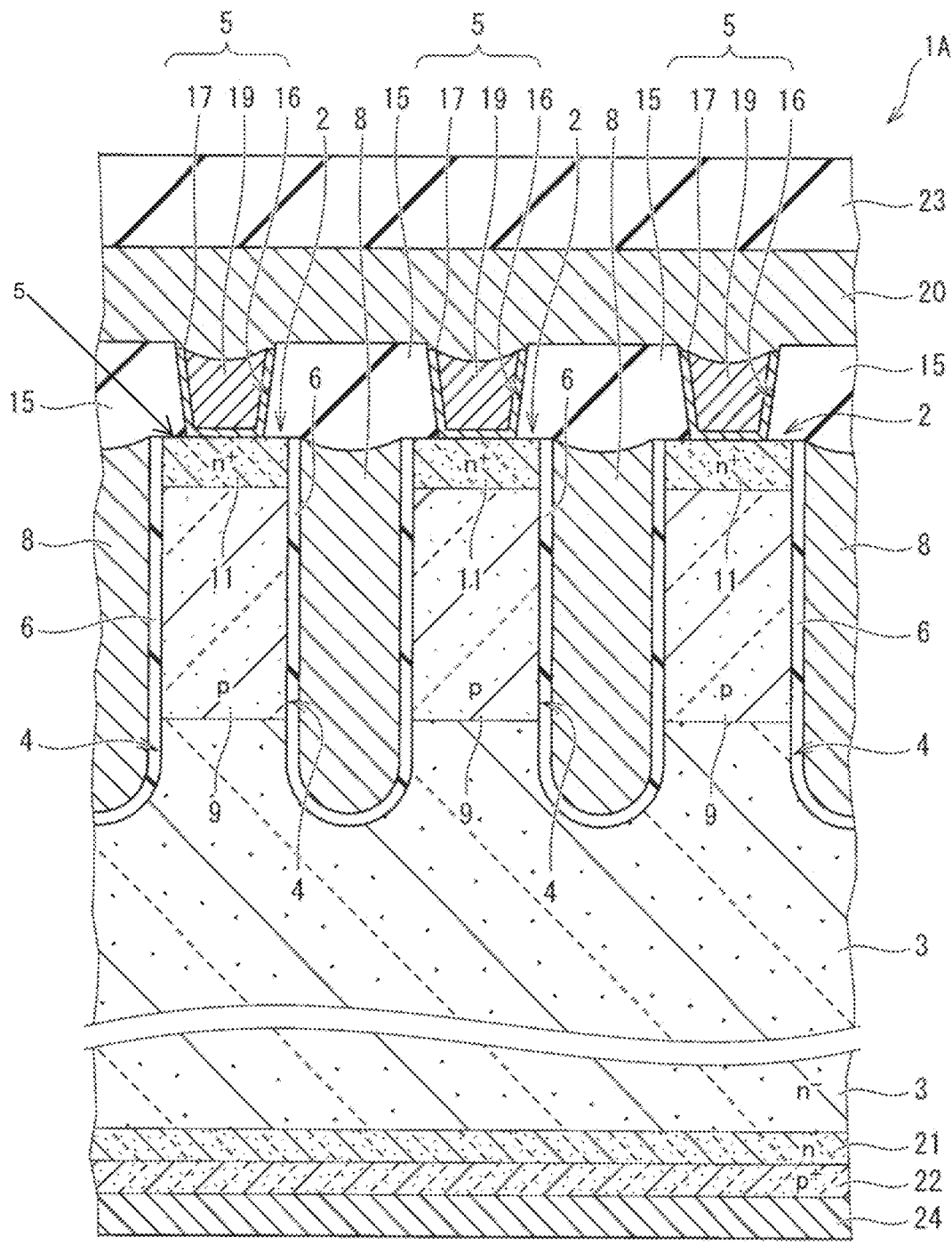
FIG. 2 is a cross-sectional view illustrating a main portion of a cross-sectional structure taken along the line IIa-IIa of FIG. 1.

As illustrated in FIG. 1, the X direction and the Y direction which are orthogonal to each other are defined in a main surface of the semiconductor substrate having the drift layer 3 inside. As illustrated in FIG. 2, mesa regions 5 are partitioned by trenches 4 which are adjacent to each other in the X direction. As can be seen from FIG. 1, a plurality of trenches 4 and a plurality of mesa regions 5 are periodically arranged in the X direction so as to establish a plurality planar patterns, each of which extends in a stripe shape in parallel along the Y direction.

Figure 3:
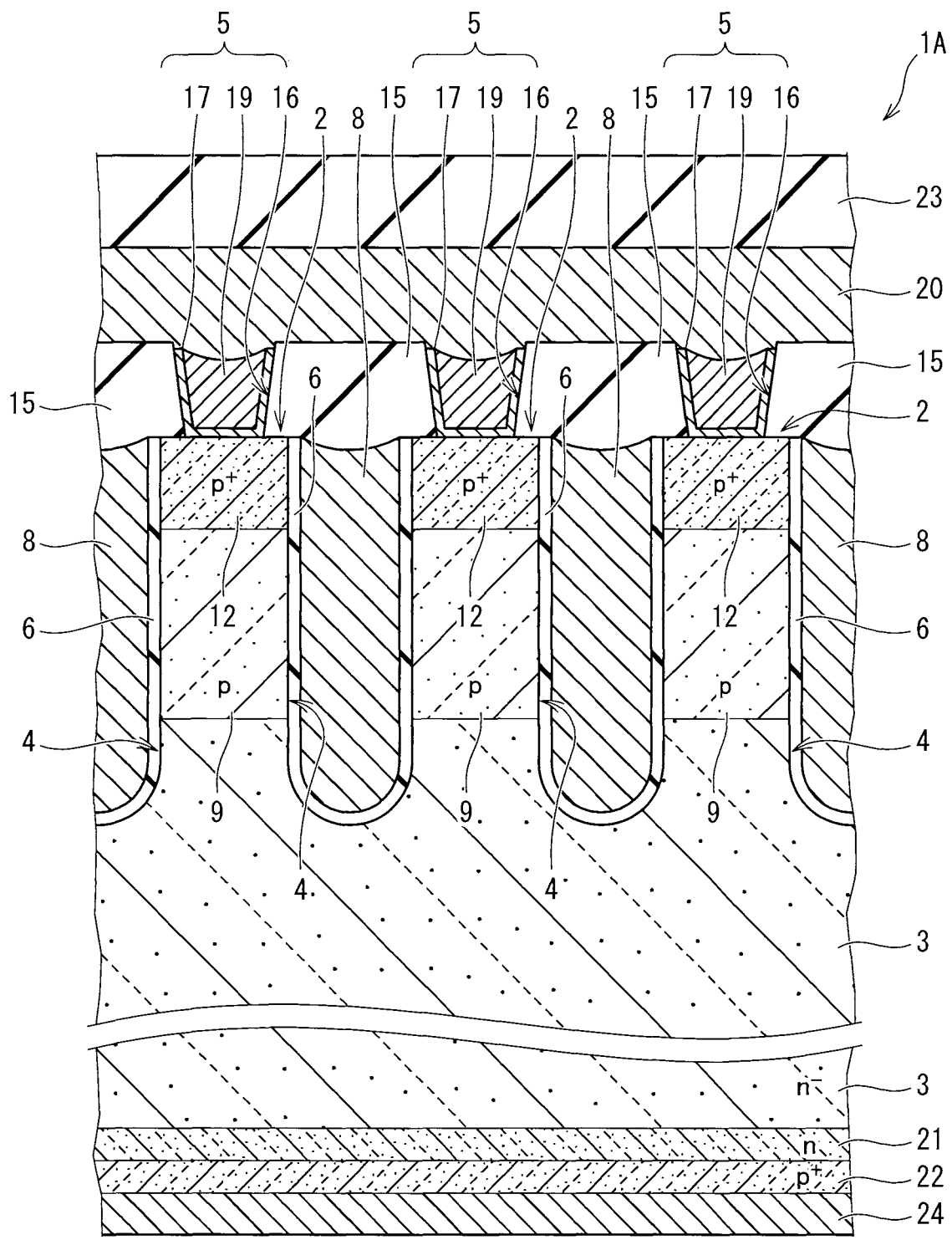
FIG. 3 is a cross-sectional view illustrating a main portion of a cross-sectional structure taken along the line IIb-IIb of FIG. 1.

In a trench IGBT, a plurality of minute-pattern transistor cells 2 are electrically connected in parallel to each other. Therefore, a multi-cell structure capable of obtaining a large amount of current is implemented. FIGS. 1-3 illustrate a portion of the semiconductor device 1A according to the first embodiment in which triple transistor cells 2 and triple mesa regions 5 are arranged. However, the present invention is not limited to the structure illustrated in the FIGS. 1-3.

As illustrated in FIG. 2, a plurality of trenches 4 which are adjacent to each other in the X direction are cut in the upper surface of the drift layer 3. Regions which are interposed and partitioned between a pair of opposite trenches 4 among the plurality of trenches 4 are defined as "the mesa regions 5", respectively. A gate insulating film 6 is provided on the inner wall of each of the plurality of trenches 4.

Gate electrodes 8 are buried in each of the trenches 4 through the gate insulating film 6, respectively. As can be seen from FIGS. 1-3, a base region 9 of a second conductivity type (p-type) is buried in a surface layer portion of the mesa region 5 in each transistor cell 2.

A plurality of emitter regions 11 of a first conductivity type ($n^+$-type) are periodically buried in the surface layer portion of the base region 9 along the Y direction. In addition, a plurality of contact regions 12 of the second conductivity type ($p^+$-type) are interposed between the emitter regions 11.

Figure 4:
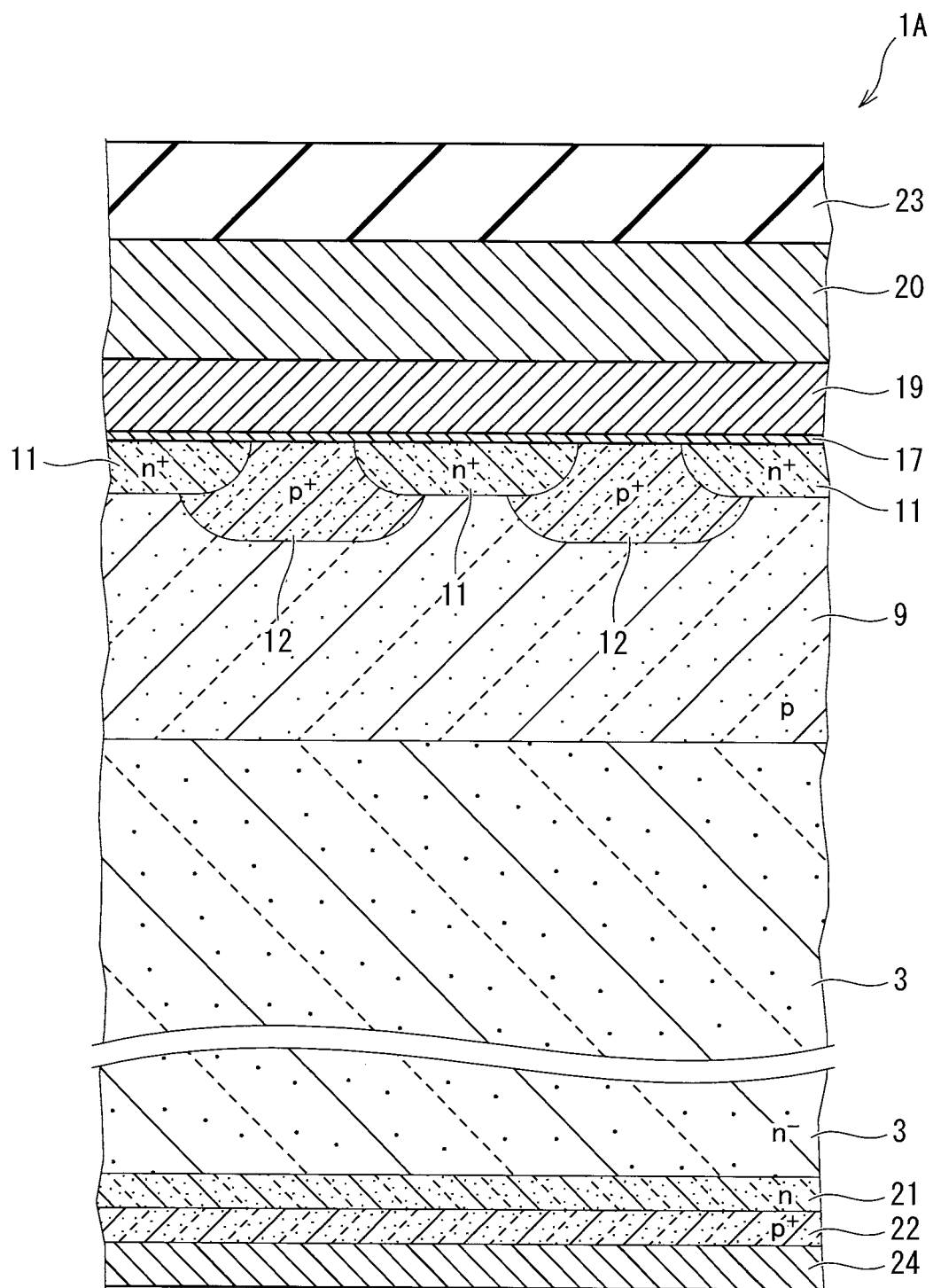
FIG. 4 is a cross-sectional view illustrating a main portion of a cross-sectional structure taken along the line IIc-IIc of FIG. 1.

The plurality of emitter regions 11 and the plurality of contact regions 12 are alternately arranged in the Y direction. The depth of the contact region 12 is greater than the depth of the emitter region 11 so that a pair of the contact regions 12 can sink around toward limited regions just below the both sides of the emitter regions 11, the pair of the contact regions 12 are being separated from each other as illustrated in FIG. 4.

A plurality of transistor cells 2 include, as a common region, the common drift layer 3, which can be made of the semiconductor substrate, and a buffer layer 21 of the first conductivity type (n-type) and a collector region 22 of the second conductivity type ($p^+$-type) which are provided on the rear surface of the drift layer 3.

The drift layer 3 is made of, for example, single-crystalline silicon. Each of the trench 4 and the mesa region 5 extends from the surface of the mesa region 5 in a depth direction. The trench 4 is dug with, for example, a width of about one micro meters and a depth of about five micro meters to ten micro meters. However, in the present invention, the sizes of the trench 4 are not limited by these exemplified values. The width of the mesa region 5 in the X direction is, for example, in the range of 0.1 micro meters to one micro meter and may be, for example, 0.5 micro meters.

The gate insulating film 6 is, for example, a silicon dioxide ($SiO_2$) film formed by a thermal oxidation method. However, the silicon oxide film can be formed by other methodology than the thermal oxidation method. Furthermore, for example, the gate insulating film 6 may be the silicon oxide film or a silicon nitride ($Si_3N_4$) film deposited by a chemical vapor deposition (CVD) method, or stacked films implemented by a combination of these films.

In particular, the $SiO_2$ film formed by the thermal oxidation method is preferable and advantageous, because the thermal oxidation film has a high quality of densified structure required for a power device—power semiconductor device—facilitating the operation with a high breakdown voltage.

For the gate electrode 8, for example, a polycrystalline-silicon film, or a doped-polysilicon film, to which impurity atoms are doped, can be used as a conductive film having a low resistivity. The depth of the base region 9 is less than the depth of the bottom of the trench 4. When a voltage that is equal to or higher than a threshold voltage is applied to the gate electrode 8, a channel of an inversion layer is induced in a portion of the base region 9 which comes into contact with the sidewall of the trench 4 immediately below the emitter region 11.

The emitter region 11 and the contact region 12 are provided so as to connect facing two sidewalls of the trenches 4, the two sidewalls are assigned as a pair of sidewalls, each of sidewalls is elected from the sidewalls of the adjacent trenches 4, respectively, as illustrated in FIG. 2. In addition, the emitter region 11 and the contact region 12 are provided so as to have the same width as the mesa region 5 in the X direction. In other words, the emitter region 11 and the contact region 12 are provided so as to bridge a pair of gate insulating films 6 that are opposite to each other in the X direction of the mesa region 5.

The base region 9 has a higher impurity concentration than the drift layer 3. The emitter region 11 has a higher impurity concentration than the base region 9 and the contact region 12. The contact region 12 has a higher impurity concentration than the base region 9 in order to reduce the contact resistance between an emitter electrode 20 and the base region 9, which will be described below.

The buffer layer 21 is provided between the drift layer 3 and the collector region 22. The buffer layer 21 and the collector region 22 have a higher impurity concentration than the drift layer 3.

The $n^-$ drift layer 3 has an impurity concentration of, for example, about $7 \times 10^{13}/cm^3$. The p-type base region 9 has an impurity concentration of, for example, about $1 \times 10^{17}/cm^3$. The $n^+$ emitter region 11 has an impurity concentration of, for example, about $1 \times 10^{20}/cm^3$, the $p^+$ contact region 12 has an impurity concentration of about $3 \times 10^{18}/cm^3$ to $3 \times 10^{19}/cm^3$. For example, the $p^+$ contact region 12 may have an impurity concentration of about $1 \times 10^{19}/cm^3$.

Preferably, the n-type buffer layer 21 has an impurity concentration of, for example, about $1\times10^{16}/cm^3$ and the $p^+$ collector region 22 has an impurity concentration of, for example, about $1\times10^{18}/cm^3$.

As illustrated in FIGS. 2 and 3, an interlayer insulating film 15 which is, for example, a $SiO_2$ film is deposited so as to cover the entire surface of the trench 4 and the mesa region 5. Then, a contact hole 16 is cut in the interlayer insulating film 15 so as to penetrate from the surface of the interlayer insulating film 15 to the surface of the mesa region 5 through the interlayer insulating film 15.

As represented by a dotted line in FIG. 1, the pattern of the contact hole 16 extends along the Y direction in the planar pattern of the mesa region 5, or along the longer direction of the mesa region 5 in the planar pattern. For example, the planar pattern of the contact hole 16 is formed into a stripe shape or a rectangular pattern in which the width of the contact hole 16 along the X direction is about 0.5 micro meters at a mask level.

As illustrated in FIGS. 2 and 3, in the contact hole 16, a barrier metal film 17 is selectively coated on the inner wall of the contact hole 16, the surface of the emitter region 11 and the surface of the contact region 12. The surface of the emitter region 11 and the surface of the contact region 12 are exposed at the bottom of the contact hole 16. In addition, the contact hole 16 is filled with a contact plug 19 so as to cover the barrier metal film 17.

The barrier metal film 17 is, for example, a composite film including a titanium nitride (TiN) film and a titanium (Ti) film disposed on the TiN film. For example, the contact plug 19 may be implemented by a refractory metal such as tungsten (W). The barrier metal film 17 is provided in order to prevent metallic atoms of the contact plug 19 from being diffused into a semiconductor of the mesa region 5.

The reason is that, when the metallic atoms of the contact plug 19 are diffused into the semiconductor of the mesa region 5, the mesa region 5 is damaged and contact resistance increases. The barrier metal film 17 is not provided on the surface of the interlayer insulating film 15 and is selectively buried in the contact holes 16.

As illustrated in FIGS. 2-4, the emitter electrode 20 is provided over the trenches 4 and the mesa regions 5 so as to cover the interlayer insulating film 15 and the contact plugs 19. The emitter electrode 20 is electrically connected to the emitter regions 11 and the contact regions 12 through the contact plugs 19 and the barrier metal films 17 buried in the contact holes 16.

The emitter electrode 20 can be made of, for example, an aluminum (Al) film or an aluminum alloy film such as an aluminum-silicon (Al—Si) alloy, an aluminum-copper (Al—Cu) alloy, or an aluminum-copper-silicon (Al—Cu—Si) alloy.

A protective film 23 is deposited on the emitter electrode 20 so as to cover the emitter electrode 20. For example, a bonding window for exposing a bonding pad for electrically connecting to the outside is cut in the protective film 23, the bonding pad is assigned to a portion of the emitter electrode 20, although the illustration of the bonding window in the drawing is omitted. The protective film 23 is made of, for example, a polyimide-based insulating resin.

A collector electrode 24 is electrically and metallurgically connected to the collector region 22 such that contact resistance is reduced. The collector electrode 24 is, for example, a composite layer of a plurality of metallic films such as Al and Ni films, where a gold (Au) film shall be arranged at the uppermost layer in the composite layer.

<Operation of Semiconductor Device According to First Embodiment>

Next, the operation of the semiconductor device according to the first embodiment will be described with reference to FIGS. 2 and 3.

In a condition that a first reference potential—for example, zero volt—is applied to the emitter electrode 20 and a second reference potential—for example, 650 V—higher than the first reference potential is applied to the collector electrode 24, the IGBT is turned off at the voltage of the gate electrode 8 that is lower than a threshold voltage.

Then, a potential difference between the emitter electrode 20 and the collector electrode 24 of the IGBT is set to zero volt. When a voltage higher than the threshold voltage is applied to the gate electrode 8 through a gate resistor by a gate driving circuit, although the illustration of the gate driving circuit in the drawing is omitted, an n-type inversion layer is induced in a portion of the p-type base region 9 which faces the gate electrode 8, with the gate insulating film 6 interposed between the p-type base region 9 and the gate electrode 8. The inversion layer becomes a channel.

Then, a voltage higher than a built-in potential—about 0.8 V—of the p-n junction between the collector region 22 and the buffer layer 21 is applied such that a forward bias is applied to the collector electrode 24. Electrons are injected from the emitter electrode 20 to the collector region 22 through the $n^+$ emitter region 11, the channel of the p-type base region 9, and the n-type drift layer 3.

In addition, holes are injected from the collector region 22 to the drift layer 3 through the buffer layer 21. Then, the IGBT is turned on. In the conductive state, the voltage drop between the emitter electrode 20 and the collector electrode 24 is defined as "the on-state voltage" of the IGBT.

In order to change the IGBT from the conductive state to the cut-off state, the voltage between the emitter electrode 20 and the gate electrode 8 is adjusted to a value that is equal to or lower than the threshold voltage. Then, charges accumulated in the gate electrode 8 are exhausted to the gate driving circuit through the gate resistor.

At that time, the channel which has been inverted to the n-type returns to the p-type, and the channel disappears. As a result, electrons are not supplied and the IGBT is turned off.

<Detailed Structure of Emitter Region and Collector Region>

Next, the emitter region 11 and the contact region 12 will be described.

As illustrated in FIG. 1, a plurality of $n^+$ emitter regions 11 and a plurality of $p^+$ contact regions 12 are provided along the longer direction of the trench 4 in the planar pattern. As illustrated in FIG. 5, the contact regions 12 which are arranged adjacent to each other, and the emitter region 11 is interposed among the contact regions 12. The contact regions 12 are buried so as to be deeper than the emitter region 11.

The lower portions of the two contact regions 12 extend to regions just below the emitter region 11 at both sides of the emitter region 11, and the two contact regions 12 are separated from each other. The depth $d_{bc}$ of the contact region 12 is, for example, about 1.5 micro meters and the depth $d_e$ of the emitter region 11 is, for example, about 0.5 micro meters.

As illustrated in FIG. 5, a contact-region contact-width $W_{bc}$, which is the length of the surface of the contact region 12 measured along the Y direction, or measured along the longer direction of the trench 4 or the mesa region 5, is less than an emitter-region contact-width $W_e$ which is the length of the surface of the emitter region 11 measured along the Y direction. The contact region 12 and the emitter region 11 contact with the emitter electrode 20 through the contact plug 19 and the barrier-metal film 17 as illustrated in FIG. 4.

The width of each of the contact-base interfaces 12$p$, which is a curved interface between the p$^+$ contact region 12 and the p-type base region 9, respectively, the width is measured along the Y direction on a straight line connecting both upper ends of the contact-base interface 12$p$, is defined as an "effective contact-region width $W_{eff}$". The width of an emitter-base p-n junction interface 11$n$1 measured along the Y direction is defined as an "emitter-injection width $W_{inj}$". Here, the emitter-base p-n junction interface 11$n$1 is an interface between the n$^+$ emitter region 11 and the p-type base region 9, and the emitter-base p-n junction interface 11$n$1 is represented by a straight line in FIG. 5. The effective contact-region width $W_{eff}$ is greater than the emitter-injection width $W_{inj}$. Although the first embodiment is not limited to the following values, for example, the contact-region contact-width $W_{bc}$ may be about two micro meters and the emitter-region contact-width $W_e$ may be about three micro meters.

The contact-region contact-width $W_{bc}$ is the width of the surface of the contact region 12 and the emitter-region contact-width $W_e$ is the width of the surface of the emitter region 11. In addition, the effective contact-region width $W_{eff}$ is about four micro meters and the emitter-injection width $W_{inj}$ is about one micro meter.

As illustrated in FIG. 6, a length A that is half of the emitter-injection width $W_{inj}$ is less than a creeping distance $d_{crp}$ of an emitter-contact p-n junction interface 11$n$2, which is an interface between the emitter region 11 and the contact region 12, along a curve in a cross-sectional view taken along the Y direction.

The semiconductor device 1A according to the first embodiment has a structure in which the n$^+$ emitter regions 11 and the p$^+$ contact regions 12 are alternately arranged in the Y direction, as illustrated in FIGS. 1-4. In the structure, the emitter-injection width $W_{inj}$ is reduced to decrease the gate width immediately below the emitter region 11, with reference to FIG. 5, which makes it possible to improve latch-up immunity to a parasitic thyristor.

In addition, the emitter-region contact-width $W_e$ increases to enlarge the surface area of the emitter region 11, which makes it possible to reduce on-state resistance.

In the semiconductor device 1A according to the first embodiment, as illustrated in FIGS. 4-6, the emitter region 11 is sandwiched in between a pair of the contact regions 12. Because the bottoms of the contact regions 12 are deeper than the emitter region 11, both of the lower portions of the contact regions 12 extend mutually toward limited portions just below both sides of the emitter region 11 so that the two contact regions 12 are separated from each other by the emitter region 11. Therefore, unlike the vertical trench IGBT disclosed in JP 2013-187440 A, the emitter-injection width $W_{inj}$ does not relatively depend on the emitter-region contact-width $W_e$ which is the width of the surface of the emitter region 11 measured along the Y direction.

As a result, the reduction of the emitter-injection width $W_{inj}$ is possible, without reducing the emitter-region contact-width $W_e$ of the emitter region that is connected to the emitter electrode 20 through the contact plug 19 and the barrier-metal film 17. In other words, the enlargement of the emitter-region contact-width $W_e$ is possible, without increasing the emitter-injection width $W_{inj}$.

The reason of the above advantageous effects is as follows. The emitter-injection width $W_{inj}$ is determined by the distance between the two contact regions 12, the lower portion of which mutually extend toward localized portions just below the both sides of the emitter region 11 so that he two contact regions 12 are separated from each other by the emitter region 11. Then, even if the emitter-region contact-width $W_e$ increases to enlarge the width of the emitter region 11, the emitter-injection width $W_{inj}$, does not vary.

Therefore, in the semiconductor device 1A according to the first embodiment, the reduction of the emitter-injection width $W_{inj}$ is possible, without reducing the emitter-region contact-width $W_e$ of the surface of the emitter region 11, and thus it is possible to minimize a total channel length immediately below the emitter region 11. And it is possible to reduce channel integration density.

Because the emitter-region contact-width $W_e$ can be increased, without increasing the emitter-injection width $W_{inj}$, the improvement of the latch-up immunity and the reduction of the on-state voltage of the trench IGBT are possible.

The emitter-region contact-width $W_e$ may be less than the contact-region contact-width $W_{bc}$. That is, the emitter region 11 may be provided such that lower portions of the two contact regions 12, which mate with both sides of the emitter region 11, extend towards localized portions just below the bottom of the emitter region 11, as the emitter region 11 is interposed among the two contact regions 12.

In the structure in which the n$^+$ emitter regions 11 and the p$^+$ contact regions 12 are alternately arranged in the Y direction, namely the longer direction in the planar pattern of the trench 4 or the mesa region 5, as illustrated in FIG. 5, the p-type base region 9 immediately below the emitter region 11 serves as a substantial channel formation region. Therefore, when the emitter region 11 having the emitter-region contact-width $W_e$ and the emitter-injection width $W_{inj}$ that are equal to each other is periodically arranged, channel integration density tends to decrease to a value lower than the structure of earlier technology in which an emitter region 11 is continuously buried in a stripe along the Y direction. In the structure of earlier technology, there is a case that the on-state voltage may increase in accordance with a reduction in channel integration density.

Here, the emitter-injection width $W_{inj}$ will be made larger, if the channel integration density is required to be made higher so as to reduce the on-state voltage. However, when the emitter-injection width $W_{inj}$ increases, a voltage drop, which is caused by holes passing immediately below the emitter region 11 when the semiconductor device is turned off, becomes higher than the built-in potential of the p-n junction between the emitter region 11 and the base region 9, and therefore the latch-up is susceptible to occur. The occurring of the latch-up is also caused by the structure in which the contact regions 12 and the emitter regions 11 are alternately arranged.

That is, since the emitter region 11 is formed in a configuration such that the emitter region 11 bridges adjacent trenches 4 as illustrated in FIG. 2, holes are required to move in the Y direction of FIG. 5 so that the holes can flow into the p$^+$ contact region 12.

Therefore, a voltage drop is increased by a value corresponding to the emitter-injection width $W_{inj}$, which is the width of the emitter-base p-n junction interface 11$n$1, and the latch-up is susceptible to occur. Therefore, in the structure in which the emitter regions 11 and the contact regions 12 are alternately arranged in the Y direction, a scheme for increasing the emitter-injection width $W_{inj}$, which is the width of the emitter-base p-n junction interface 11n1, so as to make the emitter-injection width $W_{inj}$ greater than a certain value, the value may be several micrometers, for example, is difficult.

In the semiconductor device according to the first embodiment, the emitter-region contact-width $W_e$ and the emitter-injection width $W_{inj}$ are different from each other. Specifically, bottoms of the two contact regions 12, which join with both sides of the emitter region 11, are deeper than the emitter region 11, and the lower portions of the two contact regions 12 mutually extend to portions immediately below the both sides of the bottom of the emitter region 11, in a configuration such that the emitter region 11 is interposed among the contact regions 12.

The distance, or the emitter-injection width $W_{inj}$, between the contact regions 12 immediately below the bottom of the emitter region 11 may be preferably in the range of 0.1 micro meter to two micro meters, for example.

In addition, when the width of the contact regions 12 in the Y direction is simply reduced relatively to the width of the emitter regions 11 so as to increase the fraction of the emitter regions 11 in the planar pattern, or to increase the number of emitter regions 11, the channel integration density can be increased. However, as the width of the contact region 12 in the Y direction is simply reduced relatively to the width of the emitter regions 11 so as to increase the fraction of the emitter region 11 in the planar pattern, or to increase the number of emitter regions 11, the hole current density immediately below the emitter regions 11 increases, because the concentration of holes which flow in the channel increases ascribable to the increase of the number of injected electrons.

Latch-up is determined by hole current density as well as a resistance component in a portion through which holes pass. Therefore, in the structure in which the width of the contact region 12 in the Y direction is relatively reduced to increase the fraction of the emitter regions 11 in the planar pattern, or to increase the number of emitter regions 11, even if the channel integration density increases, the latch-up is susceptible to occur.

While keeping the emitter-injection width $W_{inj}$ to be a constant value, the effective contact-region width $W_{eff}$ can be increased so as to reduce the hole current density. In the semiconductor device 1A according to the first embodiment, as described above, because the contact-region contact-width $W_{bc}$ is less than the emitter-region contact-width $W_e$, and the effective contact-region width $W_{eff}$ is greater than the emitter-injection width $W_{inj}$, the effective contact-region width $W_{eff}$ can be greater than the contact-region contact-width $W_{bc}$. Therefore, the increase of the percentage of the holes which flow into the $p^+$ contact region 12 attracted by the electrons in the channel, in accordance with the potential profile, is possible.

As a result, hole current density immediately below the $n^+$ emitter region 11 is reduced. Therefore, the improvement of the latch-up immunity of the emitter region 11 is possible, even if the contact-region contact-width $W_{bc}$ of the surface of the contact region 12 is relatively reduced so as to increase the fraction of the emitter-region contact-width $W_e$ and to increase the channel integration density. In addition, since the channel integration density can be increased, the reduction of the on-state voltage is possible.

The resistivity of the base region 9 immediately below the emitter region 11 is higher than that of the contact region 12. However, in the first embodiment, as illustrated in FIG. 6, the width A that is half of the emitter-injection width $W_{inj}$ is less than the creeping distance $d_{crp}$. Therefore, reducing resistance R1 from the center of the emitter-injection width $W_{inj}$ of the base region 9 immediately below the emitter region 11 to the contact region 12 and improving latch-up immunity are possible.

Since the contact region 12 is provided so as to be deeper than the emitter region 11 and to extend immediately below the bottom of the emitter region 11, dispersing hole current $I_{hole}$ to the contact region 12 is possible. Therefore, moving the holes rapidly which remain immediately below the emitter region 11 to the emitter electrode 20 through the contact region 12 is possible.

The latch-up immunity can be increased by providing the contact region 12 so as to be deeper than the emitter region 11 to reduce the value of saturation current. However, when the depth of the contact region 12 is too large, the latch-up immunity is reduced. Therefore, that the depth $d_{bc}$ of the contact region be equal to or greater than 0.5 micro meters and equal to or less than 2 micro meters from the depth $d_e$ of the emitter region 11 is preferable.

Figure 7:
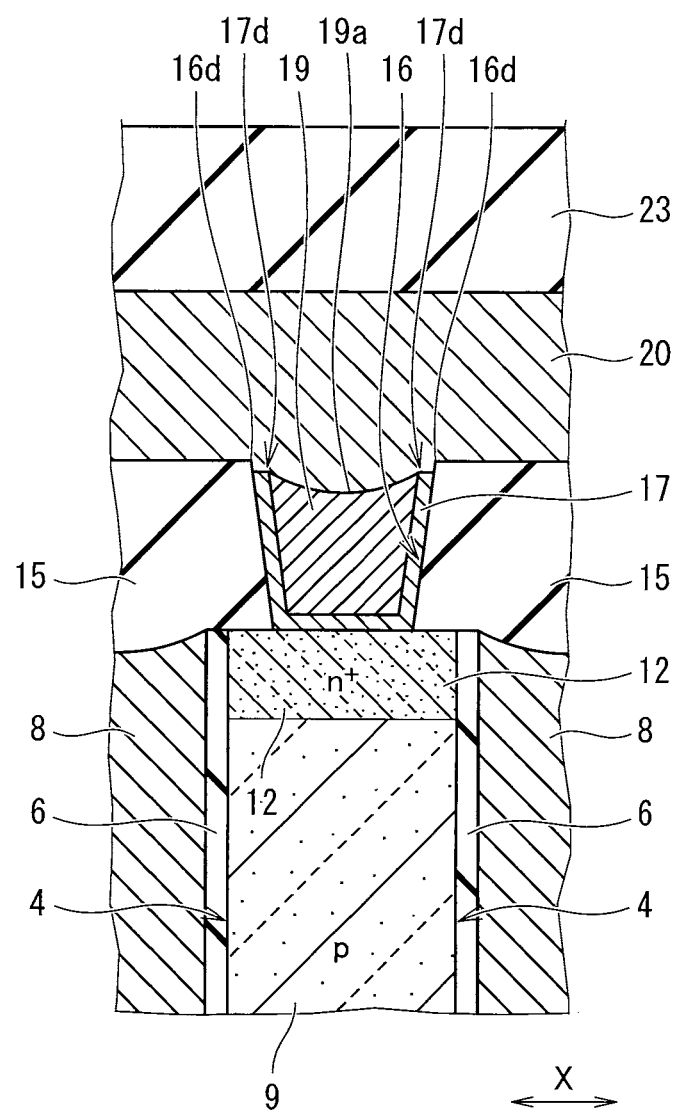
FIG. 7 is an enlarged cross-sectional view illustrating a portion of FIG. 2.

As illustrated in FIG. 7, an upper edge portion 17d of the barrier-metal film 17 is slightly lower than an upper edge portion 16d of the contact hole 16. A surface 19a of the contact plug 19 is a concave surface in which a central portion is recessed. As such, since the surface 19a of the contact plug 19 is a concave surface, increasing the contact area between the contact plug 19 and the emitter electrode 20 deposited on the contact plug 19 is possible.

Therefore, reducing the contact resistance between the emitter region 11 and the emitter electrode 20 and the contact resistance between the contact region 12 and the emitter electrode 20 is possible. As a result, even if the width of the contact hole 16 is reduced due to the scaling-down of the IGBT, reducing the on-state voltage of the IGBT is possible.

<Method for Manufacturing Semiconductor Device According to First Embodiment>

Next, a method for manufacturing the semiconductor device according to the first embodiment will be described with reference to FIGS. 8 to 28. In the following description, a case in which impurity ions for providing the emitter region 11 and impurity ions for providing the contact region 12 are implanted into a surface layer portion of the base region 9 and a heat treatment for activating the impurity ions is collectively performed will be described. However, the present invention is not limited to the procedure.

Figure 8:
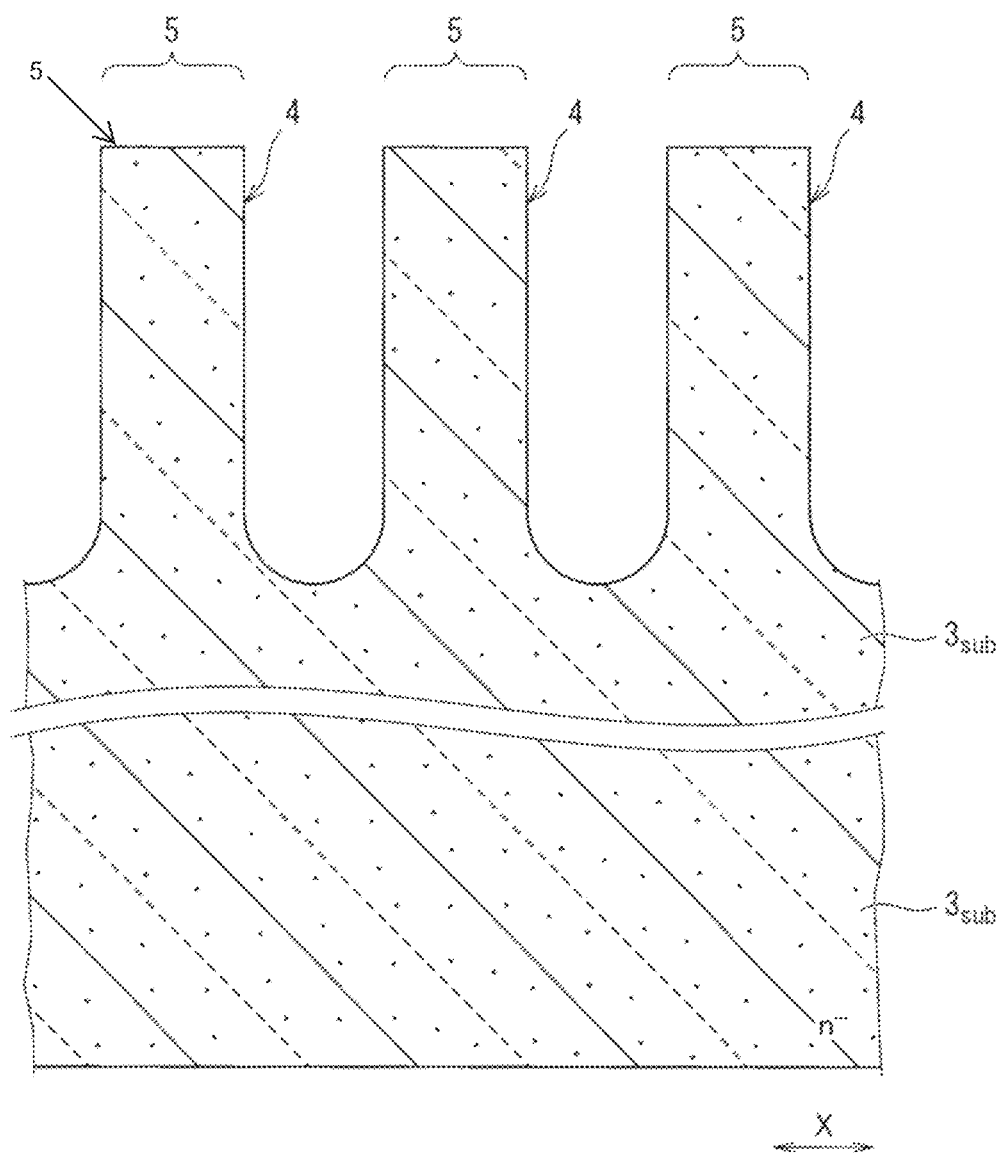
FIG. 8 is a diagram illustrating a method for manufacturing the semiconductor device according to the first embodiment of the present invention and a cross-sectional view illustrating a main portion at a position corresponding to the line IIa-IIa of FIG. 1.

(a) First, an $n^-$ semiconductor substrate $3_{sus}$ is prepared. Then, as illustrated in FIG. 8, a plurality of trenches 4 are dug in a main surface of the semiconductor substrate $3_{SUB}$ and the mesa region 5 which is interposed and partitioned between adjacent trenches 4 that are dug. As illustrated in FIG. 1, the trench 4 and the mesa region 5 are buried in a stripe-shaped parallel pattern having, for example, a width of about 1 micro meters and a depth of about 5 micro meters to 10 micro meters.

The trench 4 is dug by selectively etching the main surface of the semiconductor substrate $3_{SUB}$ using a photolithography technique and dry etching such as RIE. As a result, a plurality of mesa regions 5 are arranged in the X direction—the width direction of the trench 4 or the mesa region 5

(b) Then, in the main surface of the semiconductor substrate $3_{SUB}$, the gate insulating film 6 which is a $SiO_2$ film is induced in the trench 4 by, for example, a thermal oxidation process. In the deposing, the gate insulating film 6 is also deposed on the surface of an upper part of the mesa region 5 in the main surface of the semiconductor substrate $3_{SUB}$ and is continuously buried in the trench 4 and on the surface of the upper part of the mesa region 5.

Figure 9:
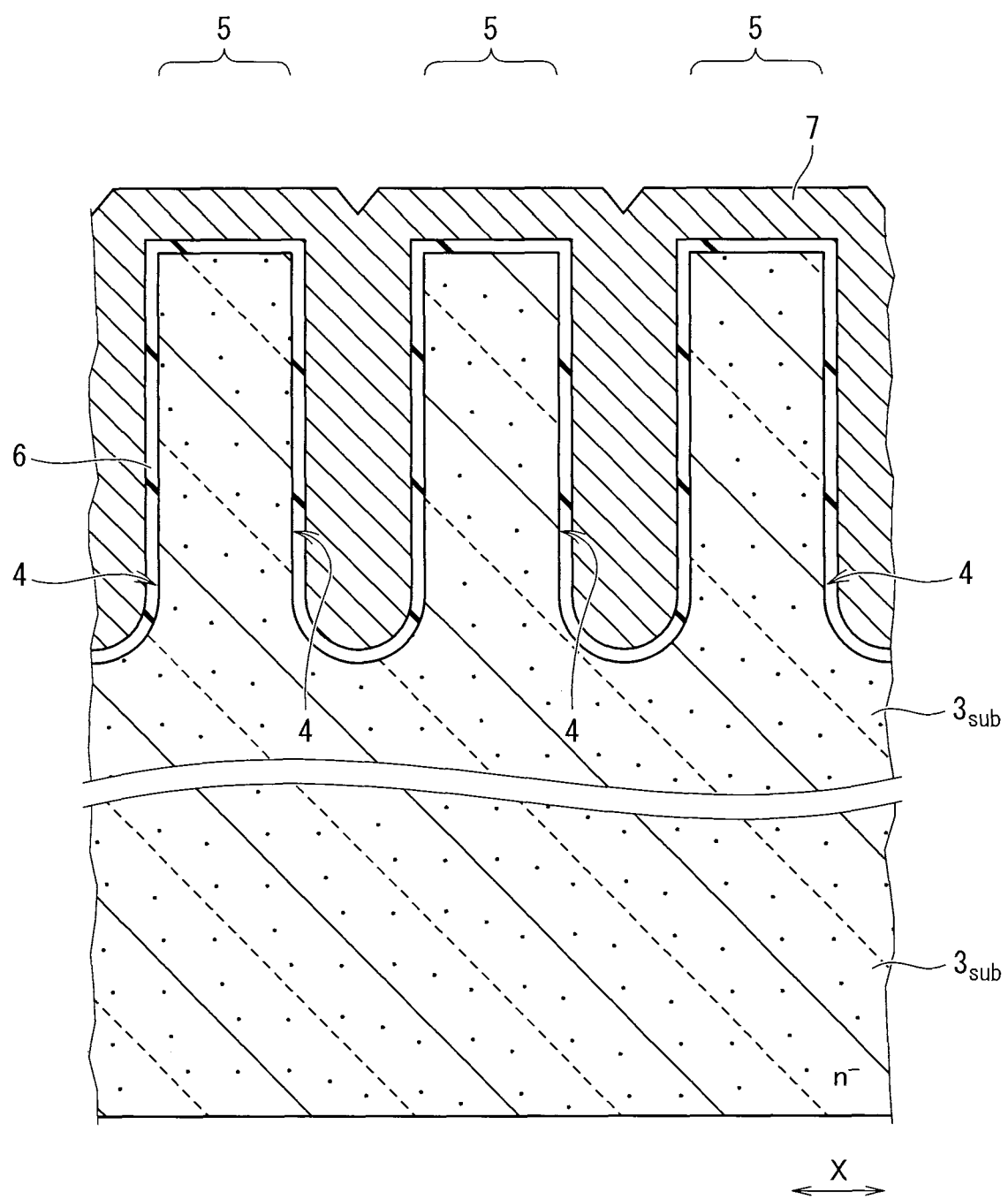
FIG. 9 is a diagram illustrating the method for manufacturing the semiconductor device according to the first embodiment of the present invention and a cross-sectional view illustrating the main portion at the position corresponding to the line IIa-IIa of FIG. 1.

Then, as illustrated in FIG. 9, for example, a doped-polysilicon film with low resistivity is deposed as a gate material 7 on the main surface of the semiconductor substrate $3_{SUB}$ so as to fill the trenches 4. For example, the gate material 7 is provided with a thickness of about 1 micro meters with respect to a trench width of 1 micro meters.

Figure 10:
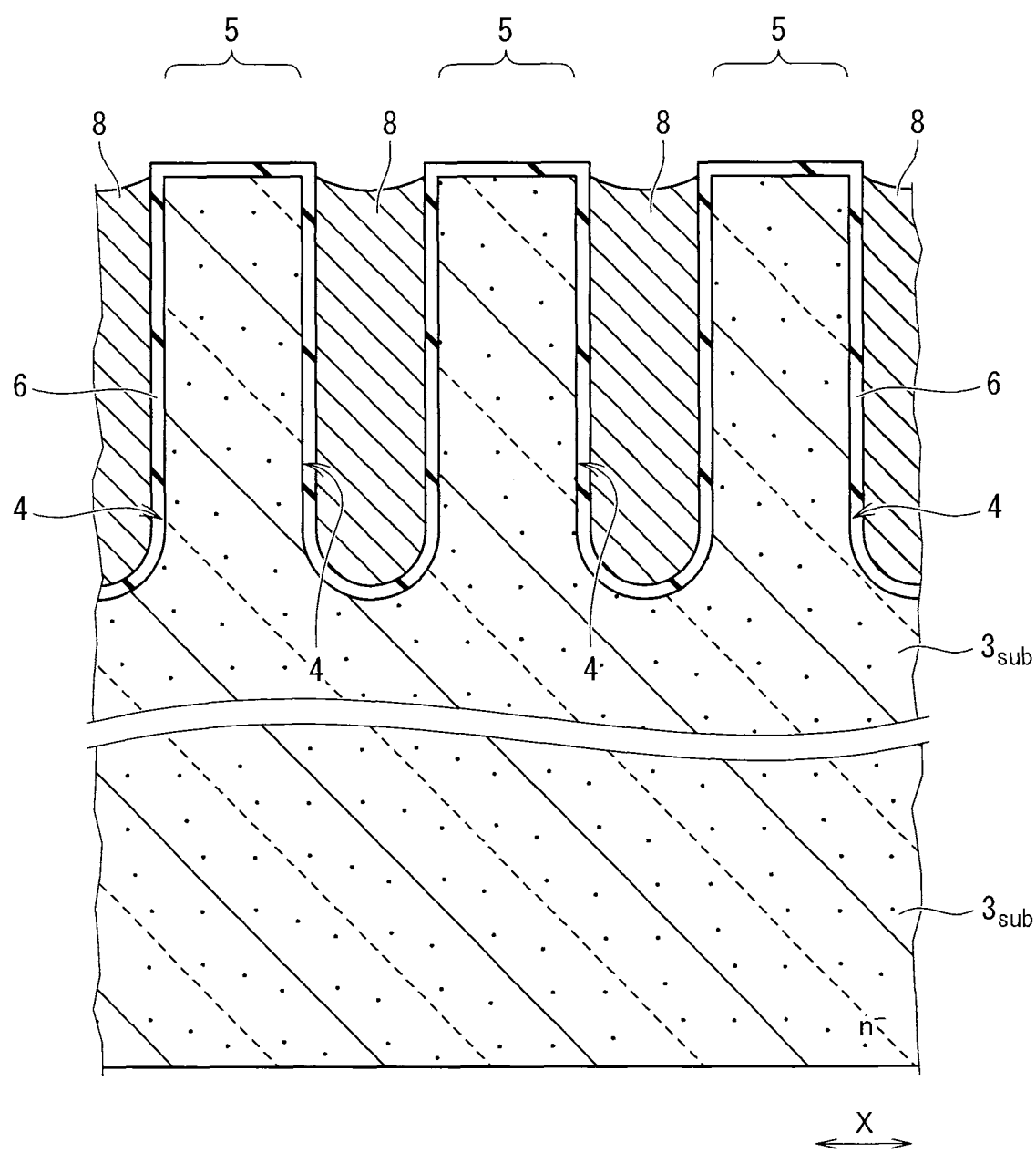
FIG. 10 is a diagram illustrating the method for manufacturing the semiconductor device according to the first embodiment of the present invention and a cross-sectional view illustrating the main portion at the position corresponding to the line IIa-IIa of FIG. 1.

(c) Then, the gate material 7 is etched back by dry etching such as RIE. Then, as illustrated in FIG. 10, the gate material 7 on the trench 4 and the mesa region 5 is selectively removed and the gate electrode 8 made of the gate material 7 is buried in the trench 4. In the removing and providing, the gate electrode 8 is selectively buried in the trench 4 through the gate insulating film 6 and the main surface of the semiconductor substrate $3_{SUB}$ is substantially flat.

In the removing and providing, the gate material 7 is etched back at an etching rate having selectivity with respect to the gate insulating film 6. Therefore, the gate insulating film 6 on the mesa region 5 functions as an etching stopper and can prevent the surface of the upper part of the mesa region 5 from being etched.

Figure 11:
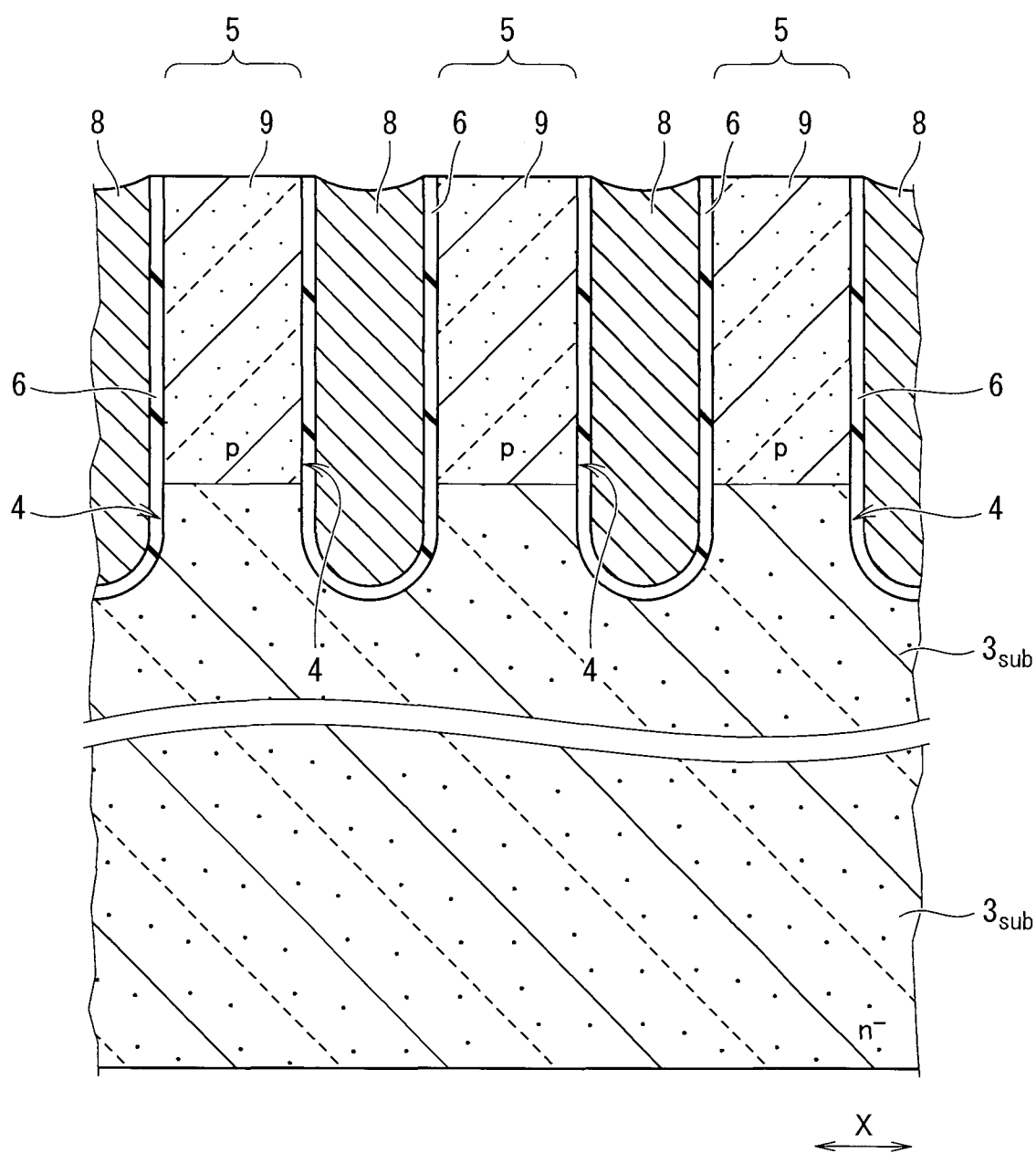
FIG. 11 is a diagram illustrating the method for manufacturing the semiconductor device according to the first embodiment of the present invention and a cross-sectional view illustrating the main portion at the position corresponding to the line IIa-IIa of FIG. 1.

(d) Then, the gate insulating film 6 on the surface of the upper part of the mesa region 5 is selectively removed by wet etching such that the surface of the upper part of the mesa region 5 is exposed. Then, as illustrated in FIG. 11, the p-type base region 9 is buried in the surface layer portion of the mesa region 5. The base region 9 is provided by implanting, for example, boron ions ($^{11}B^+$) or boron difluoride ions ($^{49}BF_2^+$) as p-type impurity ions and implementing a heat treatment for activating the implanted impurity ions.

The base region 9 is shallower than the trench 4. For example, the base region 9 is provided with a depth of about 2 micro meters to 8 micro meters with respect to the depth of the trench 4 which is in the range of 5 micro meters to 10 micro meters. In the first embodiment, after the gate electrode 8 is buried in the trench 4, the base region 9 is provided. However, the base region 9 may be deposited on the entire surface of the surface layer portion of the main surface of the semiconductor substrate $3sus$ before the trench 4 is dug in the main surface of the semiconductor substrate $3sus$. In the case, the trench 4 is dug in the main surface of the semiconductor substrate $3_{SUB}$ so as to pass through the base region 9.

Figure 12:
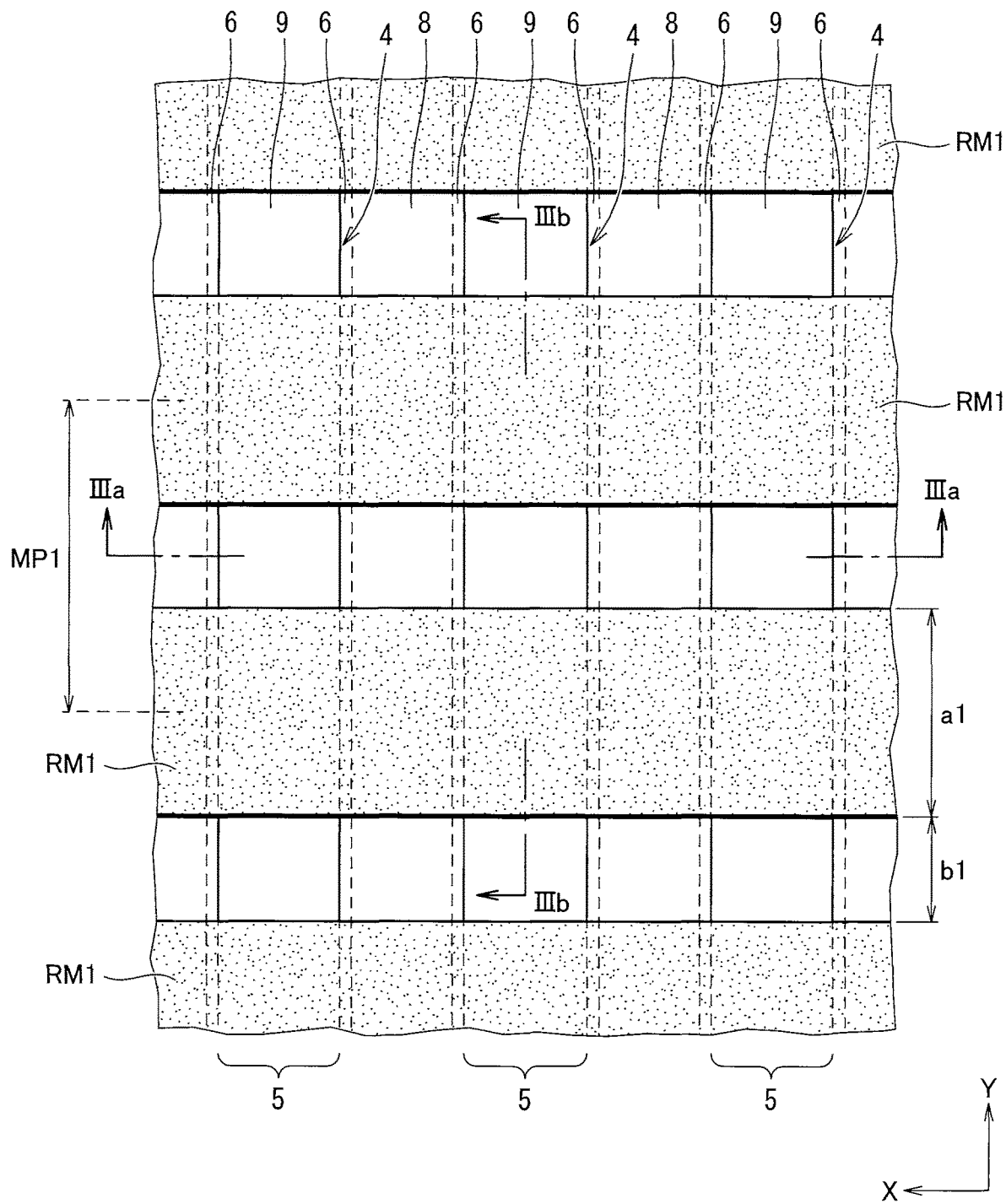
FIG. 12 is a diagram illustrating the method for manufacturing the semiconductor device according to the first embodiment of the present invention and a plan view illustrating a main portion of the plane pattern of an impurity introduction mask.

(e) Then, p-type first impurity ions are selectively implanted into a plurality of regions which are periodically buried in the surface layer portion of the base region 9 in the Y direction. Specifically, first, as illustrated in FIGS. 12 to 14, a plurality of first masks RM1 are provided as impurity introduction masks on the surface layer portion of the base region 9 in the Y direction at certain intervals b1.

The first masks RM1 are provided by deposing a photosensitive resist film on the entire main surface of the semiconductor substrate $3_{SUB}$ and, for example, exposing and development process for the photosensitive resist film to process the photosensitive resist film into a certain pattern. The first masks RM1 are buried in stripe-shaped parallel patterns that continuously extend in the X direction so as to traverse the trench 4 between adjacent mesa regions 5. For example, the first masks RM1 are provided with a width a1 of about 4 micro meters and are arranged at an interval b1 of about 2 micro meters and a pitch of about 6 micro meters in the Y direction.

Figure 13:
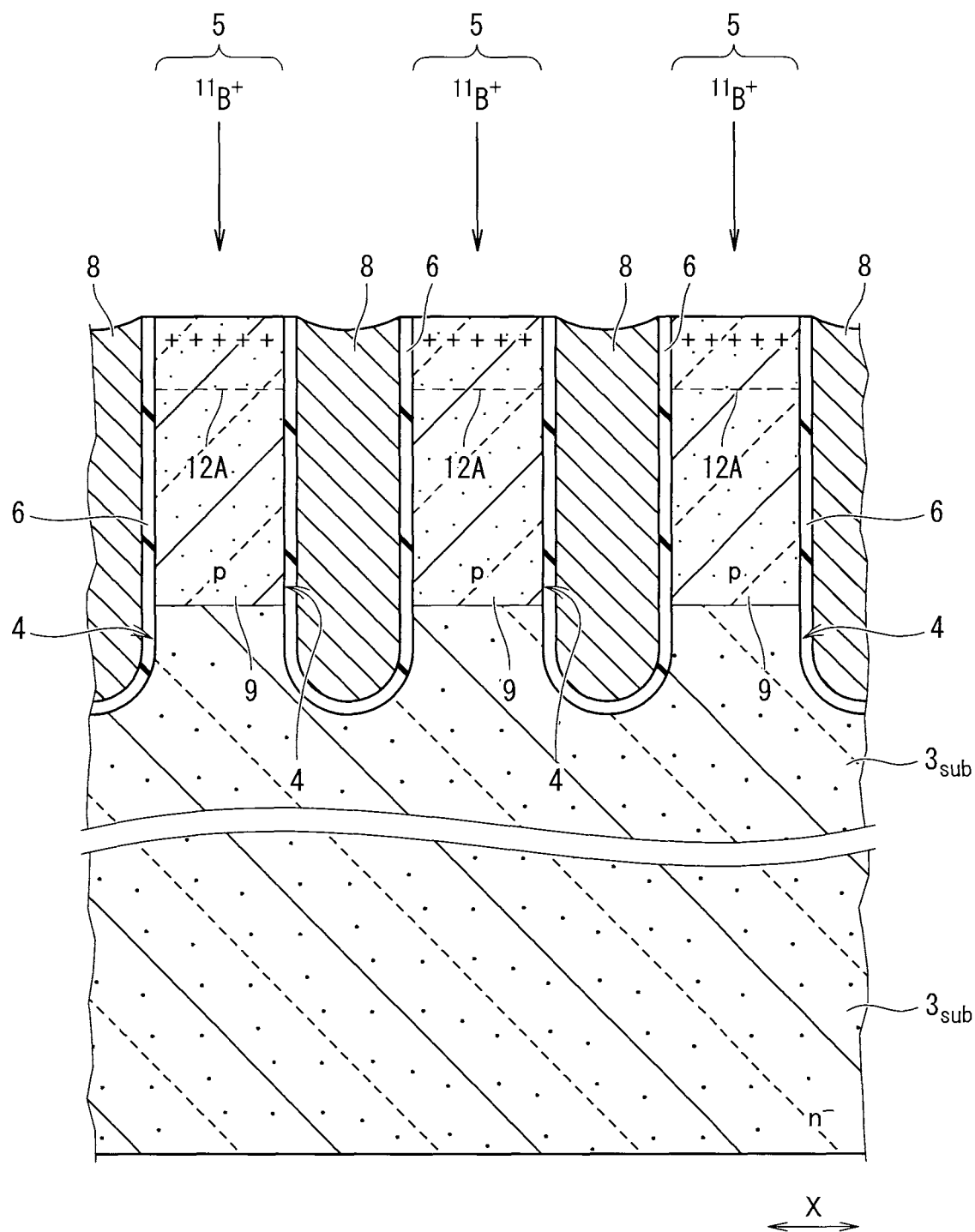
FIG. 13 is a cross-sectional view illustrating a main portion of a cross-sectional structure taken along the line IIIa-IIIa of FIG. 12.
Figure 14:
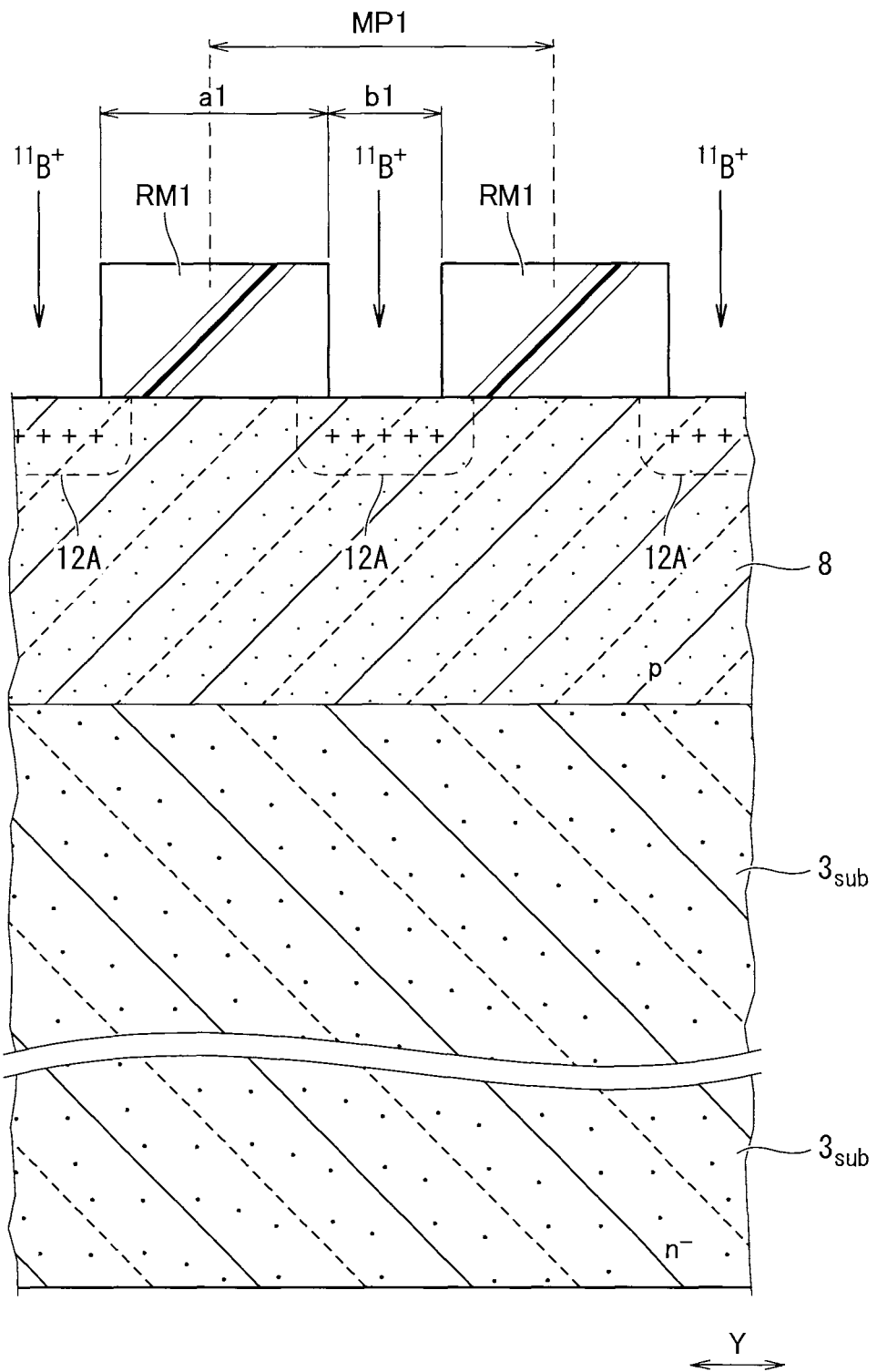
FIG. 14 is a cross-sectional view illustrating a main portion of a cross-sectional structure taken along the line IIIb-IIIb of FIG. 12.

(f) Then, as illustrated in FIGS. 13 and 14, for example, boron ions ($^{11}B^+$) are selectively implanted as first impurity ions into the surface layer portion of the base region 9 between the first masks RM1 which are adjacent to each other in the Y direction. Here, FIG. 13 is a cross-sectional view illustrating a main portion of a cross-sectional structure taken along the line IIIa-IIIa of FIG. 12. FIG. 14 is a cross-sectional view illustrating a main portion of a cross-sectional structure taken along the line IIIb-IIIb of FIG. 12. The boron ions ($^{11}B^+$) are implanted under the conditions of, for example, a dose of about $1 \times 10^{15}/cm^2$ to $1 \times 10^{16}/cm^2$ and an acceleration energy of about 120 keV. In the implantation, a plurality of first impurity ion implantation regions 12A into which the first impurity ions—boron ions ($^{11}B^+$)—are implanted are periodically arranged in the surface layer portion of the base region 9 at a pitch MP1 between the first masks RM1 in the Y direction.

(g) Then, after the first masks RM1 are removed, n-type second impurity ions are selectively implanted into the surface layer portion of the base region 9 between a plurality of first impurity ion implantation regions 12A in the Y direction. The implantation is performed at an interval that is greater than that between the array patterns of the plurality of first impurity ion implantation regions 12A, at the same pitch as that between the plurality of first impurity ion implantation regions 12A, and with acceleration energy that is lower than that of the first impurity ions.

Figure 15:
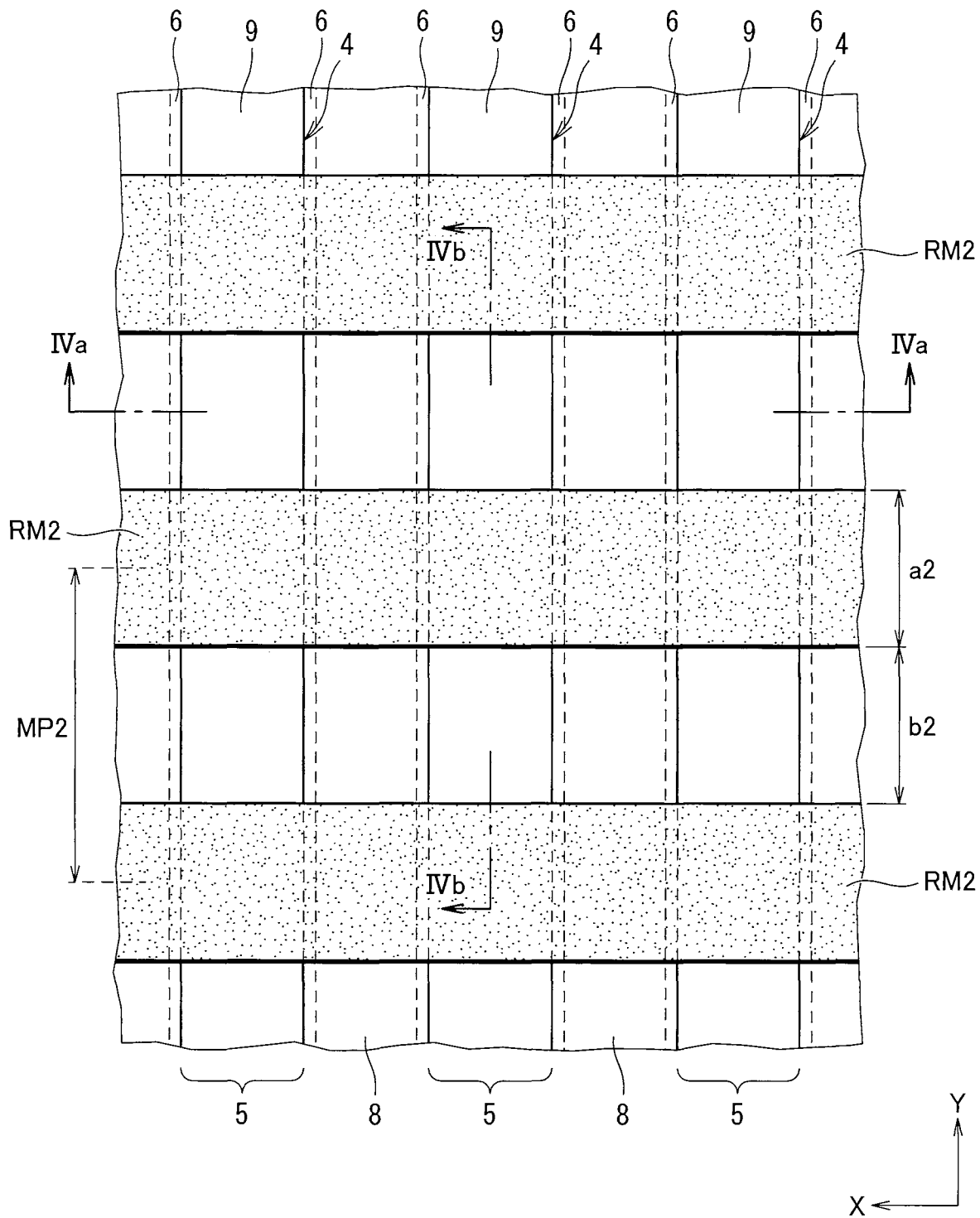
FIG. 15 is a diagram illustrating the method for manufacturing the semiconductor device according to the first embodiment of the present invention and a plan view illustrating a main portion of the plane pattern of the impurity introduction mask.
Figure 16:
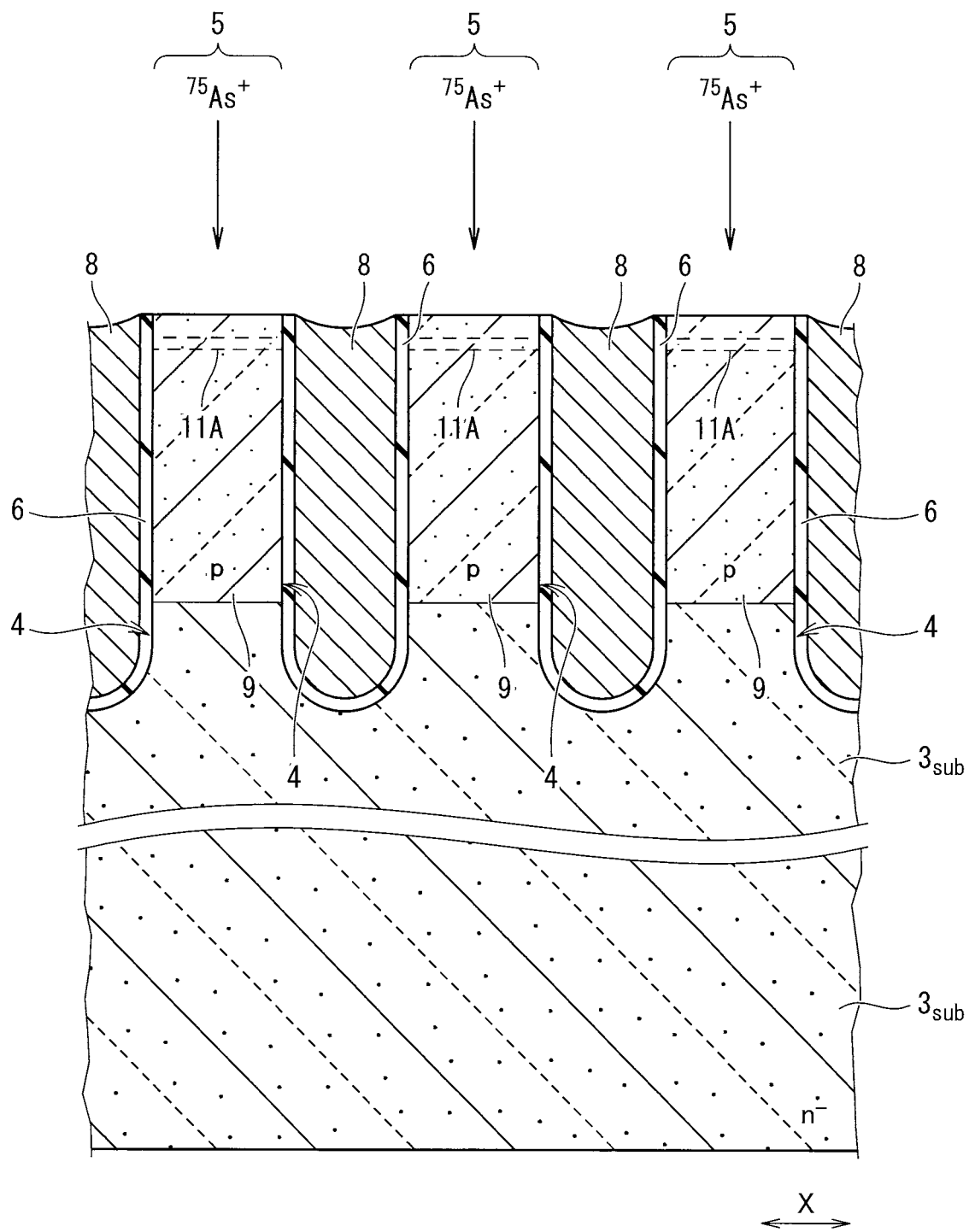
FIG. 16 is a cross-sectional view illustrating a main portion of a cross-sectional structure taken along the line IVa-IVa of FIG. 15.
Figure 17:
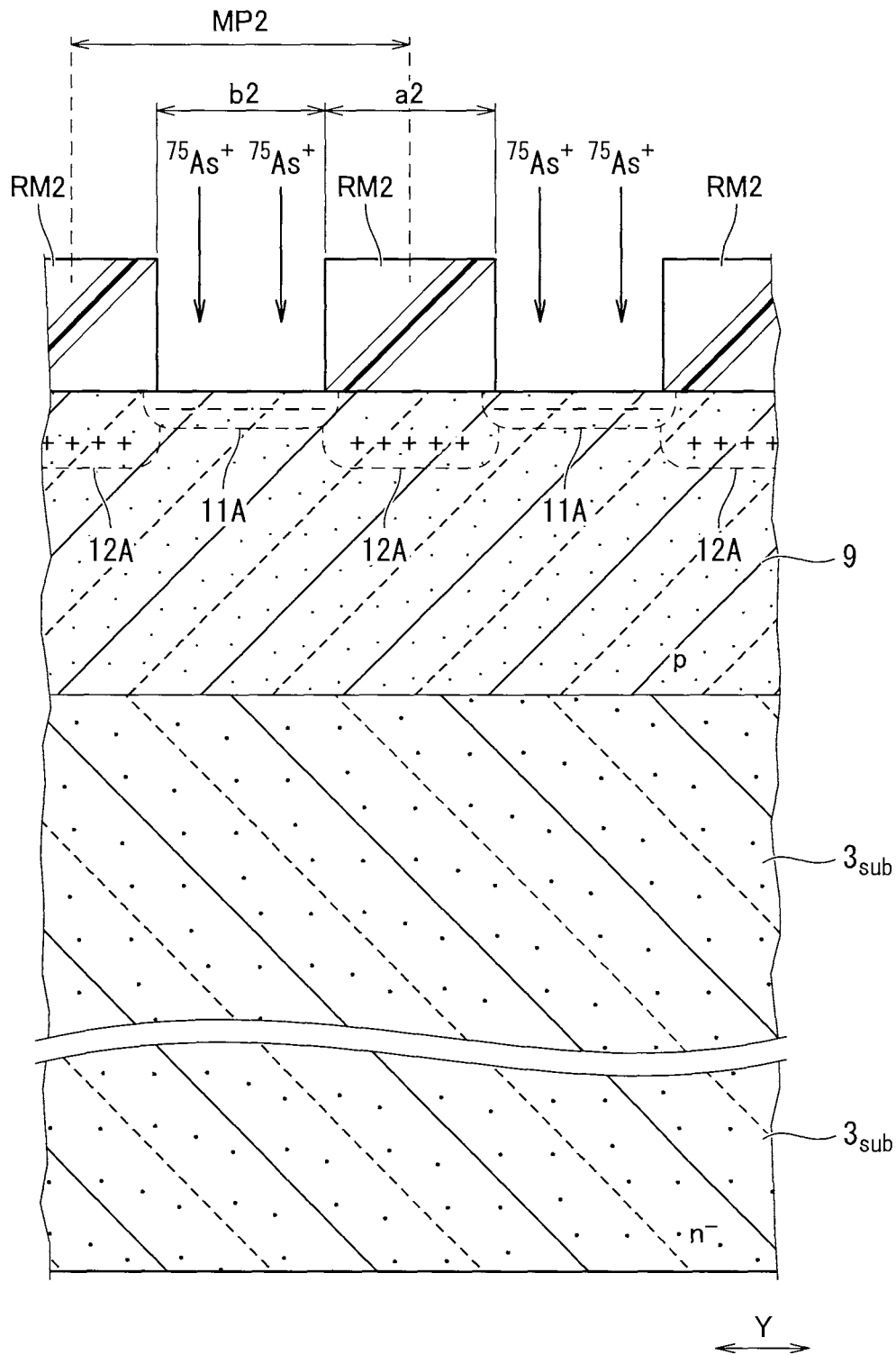
FIG. 17 is a cross-sectional view illustrating a main portion of a cross-sectional structure taken along the line IVb-IVb of FIG. 15.

Specifically, first, as illustrated in FIGS. 15 to 17, second masks RM2 are provided at a pitch MP2 that is equal to the pitch between n the first masks RM1. The second masks RM2 are deposited on the first impurity ion implantation regions 12A such that an interval b2 in the same direction as that in which the first masks RM1 are arranged is greater than the interval b1 between the first masks RM1 that are adjacent to each other and the width a2 of the second masks RM2 along the same direction as that in which the first masks RM1 are arranged is less than the width a1 of the first mask RM1.

The second masks RM2 are provided by processing a photosensitive resist film deposed on the entire main surface of the semiconductor substrate $3_{SUB}$ into a certain pattern, similarly to the first masks RM1.

Similarly to the first masks RM1, the second masks RM2 are buried in stripe-shaped parallel patterns that continuously extend in the X direction so as to traverse the trench 4 between adjacent mesa regions 5. For example, the second masks RM2 are provided with a width a2 of about 3 micro meters and are arranged at an interval b2 of about 3 micro meters and the same pitch at that between the first masks RM1 in the Y direction.

(h) Then, as illustrated in FIGS. 16 and 17, the second impurity ions are selectively implanted into the surface layer portion of the base region 9 between the second masks RM2 that are adjacent to each other, with acceleration energy lower than that of the first impurity ions—boron ions ($^{11}B^+$)—. For example, arsenic ions ($^{75}As^+$) can be used as the second impurity ions.

Here, FIG. 16 is a cross-sectional view illustrating a main portion of a cross-sectional structure taken along the line IVa-IVa of FIG. 15. FIG. 17 is a cross-sectional view illustrating a main portion of a cross-sectional structure taken along the line IVb-IVb of FIG. 15. The arsenic ions ($^{75}As^+$) are implanted under the conditions of, for example, a dose of about $1 \times 10^{15}/cm^2$ to $1 \times 10^{16}/cm^2$ and an acceleration energy of about 120 keV.

In the implantation, as illustrated in FIG. 17, a second impurity ion implantation region 11A in which the second impurity ions—arsenic ion ($^{75}As^+$)—are implanted is shallower than the first impurity ion implantation region 12A in the surface layer portion of the base region 9 between the first impurity ion implantation regions 12A. A plurality of second impurity ion implantation regions 11A are arranged at the same pitch as the first impurity ion implantation regions 12A.

The width a2 of the second mask RM2 in the Y direction is greater than the interval b1 between the first masks RM1 which are adjacent to each other. The interval b2 between the second masks RM2 that are adjacent to each other is less than the width a1 of the first mask RM1 in the Y direction. Therefore, as illustrated in FIG. 17, the second impurity ion implantation region 11A and the first impurity ion implantation region 12A partially overlap each other.

(i) Then, after the second masks RM2 are removed, the first and second impurity ions are activated. That is, the p$^+$ contact region 12 is buried in the first impurity ion implantation region 12A into which the first impurity ions—boron ions ($^{11}$B$^+$)—have been implanted. In addition, the n$^+$ emitter region 11 is buried in the second impurity ion implantation region 11A into which the second impurity ions—arsenic ions ($^{75}$As$^+$)—have been implanted.

Figure 19:
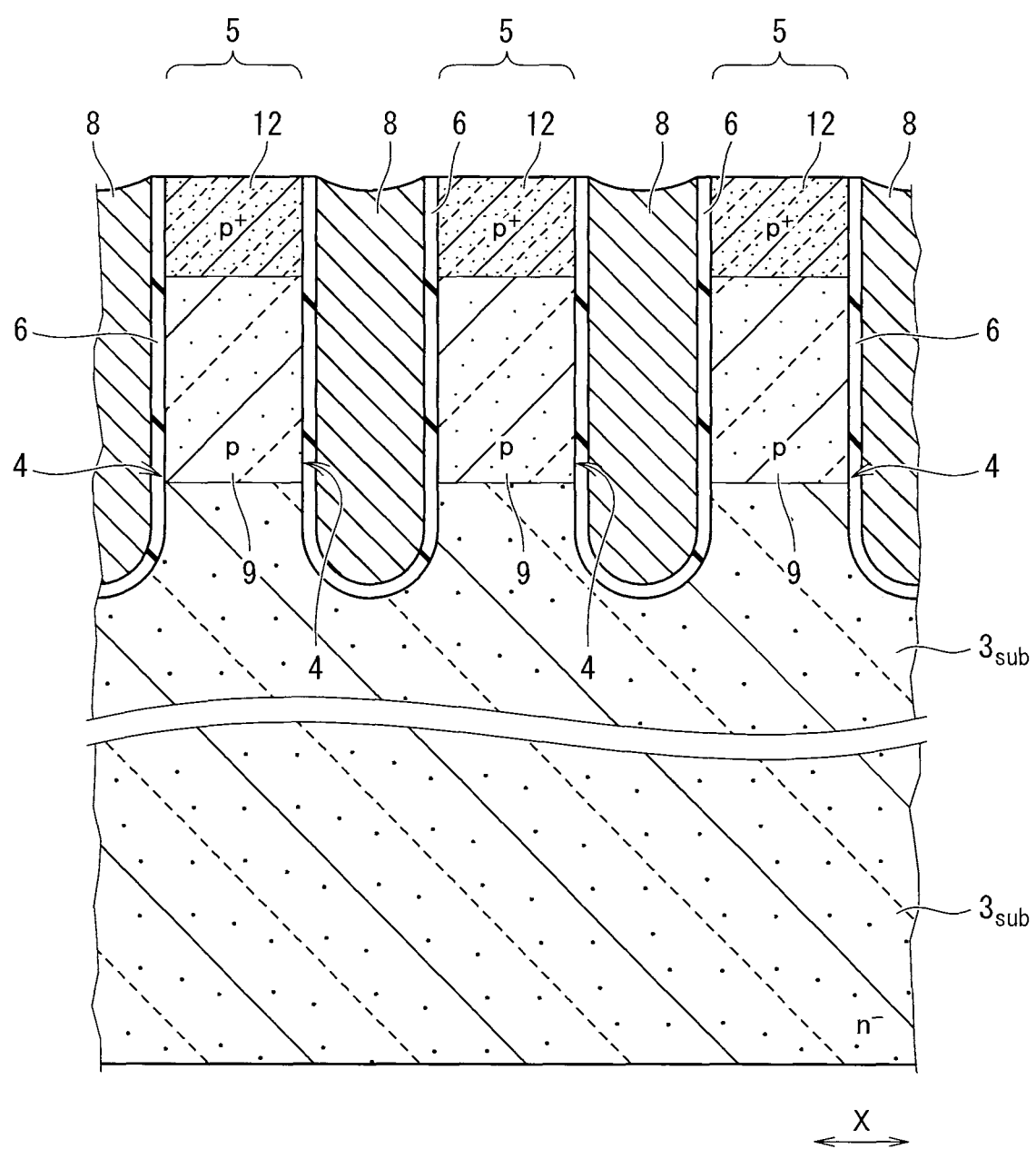
FIG. 19 is a diagram illustrating the method for manufacturing the semiconductor device according to the first embodiment of the present invention and a cross-sectional view illustrating a main portion at a position corresponding to the line IIb-IIb of FIG. 1.
Figure 20:
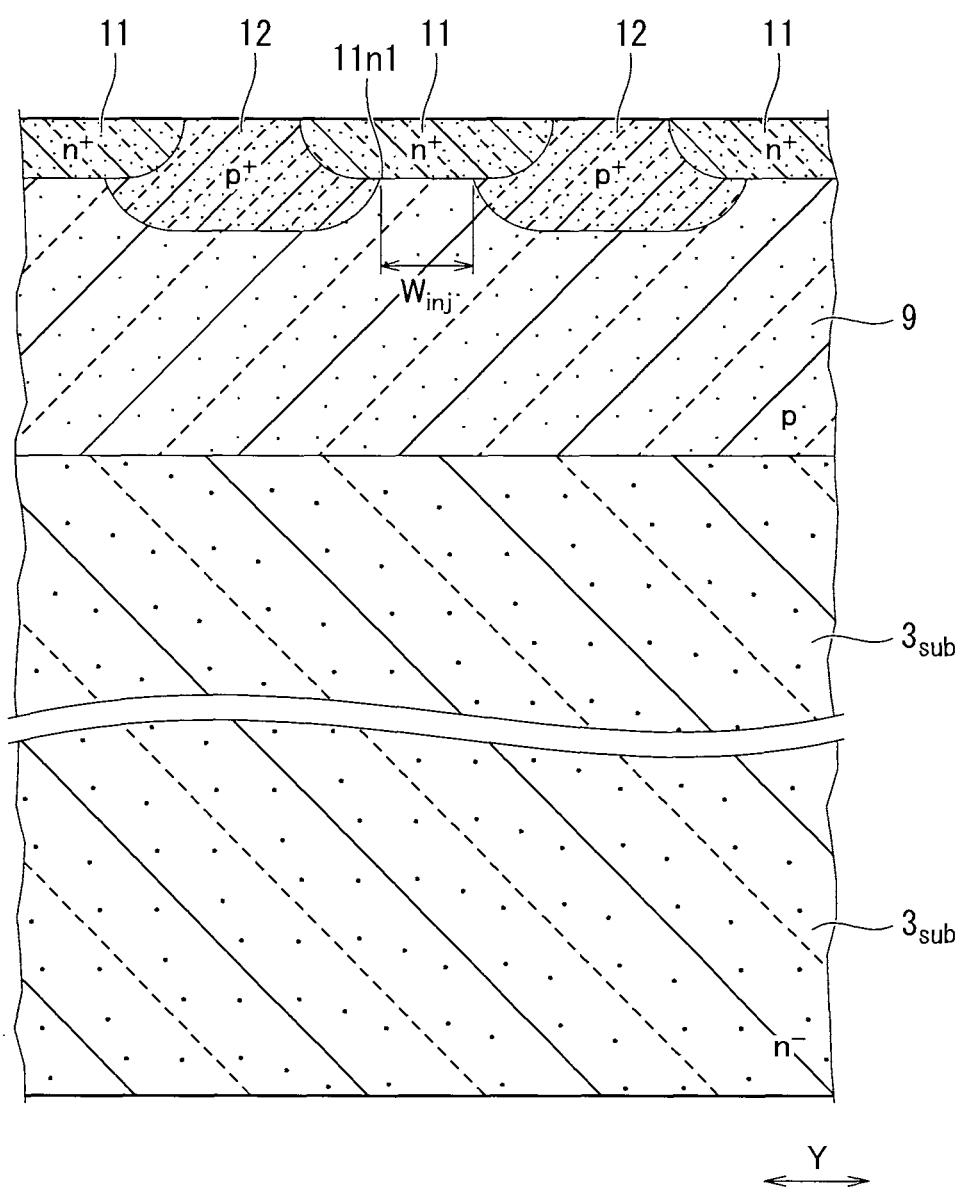
FIG. 20 is a diagram illustrating the method for manufacturing the semiconductor device according to the first embodiment of the present invention and a cross-sectional view illustrating a main portion at a position corresponding to the line IIc-IIc of FIG. 1.

Specifically, heat treatments for activating the implanted boron ions ($^{11}$B$^+$) and the implanted arsenic ions ($^{75}$As$^+$) are collectively performed. Therefore, as illustrated in FIGS. 18 to 20, the n$^+$ emitter region 11 to which arsenic ions ($^{75}$As$^+$) have been doped as the second impurity ions and the p$^+$ contact region 12 to which boron ions ($^{11}$B$^+$) have been doped as the first impurity ions are formed.

Figure 18:
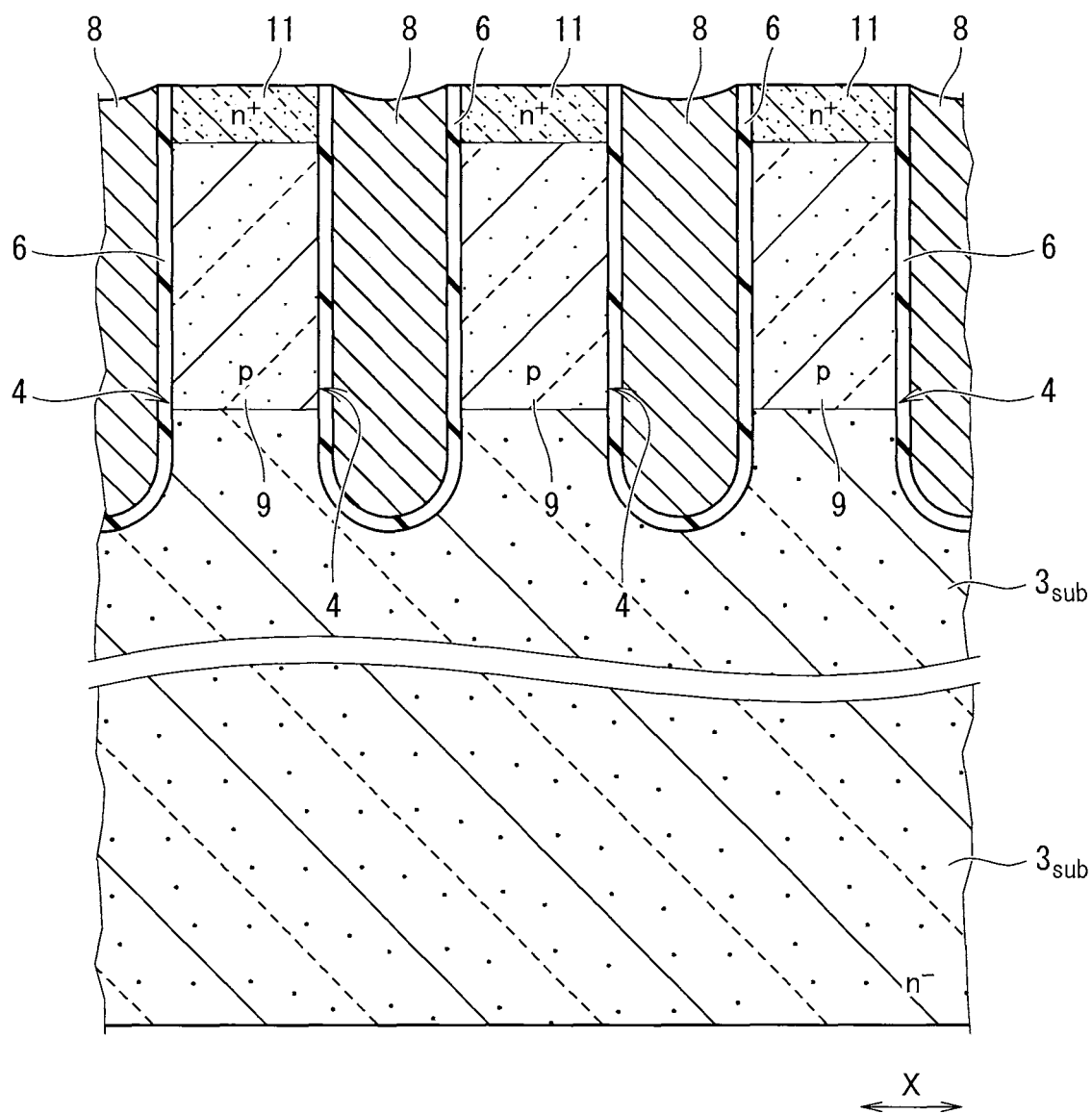
FIG. 18 is a diagram illustrating the method for manufacturing the semiconductor device according to the first embodiment of the present invention and a cross-sectional view illustrating the main portion at the position corresponding to the line IIa-IIa of FIG. 1.

Here, FIG. 18 is a cross-sectional view illustrating a main portion at a position corresponding to the line IIa-IIa of FIG. 1. FIG. 19 is a cross-sectional view illustrating a main portion at a position corresponding to the line IIb-IIb of FIG. 1. FIG. 20 is a cross-sectional view illustrating a main portion at a position corresponding to the line IIc-IIc of FIG. 1.

In the forming, the arsenic ions ($^{75}$As$^+$) are implanted with a dose that is more than the dose of the boron ions ($^{11}$B$^+$). Therefore, as illustrated in FIG. 20, an overlap region between a portion of the region into which the boron ions ($^{11}$B$^+$) have been implanted and a portion of the region into which the arsenic ions ($^{75}$As$^+$) have been implanted becomes the n$^+$ emitter region 11.

In the forming, the arsenic ions ($^{75}$As$^+$) are selectively implanted as follows. That is, the distance between the second impurity ion implantation regions 11A into which the arsenic ions ($^{75}$As$^+$) have been implanted is greater than the distance between the array patterns of a plurality of first impurity ion implantation regions 12A into which the first impurity ions—boron ions ($^{11}$B$^+$)—have been implanted. In the second impurity ion implantation regions 11A, the implantation is implemented at the same pitch as the plurality of first impurity ion implantation regions 12A with lower acceleration energy than the first impurity ions.

In addition, in the second impurity ion implantation regions 11A, the implantation is implemented into the surface layer portion of the base region 9 between a plurality of first impurity ion implantation regions 12A in the Y direction. Therefore, as illustrated in FIG. 20, the contact regions 12 which are adjacent to each other, with the emitter region 11 interposed between the contact regions 12 can be deeper than the emitter region 11 and can extend immediately below the emitter region 11 so as to be separated from each other.

The emitter-injection width $W_{inj}$ illustrated in FIG. 20 depends on the distance between adjacent contact regions 12 in the Y direction, that is, the width a1 of the first mask RM1 in the Y direction.

Therefore, preventing a variation in the emitter-injection width Win, caused by the positional deviation between the first mask RM1 for providing the contact region 12 and the second mask RM2 for providing the emitter region 11 is possible. In addition, as illustrated in FIG. 5, the contact-region contact-width $W_{bc}$ can be less than the emitter-region contact-width $W_e$ and the effective contact-region width $W_{eff}$ can be greater than the emitter-injection width $W_{inj}$.

The maximum width of an overlap portion between the first impurity ion implantation region 12A and the second impurity ion implantation region 11A may not be about 0.3 micro meters according to arrangement. The structure in which the contact regions 12 that contact with both sides of the emitter region 11 are deeper than the emitter region 11 and extend immediately below the bottom of the emitter region 11 so as to be separated from each other, as illustrated in FIG. 4 can be achieved by the diffusion of the atoms by the heat treatment.

Figure 21:
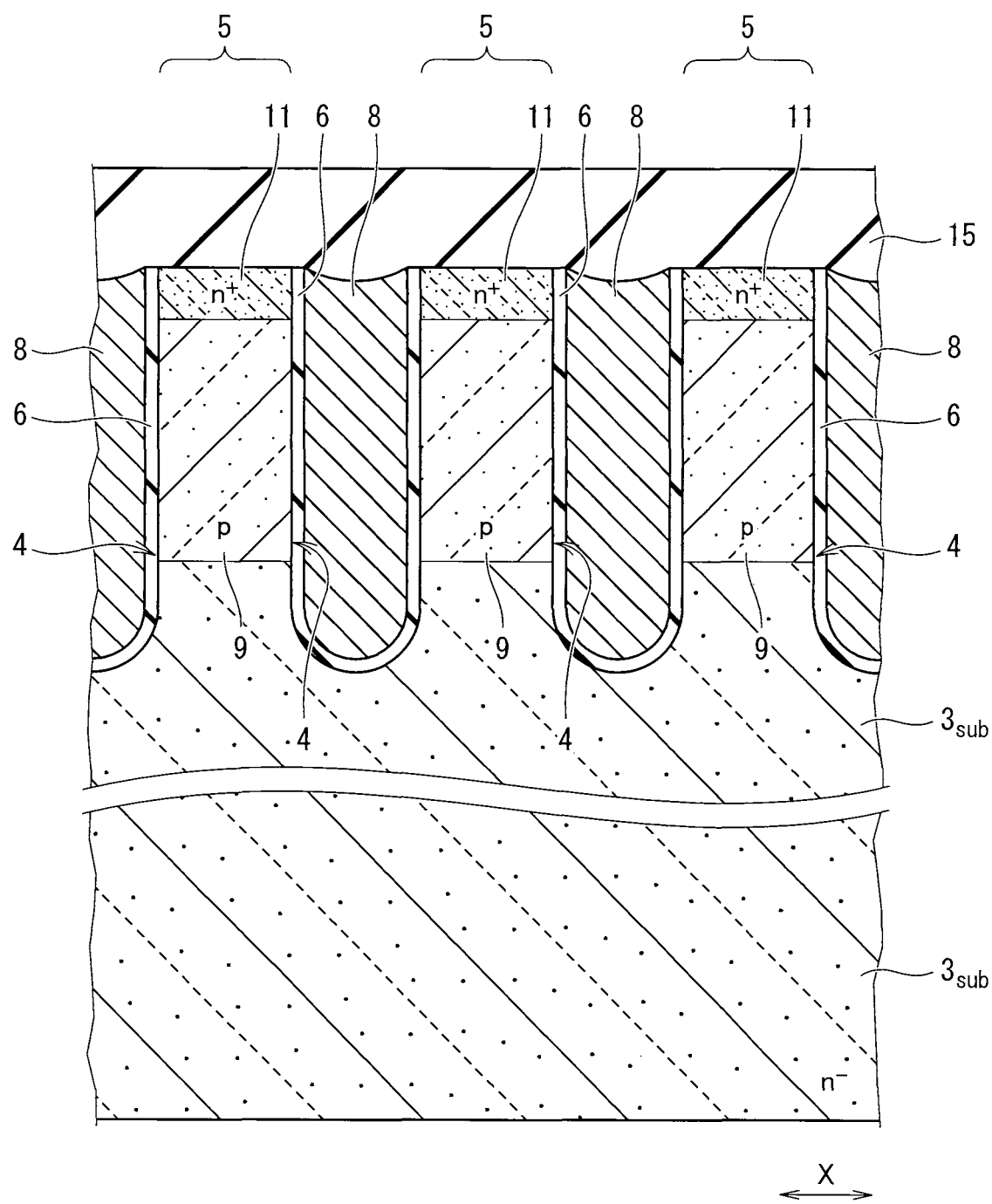
FIG. 21 is a diagram illustrating the method for manufacturing the semiconductor device according to the first embodiment of the present invention and a cross-sectional view illustrating the main portion at the position corresponding to the line IIa-IIa of FIG. 1.

(j) Then, as illustrated in FIG. 21, the interlayer insulating film 15, which is a SiO$_2$ film, is deposited on the ensure main surface of the semiconductor substrate 3$_{SUB}$ including the upper surface of the trench 4 and the upper surface of the mesa region 5 by, for example, a CVD method. Then, the contact hole 16 is dug in the interlayer insulating film 15 by, for example, a photolithography technique and a dry etching technique so as to extend from the surface of the upper part of the interlayer insulating film 15 to the surface of the upper part of the mesa region 5.

As represented by a dotted line in FIG. 1, the contact holes 16 are dug in a stripe-shaped parallel plane pattern in the mesa region 5 along the Y direction, namely the longer direction in the planar pattern of the trench 4 or the mesa region 5—. The contact hole 16 is dug so as to be laid across the emitter region 11 and the contact region 12 buried in the surface layer portion of the mesa region 5.

Figure 22:
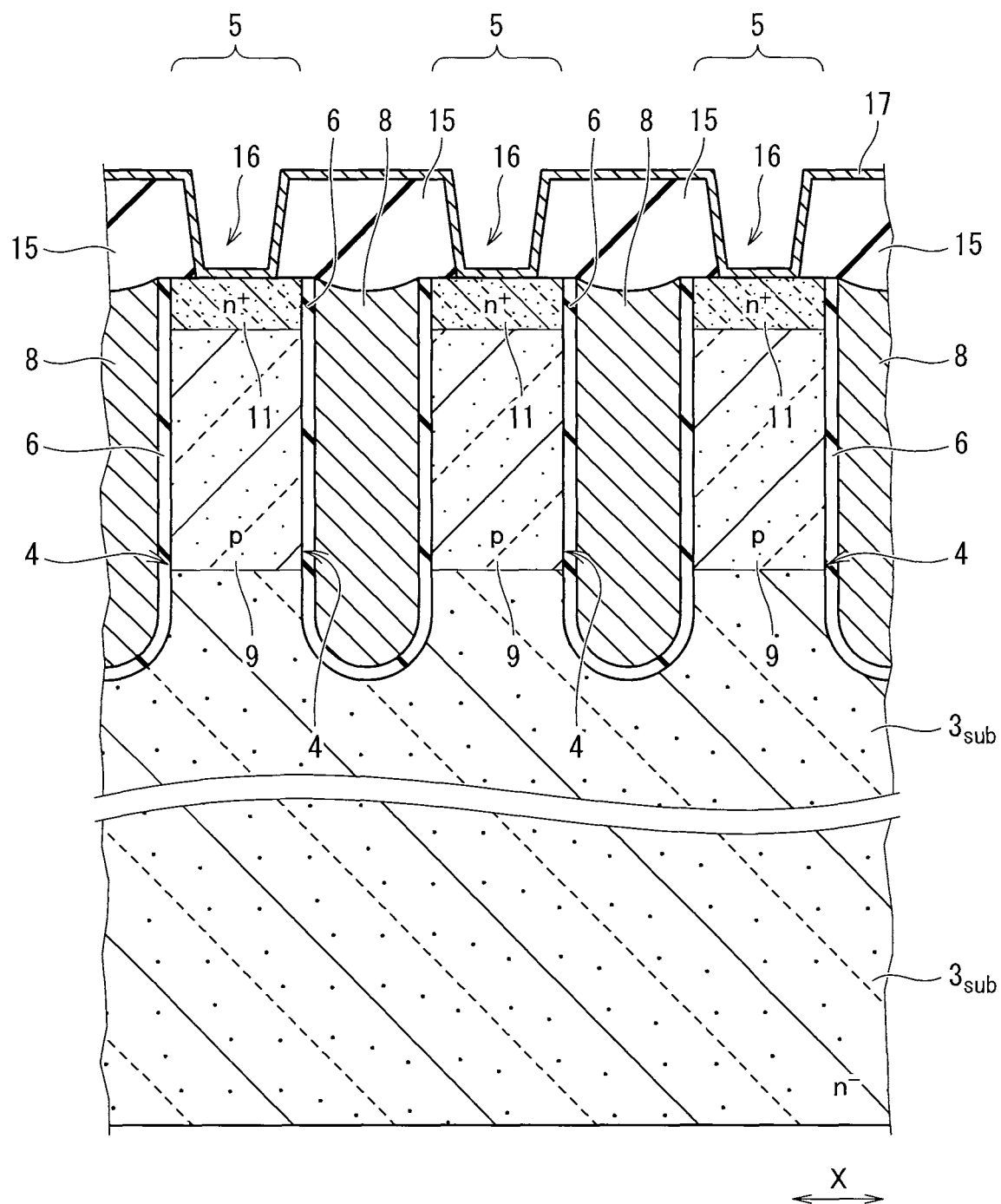
FIG. 22 is a diagram illustrating the method for manufacturing the semiconductor device according to the first embodiment of the present invention and a cross-sectional view illustrating the main portion at the position corresponding to the line IIa-IIa of FIG. 1.

Then, as illustrated in FIG. 22, the barrier-metal film 17 is deposited on the inner wall of the contact hole 16, the surface of the mesa region 5, and the surface of the interlayer insulating film 15 by, for example, a PVD method. The barrier-metal film 17 is a composite film including a titanium (Ti) film and a titanium nitride (TiN) film from the lower side. The titanium film is deposited with a thickness of, for example, about 40 nanometers. The titanium nitride film is deposited with a thickness of, for example, about 100 nanometers.

Figure 23:
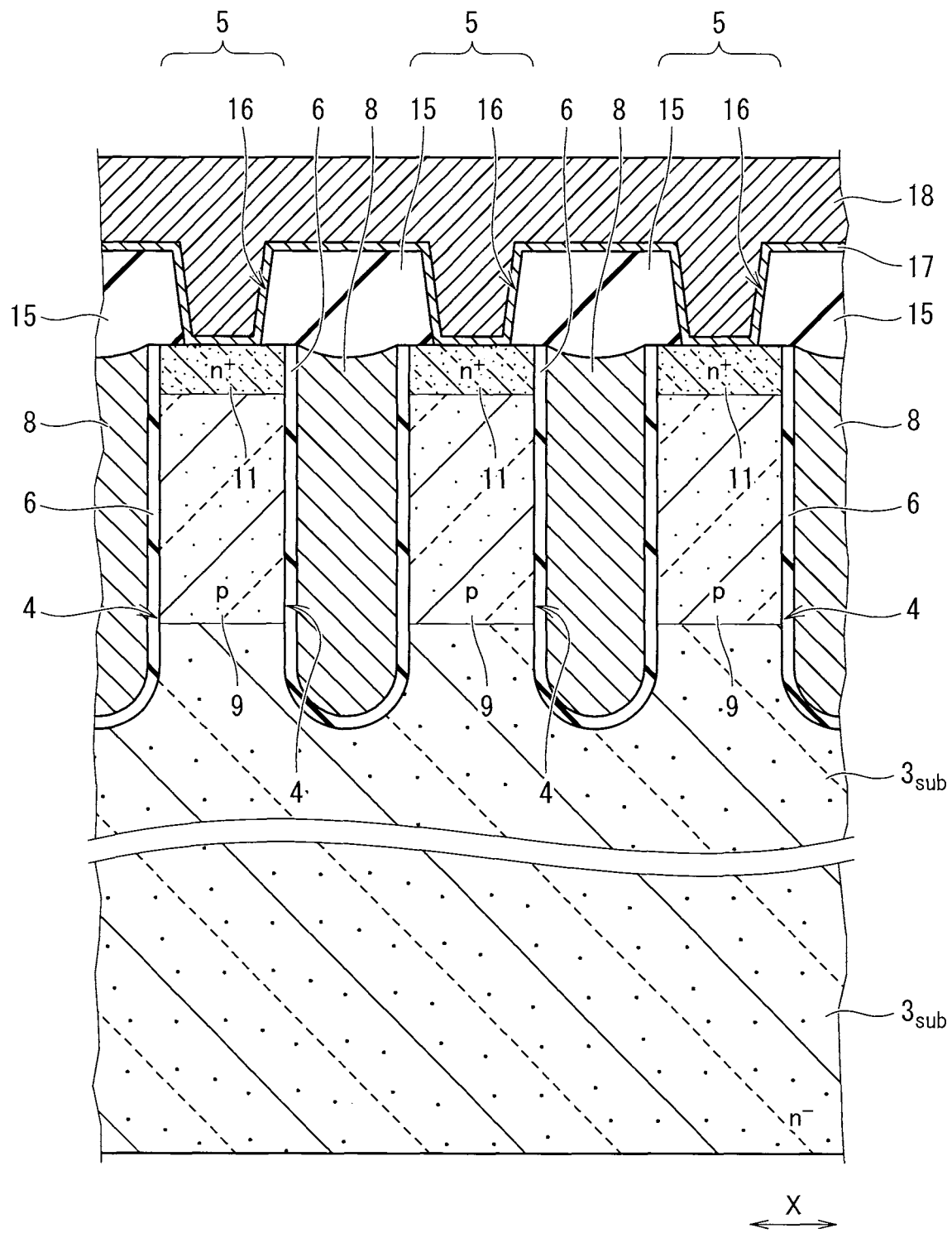
FIG. 23 is a diagram illustrating the method for manufacturing the semiconductor device according to the first embodiment of the present invention and a cross-sectional view illustrating the main portion at the position corresponding to the line IIa-IIa of FIG. 1.

(k) Then, as illustrated in FIG. 23, for example, a tungsten (W) film is deposited as a plug material 18 by a CVD method so as to fill the contact hole 16. For example, the plug material 18 is deposited with a thickness of about 0.7 micro meters with respect to the contact hole 16 with a width of 0.5 micro meters. In the deposing, the tungsten film formed by the CVD method has a better step coverage in a fine step portion than an aluminum film or an aluminum alloy film deposited by a sputtering method.

Therefore, filling the contact hole 16 with the tungsten film with a good step coverage is possible even if the width of the mesa region 5 in the X direction is reduced due to scaling-down and the aspect ratio of the contact hole 16 increases. The aspect ratio—depth/width—of the width of the contact hole 16 in the X direction to the depth of the contact hole 16 may be in the range of about 0.8 to 1.5.

Figure 24:
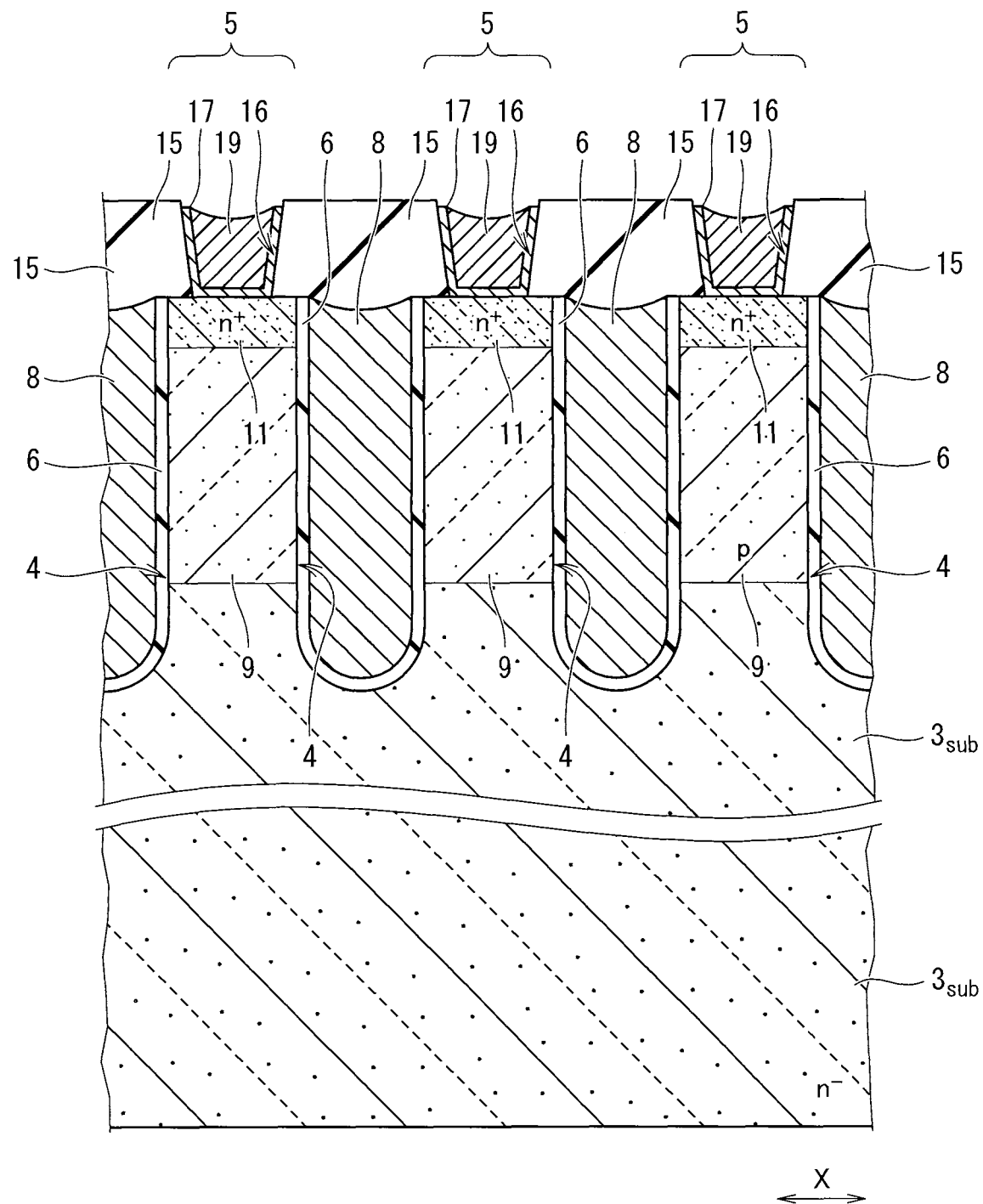
FIG. 24 is a diagram illustrating the method for manufacturing the semiconductor device according to the first embodiment of the present invention and a cross-sectional view illustrating the main portion at the position corresponding to the line IIa-IIa of FIG. 1.

(l) Then, the plug material 18 and the barrier-metal film 17 are etched back by dry etching, such as RIE, and the plug material 18 on the contact hole 16 and the interlayer insulating film 15 is selectively removed. In addition, the barrier-metal film 17 on the interlayer insulating film 15 is selectively removed. As illustrated in FIG. 24, the contact hole 16 is filled with the contact plug 19 made of the plug material 18.

The barrier-metal film 17 that selectively remains in the contact hole 16 is induced in the deposing, the contact plug 19 is selectively buried in the contact hole 16 through the barrier-metal film 17 and the surface of the interlayer insulating film 15 is substantially flat.

In the deposing, as illustrated in FIG. 4, the contact plug 19 is electrically connected to the n$^+$ emitter region 11 and the p$^+$ contact region 12 which are buried in the surface layer portion of the base region 9 through the barrier-metal film 17.

As illustrated in FIG. 24, the upper edge portion 17$d$ of the barrier-metal film 17 that remains in the contact hole 16 is slightly lower than the upper edge portion 16$d$ of the contact hole 16. The surface 19$a$ of the contact plug 19 is a concave surface in which a central portion is recessed.

(m) Then, a metallic film, which is an Al film or an aluminum alloy film made of an Al—Si alloy, an Al—Cu alloy, or an Al—Cu—Si alloy, is deposed on the entire main surface of the semiconductor substrate 3$_{SUB}$ including the upper surface of the interlayer insulating film 15 and the upper surface of the contact plug 19 by, for example, a sputtering method.

Figure 25:
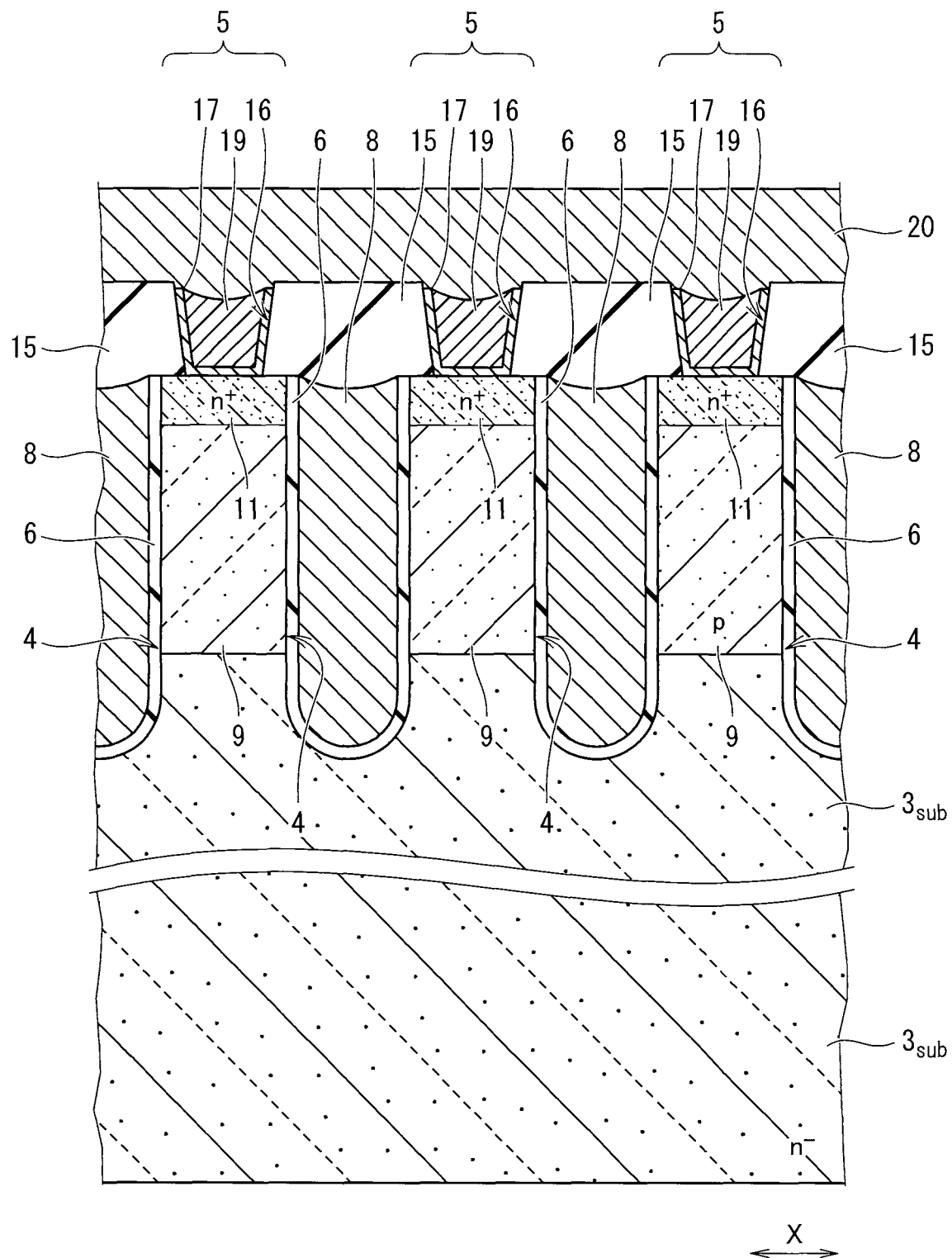
FIG. 25 is a diagram illustrating the method for manufacturing the semiconductor device according to the first embodiment of the present invention and a cross-sectional view illustrating the main portion at the position corresponding to the line IIa-IIa of FIG. 1.

Then, the metallic film is patterned by etching and the emitter electrode 20 that comes into contact with the barrier-metal film 17 and the contact plug 19 in the contact hole 16 and is electrically connected to the barrier-metal film 17 and the contact plug 19 is deposited on the interlayer insulating film 15, as illustrated in FIG. 25.

In the patterning, as illustrated in FIG. 4, the emitter electrode 20 is electrically connected to the n$^+$ emitter region 11 and the p$^+$ contact region 12 which are buried in the surface layer portion of the p-type base region 9 through the contact plug 19 and the barrier-metal film 17. The surface 19$a$ of the contact plug 19 that comes into contact with the emitter electrode 20 is a concave surface in which a central portion is recessed.

Therefore, the contact area between the emitter electrode 20 and the contact plug 19 is larger than that when the surface of the contact plug 19 is flat. As a result, reducing the contact resistance between the emitter region 11 and the contact region 12, and the emitter electrode 20 is possible.

Figure 28:
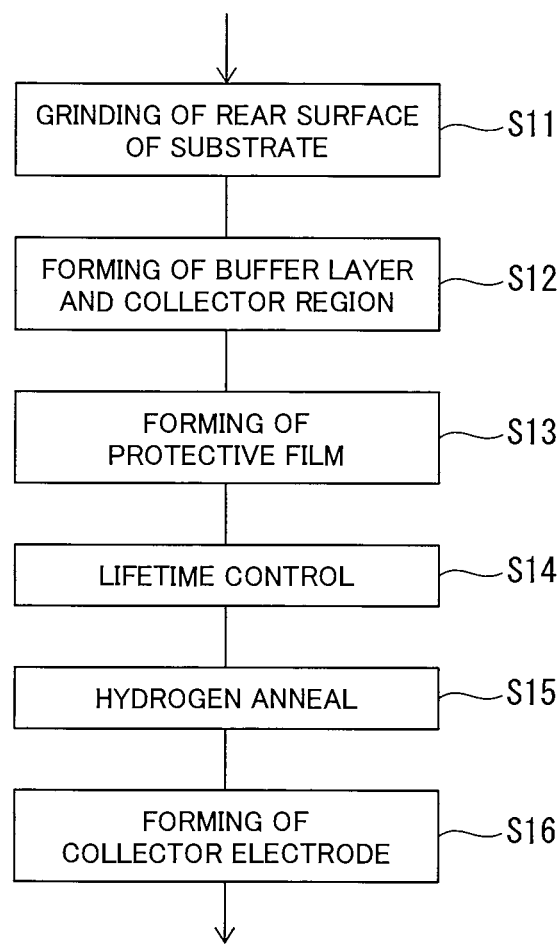
FIG. 28 is a process flowchart illustrating some of manufacturing steps for describing the method for manufacturing the semiconductor device according to the first embodiment of the present invention.

(n) Then, the rear surface of the semiconductor substrate 3$_{SUB}$ is ground by, for example, a back-grinding method such that the thickness of the semiconductor substrate 3$_{SUB}$ is reduced in a substrate rear surface grinding step S11 in FIG. 28.

Figure 26:
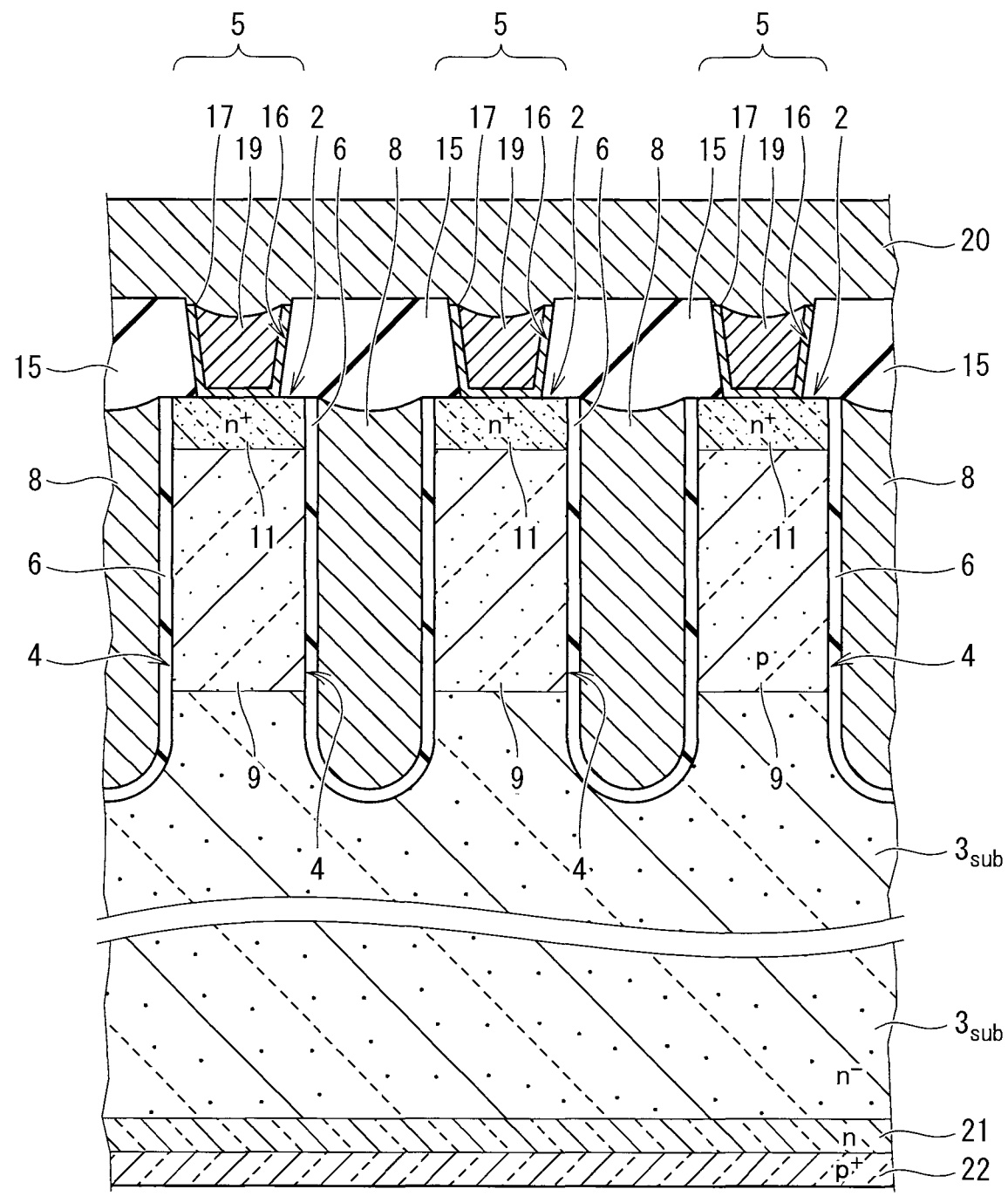
FIG. 26 is a diagram illustrating the method for manufacturing the semiconductor device according to the first embodiment of the present invention and a cross-sectional view illustrating the main portion at the position corresponding to the line IIa-IIa of FIG. 1.

Then, as illustrated in FIG. 26, the n-type buffer layer 21 and the p$^+$ collector region 22 are buried in a surface layer portion of the rear surface of the semiconductor substrate 3$_{SUB}$ in a buffer layer and collector region formation step S12 in FIG. 28.

The buffer layer 21 and the collector region 22 are provided by the following method. First, for example, phosphorous ions ($^{31}$P$^+$) are implanted as n-type impurity ions into the rear surface of the semiconductor substrate 3$_{SUB}$ and boron ions ($^{11}$B$^+$) are implanted as p-type impurity ions into the rear surface of the semiconductor substrate 3$_{SUB}$. Then, a Heat Treatment for activating the implanted impurity ions is performed to provide the buffer layer 21 and the collector region 22.

The buffer layer 21 is deposed at a position that is deeper than the collector region 22 in the depth direction from the rear surface of the semiconductor substrate 3$_{SUB}$ and the remaining semiconductor substrate 3$_{SUB}$ becomes the drift layer 3. The impurity ions for deposing the n-type buffer layer 21 are implanted under the condition in which acceleration energy is higher than that of the impurity ions for providing the p-type collector region 22. A plurality of transistor cells 2 implementing the trench IGBT is disposed in parallel by the formation.

Figure 27:
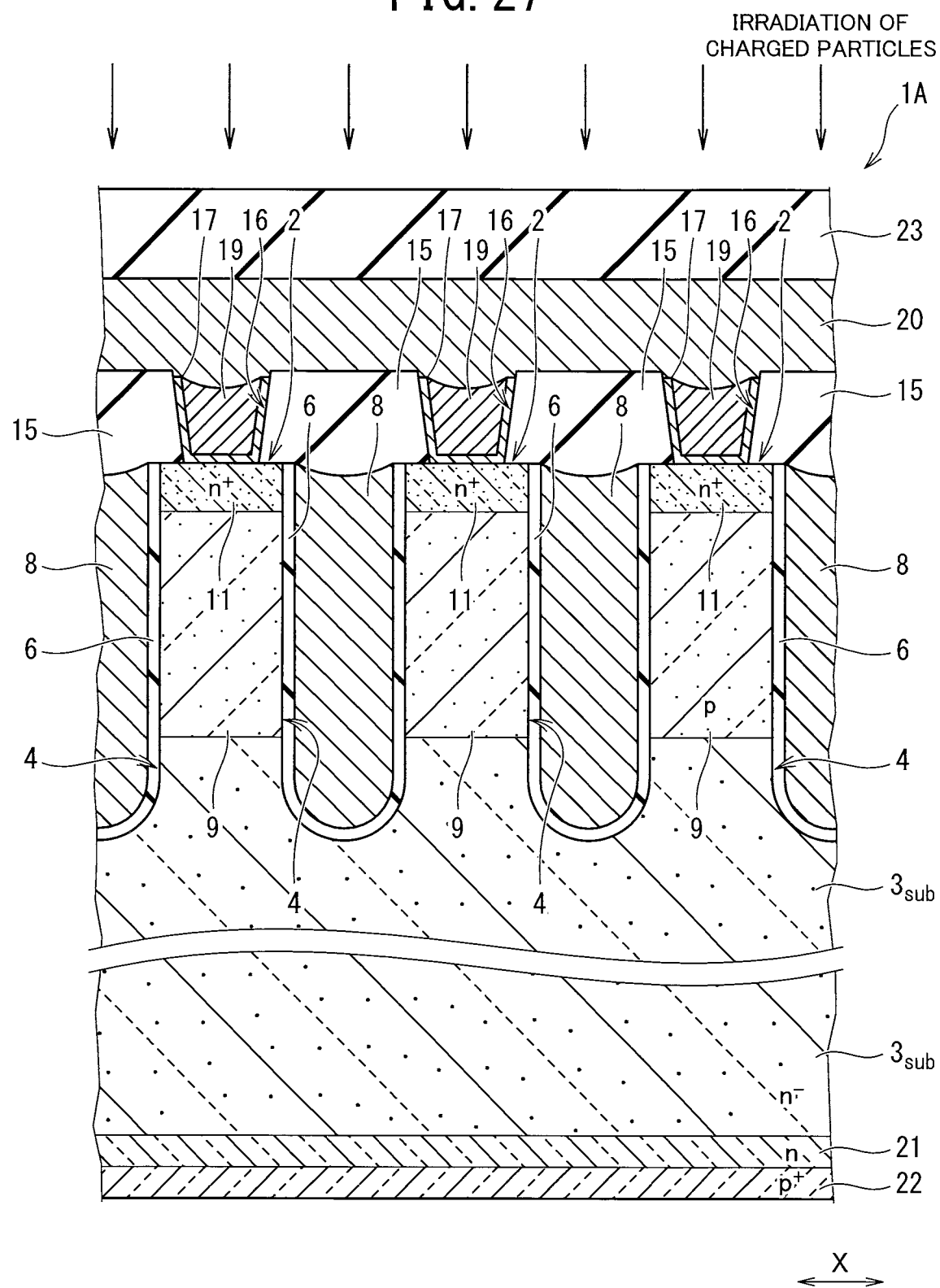
FIG. 27 is a diagram illustrating the method for manufacturing the semiconductor device according to the first embodiment of the present invention and a cross-sectional view illustrating the main portion at the position corresponding to the line IIa-IIa of FIG. 1.

(o) Then, as illustrated in FIG. 27, the protective film 23 made of, for example, a polyimide-based insulating resin is deposed so as to cover the entire surface of the emitter electrode 20 in a protective film deposing step S13 in FIG. 28. Then, in a lifetime control step S14 in FIG. 28, as illustrated in FIG. 27, charged particles, such as electron beams, helium (He) lines, or X-rays, are irradiated from the upper side of the main surface of the semiconductor substrate 3$_{SUB}$ to the main surface of the semiconductor substrate 3$_{SUB}$. The irradiated charged particles break crystals in the semiconductor substrate 3$_{SUB}$ to induce defects. Therefore, lifetime control is performed.

(p) Then, in a hydrogen anneal step S15 in FIG. 28, hydrogen anneal is performed for the semiconductor substrate 3$_{SUB}$ to recover the defects caused by the irradiation of the charged particles in the previous lifetime control step S14 in FIG. 28 or to recover a variation in the threshold voltage of the IGBT. In the hydrogen anneal, for example, the semiconductor substrate 3$_{SUB}$ is exposed in a hydrogen atmosphere at a temperature of about 360° C. for about 60 minutes.

In the hydrogen anneal, hydrogen (H$_2$) is difficult to pass through the barrier-metal film 17 including a titanium film. However, as illustrated in FIG. 27, the barrier-metal film 17 is selectively deposed in the contact hole 16 and is not deposited on the surface of the interlayer insulating film 15. Therefore, hydrogen passes through the protective film 23, the emitter electrode 20, and the interlayer insulating film 15 from the upper side of the main surface of the semiconductor substrate 3$_{SUB}$.

Therefore, supplying hydrogen easily to the main surface of the semiconductor substrate 3$_{SUB}$ and obtaining the effect of hydrogen anneal sufficiently, that is, recovering the defects caused by the irradiation of the charged particles or a variation in the threshold voltage of the IGBT sufficiently are possible. Finally, the collector electrode 24 is disposed on the collector region 22 in a collector electrode formation step S16 in FIG. 28. Therefore, a wafer process for the semiconductor device 1A according to the first embodiment of the present invention illustrated in FIGS. 1 to 7 is substantially completed.

The method for manufacturing the semiconductor device 1A according to the first embodiment of the present invention does not necessarily include the lifetime control step S14 and the hydrogen anneal step S15. In general, a method for reducing the injection efficiency of holes from the collector region 22 is used to reduce the on-state voltage and switching loss—for example, turn-off loss—of the IGBT.

Therefore, when reducing the lifetime of minority carriers is not necessary, the lifetime control step S14 and the hydrogen anneal step S15 may not be performed.

As described above, in the method for manufacturing the semiconductor device 1A according to the first embodiment of the present invention, arsenic ions ($^{75}$As$^+$) are selectively implanted as follows. That is, the interval b2 between the second masks RM2 on the first impurity ion implantation regions 12A into which the first impurity ions—boron ions ($^{11}$B$^+$)—are implanted is wider than the interval b1 between the first masks RM1 which are adjacent to each other. In addition, the width a2 of the second mask RM2 is less than the width a1 of the first mask RM1.

In addition, arsenic ions ($^{75}$As$^+$) are implanted into the surface layer portion of the base region 9 between the first impurity ion implantation regions 12A, using the second masks RM2 which are arranged at the pitch MP2 that is the same as the pitch MP1 between the first mask RM1. Acceleration energy at which a projection range is narrower than that of the first impurity ions is selected and the arsenic ions ($^{75}$As$^+$) are implanted with the selected acceleration energy.

Therefore, in the method for manufacturing the semiconductor device 1A according to the first embodiment of the present invention, as illustrated in FIG. 5 and FIG. 20, the contact regions 12 which are adjacent to each other with the emitter region 11 interposed between the contact regions 12 are deeper than the emitter region 11. In addition, the contact regions 12 which are adjacent to each other with the emitter region 11 interposed between the contact regions 12 can extend immediately below the emitter region 11 and can be separated from each other.

Furthermore, preventing a variation in the emitter-injection width $W_{inj}$ caused by the misalignment between the first masks RM1 illustrated in FIGS. 12 and 14 and the second masks RM2 for providing the emitter region 11 which are illustrated in FIGS. 15 and 17 is possible. As illustrated in FIG. 5, the contact-region contact-width $W_{bc}$ can be less than the emitter-region contact-width $W_e$ and the effective contact-region width $W_{eff}$ can be greater than the emitter-injection width $W_{inj}$.

In the method for manufacturing the semiconductor device 1A according to the first embodiment of the present invention, as described above, the irradiation of the charged particles in the lifetime control step and the hydrogen anneal step may be performed if necessary.

In the case that the irradiation of the charged particles in the lifetime control step and the hydrogen anneal step are performed, hydrogen is difficult to pass through the titanium film when the defects caused by the emission of the charged particle in the previous lifetime control step are recovered or a variation in the threshold voltage of the IGBT is recovered. The barrier-metal film 17 including the titanium film is selectively buried in the contact hole 16 and is not deposited on the surface of the interlayer insulating film 15.

Therefore, supplying hydrogen easily to the main surface of the semiconductor substrate $3_{SUB}$ from the upper side of the main surface of the semiconductor substrate $3_{SUB}$ through, for example, the protective film 23, the emitter electrode 20, and the interlayer insulating film 15, is possible. As a result, obtaining the effect of hydrogen anneal sufficiently, that is, recovering the defects caused by the irradiation of the charged particles or a variation in the threshold voltage of the IGBT sufficiently are possible.

Since the barrier-metal film 17 can be used, preventing an increase in contact resistance caused by the diffusion of atoms in the contact plug 19 is possible. As a result, increasing the switching speed of the IGBT is possible.

In the method for manufacturing the semiconductor device 1A according to the first embodiment of the present invention, the plug material 18 is etched back to remove the barrier-metal film 17 on the interlayer insulating film 15. Therefore, the barrier-metal film 17 is selectively deposed in the contact hole 16. As a result, reducing the number of manufacturing steps is possible and reducing the cost of the semiconductor device 1A including an IGBT with a high switching speed is possible.

In the method for manufacturing the semiconductor device 1A according to the first embodiment of the present invention, the plug material 18 is etched back to remove the barrier-metal film 17 on the interlayer insulating film 15. In addition, the barrier-metal film 17 that selectively remains in the contact hole 16 is deposed. Therefore, the barrier-metal film 17 in the contact hole 16 is deposed by self-alignment with the contact hole 16.

As a result, considering the deviation between the patterning position of the barrier-metal film 17 and the position of the contact hole 16 is not necessary and manufacturing an IGBT easily including a fine transistor cell 2 is possible.

In the method for manufacturing of the semiconductor device 1A according to the first embodiment of the present invention, first, the second impurity ions for providing the emitter region 11 and the first impurity ions for providing the contact region 12 are implanted into the surface layer portion of the base region 9. Then, heat treatments for activating the impurity ions are collectively performed to provide the emitter region 11 and the contact region 12. However, the present invention is not limited to the above-mentioned method.

For example, the heat treatments may be performed in different steps. In the case that the heat treatments are performed in different steps, any one of the emitter region 11 and the contact region 12 may be provided first. However, boron ions ($^{11}$B$^+$) or boron difluoride ions ($^{49}$BF$_2{}^+$) which are p-type impurity ions have a larger diffusion coefficient than arsenic ions ($^{75}$As$^+$) or phosphorous ions ($^{31}$P$^+$) which are n-type impurity ions.

Therefore, that the implantation of the boron ions ($^{11}$B$^+$) or boron difluoride ions ($^{49}$BF$_2{}^+$), which are p-type impurity ions, and the heat treatment for activating the impurity ions be performed first is preferable.

Second Embodiment

In the first embodiment, the semiconductor device 1A which is an individual device having a single IGBT has been described. In contrast, in a second embodiment, a semiconductor device 1B in which a trench IGBT and a diode are integrated will be described.

Figure 29:
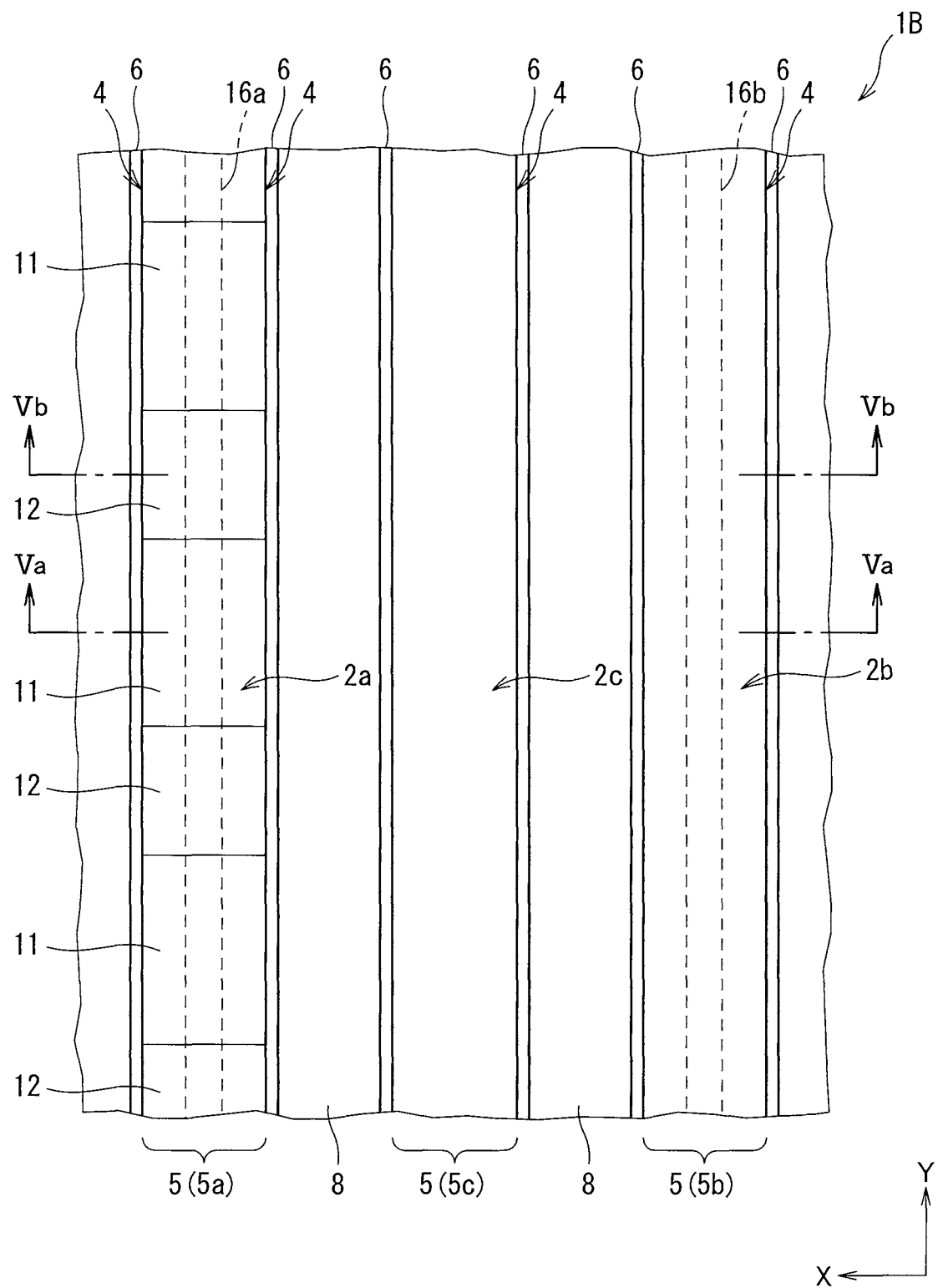
FIG. 29 is a plan view illustrating a main portion of a semiconductor device according to a second embodiment of the present invention.
Figure 30:
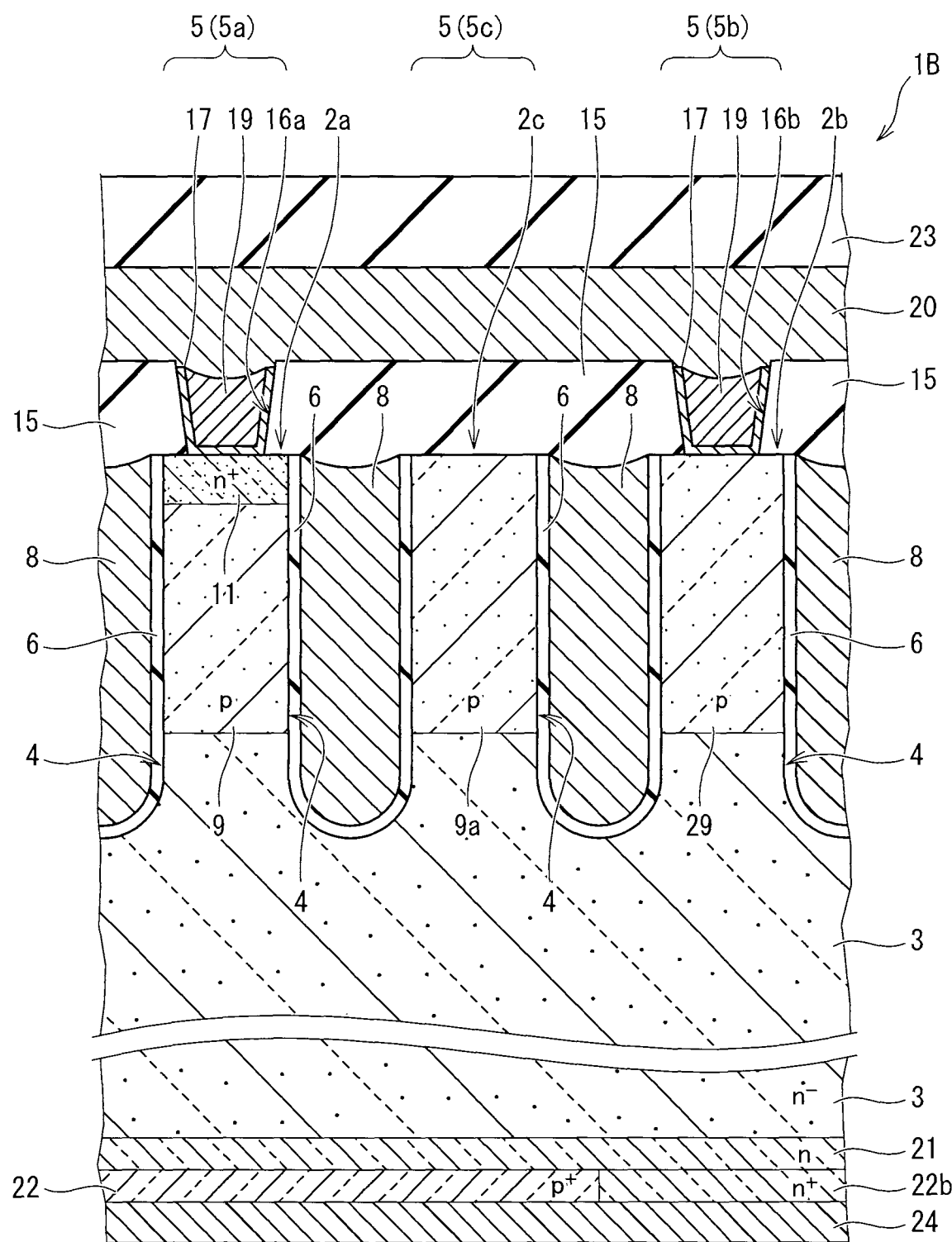
FIG. 30 is a cross-sectional view illustrating a main portion of a cross-sectional structure taken along the line Va-Va of FIG. 29.
Figure 31:
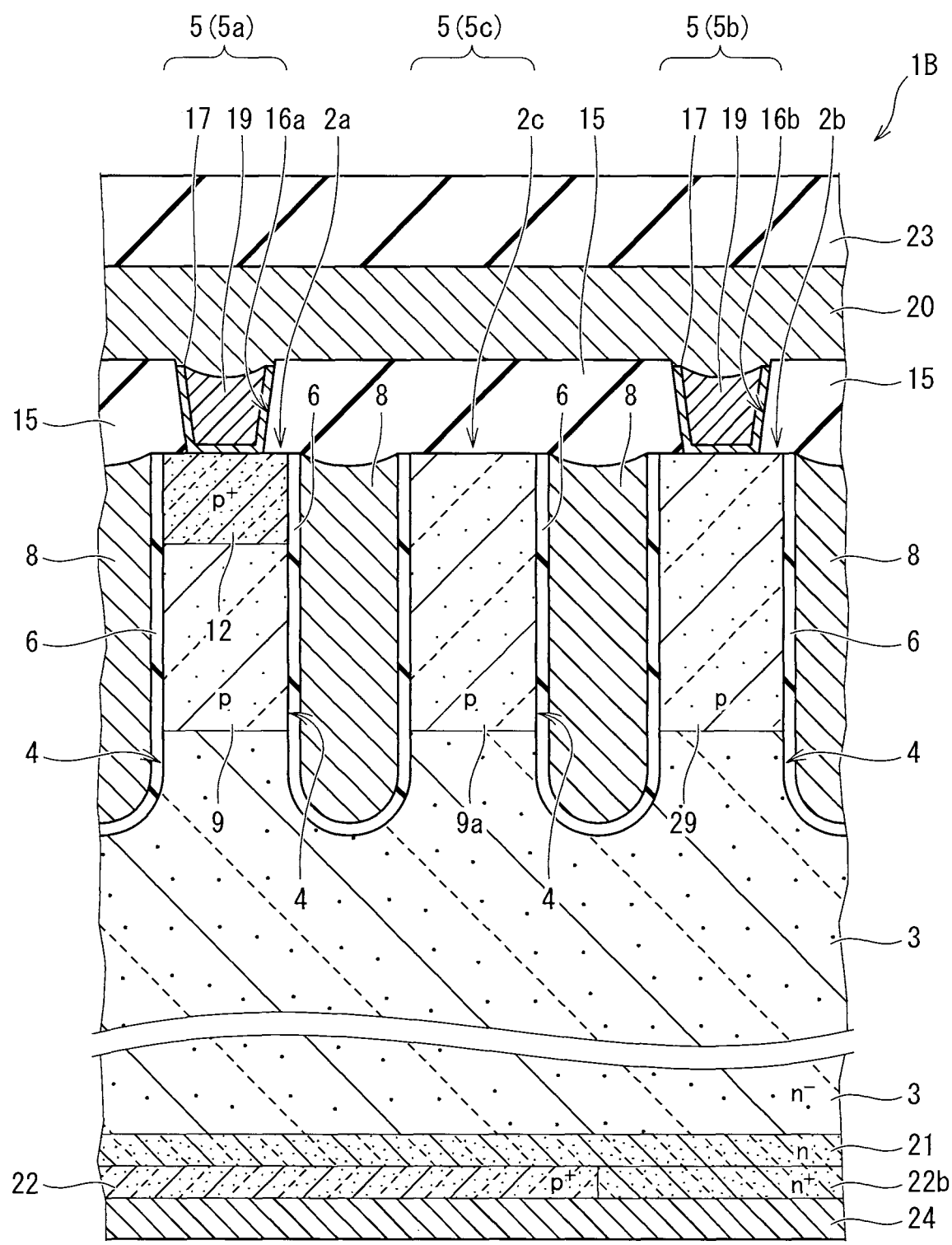
FIG. 31 is a cross-sectional view illustrating a main portion of a cross-sectional structure taken along the line Vb-Vb of FIG. 29.

As illustrated in FIGS. 29 to 31, in the semiconductor device 1B according to the second embodiment of the present invention, a portion of an n$^-$ semiconductor substrate made of, for example, single-crystalline silicon is a drift layer 3. The semiconductor device 1B according to the second embodiment is a reverse conducting IGBT (RC-IGBT) in which a trench IGBT and a diode are connected in inversely parallel to a semiconductor substrate.

As illustrated in FIG. 29, an X direction and a Y direction which are orthogonal to each other are defined in a main surface of the semiconductor substrate having the drift layer 3 in the main surface. As illustrated in FIGS. 30 and 31, a plurality of mesa regions 5 including a transistor mesa region 5a, a diode mesa region 5b, and a floating mesa region 5c are partitioned in the main surface of the semiconductor substrate by trenches 4 which are adjacent to each other in the X direction. As can be seen from FIG. 29, a plurality of trenches 4 are periodically arranged in the X direction.

For example, a plurality of transistor mesa regions 5a and a plurality of diode mesa regions 5b are periodically and alternately arranged in the X direction. The floating mesa region 5c is provided, for example, between the transistor mesa region 5a and the diode mesa region 5b and an integrated structure is achieved. The trenches 4, the transistor mesa regions 5a, the diode mesa regions 5b, and the floating mesa regions 5c each delineate stripe-shaped plane patterns that extend in parallel along the Y direction.

The trench IGBT has a multi-cell structure in which a plurality of minute-pattern transistor cells 2a is electrically connected in parallel to each other to obtain a large amount of current. The diode also has a multi-cell structure in which in which a plurality of minute-pattern diode cells 2b are electrically connected in parallel to each other to obtain a high breakdown voltage.

FIGS. 29 to 31 illustrate a portion of the semiconductor device 1B according to the second embodiment in which one transistor cell 2a, one diode cell 2b, one transistor mesa region 5a, one diode mesa region 5b, and one floating mesa region 5c are provided. However, the present invention is not limited to the second embodiment illustrated in FIGS. 29 to 31.

As illustrated in FIGS. 30 and 31, a plurality of trenches 4 which are adjacent to each other in the X direction are dug in the drift layer 3. A plurality of mesa regions 5—the transistor mesa region 5a, the diode mesa region 5b, and the floating mesa region 5c—which are interposed and partitioned between a pair of opposite trenches 4 among the plurality of trenches 4 are defined.

A gate insulating film 6 is provided along the inner wall of each of the plurality of trenches 4. A gate electrode 8 is buried in each trench 4 through the gate insulating film 6.

As can be seen from FIGS. 29 to 31, the transistor cell 2a includes a p-type base region 9 buried in a surface layer portion of the transistor mesa region 5a and a plurality of $n^+$ emitter regions 11 that are periodically buried in a surface layer portion of the base region 9 along the Y direction.

The transistor cell 2a includes a plurality of $p^+$ contact regions 12 which are alternately arranged in the Y direction together with the emitter regions 11 such that the emitter region 11 is interposed between the transistor cells 2a, are deeper than the emitter region 11, and extend immediately below the emitter region 11 so as to be separated from each other.

The transistor cells 2a include, as a common region, the common drift layer 3, which is the semiconductor substrate, and an n-type buffer layer 21 and a second-conductivity-type collector region 22 having a high impurity concentration which are deposited on the rear surface of the drift layer 3.

The floating mesa region 5c is provided between the diode cell 2b, which will be described below, and the transistor cell 2a. The emitter region 11 is not buried in the floating mesa region 5c and a p-type floating region 9a which is not electrically connected to an emitter electrode 20 and electrically floats is formed in the floating mesa region 5c.

The collector region 22 corresponding to the transistor cell 2a extends on the other main surface—rear surface—that is opposite to the floating mesa region 5c.

The diode cell 2b includes a second-conductivity-type anode region 29 buried in a surface layer portion of the diode mesa region 5b. In addition, the diode cell 2b includes the common drift layer 3, which is the semiconductor substrate, the first-conductivity-type buffer layer 21 buried in a surface layer portion of the rear surface of the drift layer 3, and a first-conductivity-type cathode region 22b that has a high impurity concentration and is buried in the surface layer portion of the rear surface of the drift layer 3 so as to be opposite to the diode mesa region 5b.

The anode region 29 is shallower than the trench 4 and is buried in the same step as, for example, the base region 9. A cathode region 22b is provided at a position that is shallower than the buffer layer 21 in a depth direction from the rear surface of the drift layer 3, together with the $n^+$ collector region 22, and is electrically and metallurgically connected to a collector electrode 24 that is deposited on the rear surface of the drift layer 3. The cathode region 22b has a higher impurity concentration than the buffer layer 21.

An interlayer insulating film 15 is provided so as to cover the entire surface of the trench 4, the transistor mesa region 5a, the diode mesa region 5b, and the floating mesa region 5c.

A contact hole 16a is buried in the interlayer insulating film 15 so as to extend from the surface of the interlayer insulating film 15 to the transistor mesa region 5a through the interlayer insulating film 15. In addition, a contact hole 16b is buried in the interlayer insulating film 15 so as to extend from the surface of the interlayer insulating film 15 to the diode mesa region 5b through the interlayer insulating film 15.

As represented by a dotted line in FIG. 29, the contact hole 16a extends in the Y direction, namely the longer direction in the planar pattern of the trench 4 or the transistor mesa region 5a—in the transistor mesa region 5a and is provided so as to correspond to the position where the emitter region 11 and the contact region 12 are provided.

As represented by a dotted line in FIG. 29, the contact hole 16b extends in the Y direction, namely the longer direction in the planar pattern of the trench 4 or the diode mesa region 5b—in the diode mesa region 5b and is provided so as to face the anode region 29. For example, the contact holes 16a and 16b are stripe-shaped parallel plane patterns having a width of 0.5 micro meters, similarly to the contact hole 16 according to the first embodiment.

As illustrated in FIGS. 30 and 31, a barrier-metal film 17 is buried in the contact hole 16a, similarly to the contact hole 16 according to the first embodiment. The barrier-metal film 17 is selectively deposited on the inner wall of the contact hole 16a and the surfaces of the emitter region 11 and the contact region 12 which are exposed through the bottom of the contact hole 16a.

In addition, the contact hole 16a is filled with a contact plug 19 through the barrier-metal film 17. Similarly to the contact hole 16 according to the first embodiment, the barrier-metal film 17 is selectively deposited on the inner wall of the contact hole 16b and the surface of the anode region 29 which is exposed through the bottom of the contact hole 16b is buried in the contact hole 16b.

The contact hole 16b is filled with a contact plug 19 through the barrier-metal film 17. The barrier-metal film 17 is not deposited on the surface of the interlayer insulating film 15 and is selectively buried in each of the contact holes 16a and 16b.

As illustrated in FIGS. 30 and 31, the emitter electrode 20 is deposited on the trench 4 and the mesa region 5 so as to cover the interlayer insulating film 15 and the contact plug 19. The emitter electrode 20 is electrically connected to the emitter region 11 and the contact region 12 through the contact plug 19 and the barrier-metal film 17 buried in the contact hole 16a.

In addition, the emitter electrode 20 is electrically connected to the anode region 29 through the contact plug 19 and the barrier-metal film 17 buried in the contact hole 16b. A protective film 23 is deposited on the emitter electrode 20 so as to cover the emitter electrode 20.

The collector electrode 24 is deposited on the rear surface of the drift layer 3 so as to cover the rear surface. The collector electrode 24 is electrically and metallurgically connected to the collector region 22 and the cathode region 22b such that contact resistance is reduced.

The $n^+$ emitter region 11 and the $p^+$ contact region 12 according to the second embodiment have the same structure as the $n^+$ emitter region 11 and the $p^+$ contact region 12 according to the first embodiment. That is, referring to FIG. 5, the $p^+$ contact regions 12 which are adjacent to each other, with the n$^+$ emitter region 11 interposed between the p$^+$ contact regions 12, are deeper than the emitter region 11. The contact regions 12 extend immediately below the emitter region 11 so as to be separated from each other.

The contact-region contact-width $W_{bc}$ of the contact region 12 is less than the emitter-region contact-width $W_e$ of the surface of the emitter region 11 that is connected to the emitter electrode 20 through the contact plug 19 and the barrier-metal film 17. The effective contact-region width $W_{eff}$ of a contact-base interface 12p in the Y direction is greater than the emitter-injection width $W_{inj}$ of an emitter-base p-n junction interface 11n1 in the Y direction.

Referring to FIG. 6, a width A that is half of the emitter-injection width $W_{inj}$ of the emitter-base p-n junction interface 11n1 in the Y direction is less than a creeping distance $d_{crp}$ of an emitter-contact p-n junction interface 11n2 along a curve in a cross-sectional view taken along the Y direction.

The barrier-metal film 17 and the contact plug 19 according to the second embodiment have the same structure as the barrier-metal film 17 and the contact plug 19 according to the first embodiment. That is, referring to FIG. 7, an upper edge portion 17d of the barrier-metal film 17 is slightly lower than an upper edge portion 16d of the contact hole 16 corresponding to the contact holes 16a and 16b. A surface 19a of the contact plug 19 is a concave surface in which a central portion is recessed.

The semiconductor device 1B according to the second embodiment includes the diode cell 2b disposing the diode and the floating mesa region 5c, unlike the semiconductor device 1A according to the first embodiment. Therefore, an impurity introduction mask pattern can mainly be changed to implement the semiconductor device 1B according to the second embodiment, using a manufacturing method that is substantially the same as that for manufacturing the semiconductor device 1A according to the first embodiment.

Therefore, in the semiconductor device 1B according to the second embodiment having the above-mentioned structure, obtaining the same effect as that in the semiconductor device 1A according to the first embodiment is possible.

Third Embodiment

<Structure of Semiconductor Device According to Third Embodiment>

Figure 32:
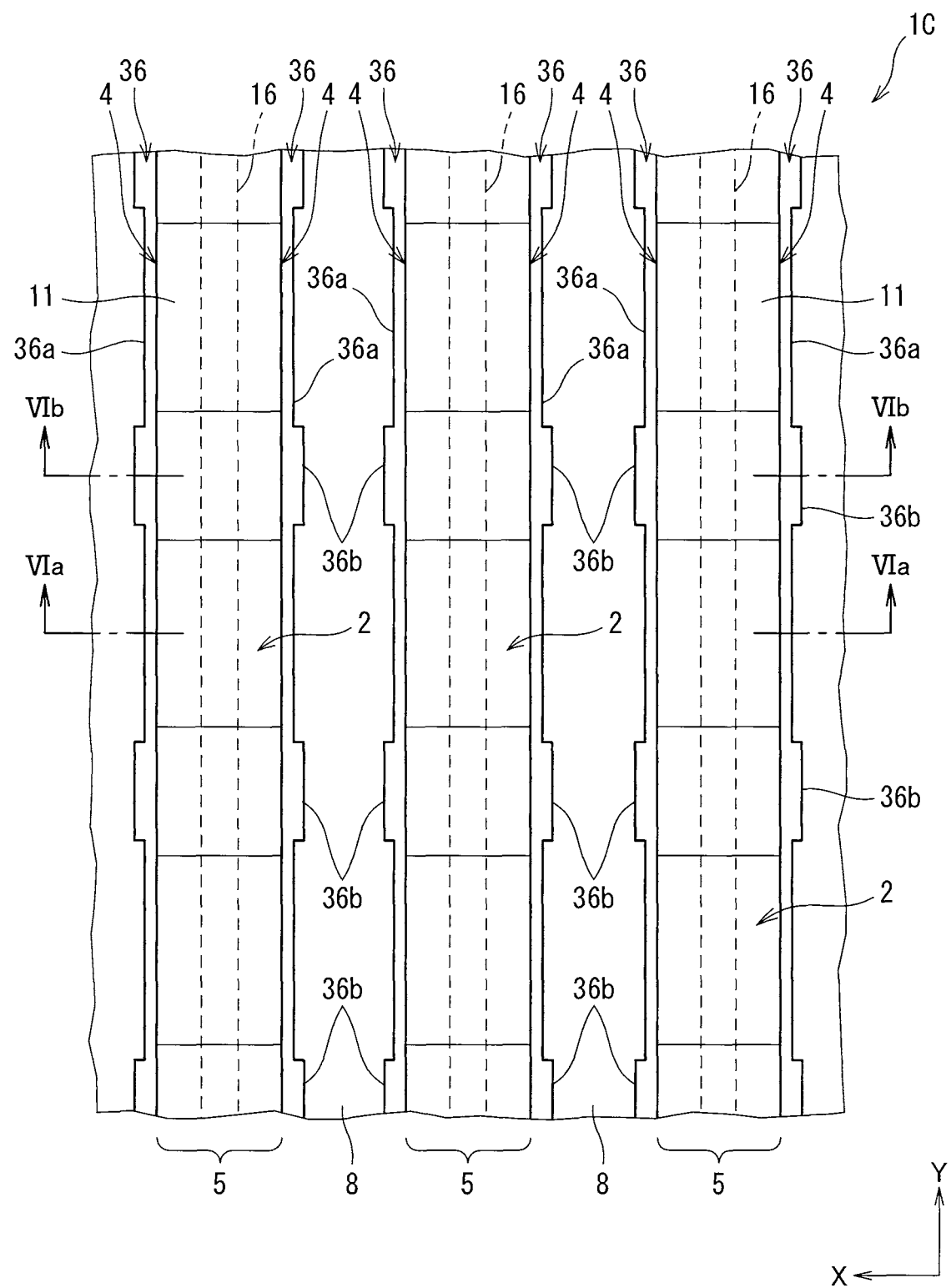
FIG. 32 is a plan view illustrating a main portion of a semiconductor device according to a third embodiment of the present invention.
Figure 33:
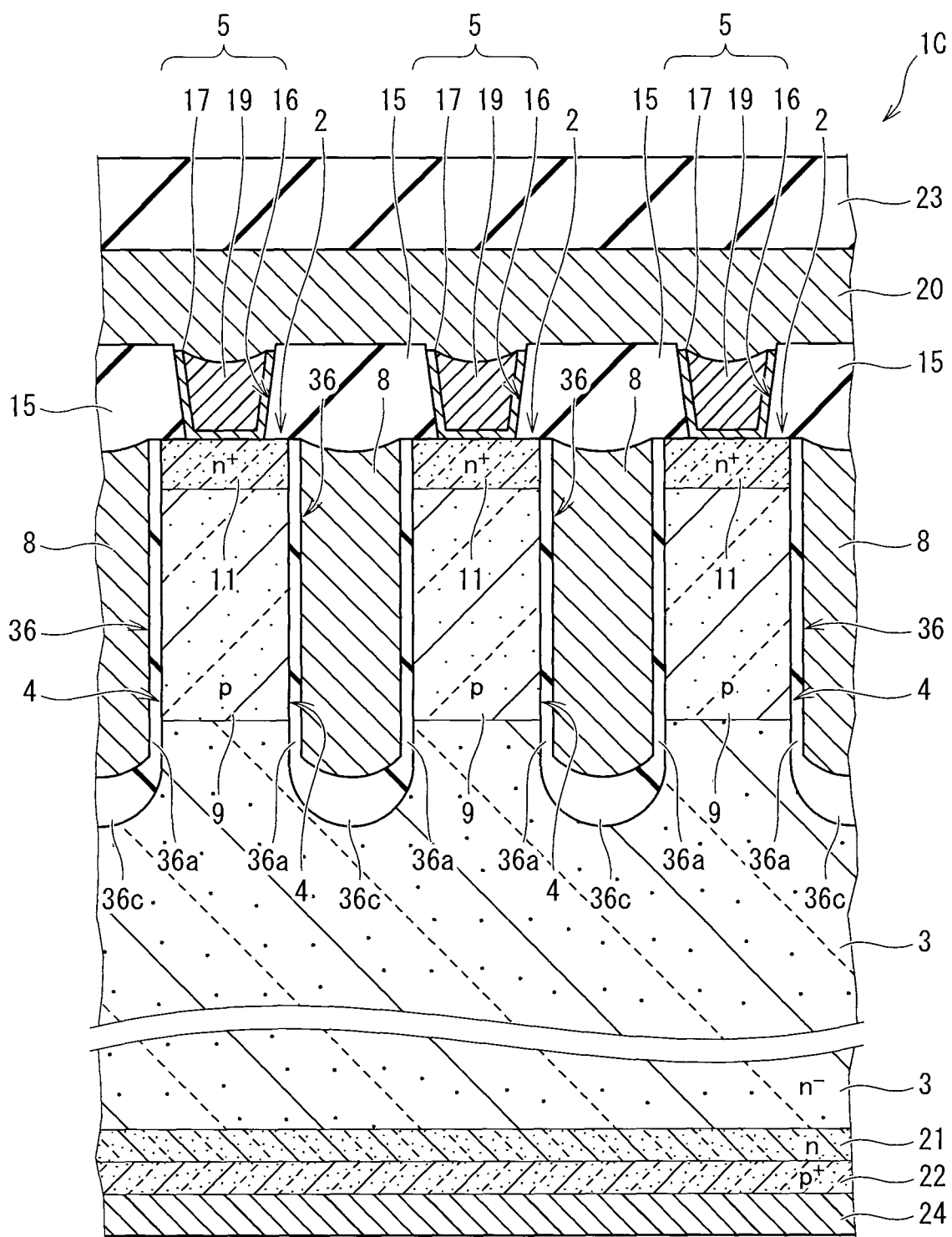
FIG. 33 is a cross-sectional view illustrating a main portion of a cross-sectional structure taken along the line VIa-VIa of FIG. 32.
Figure 34:
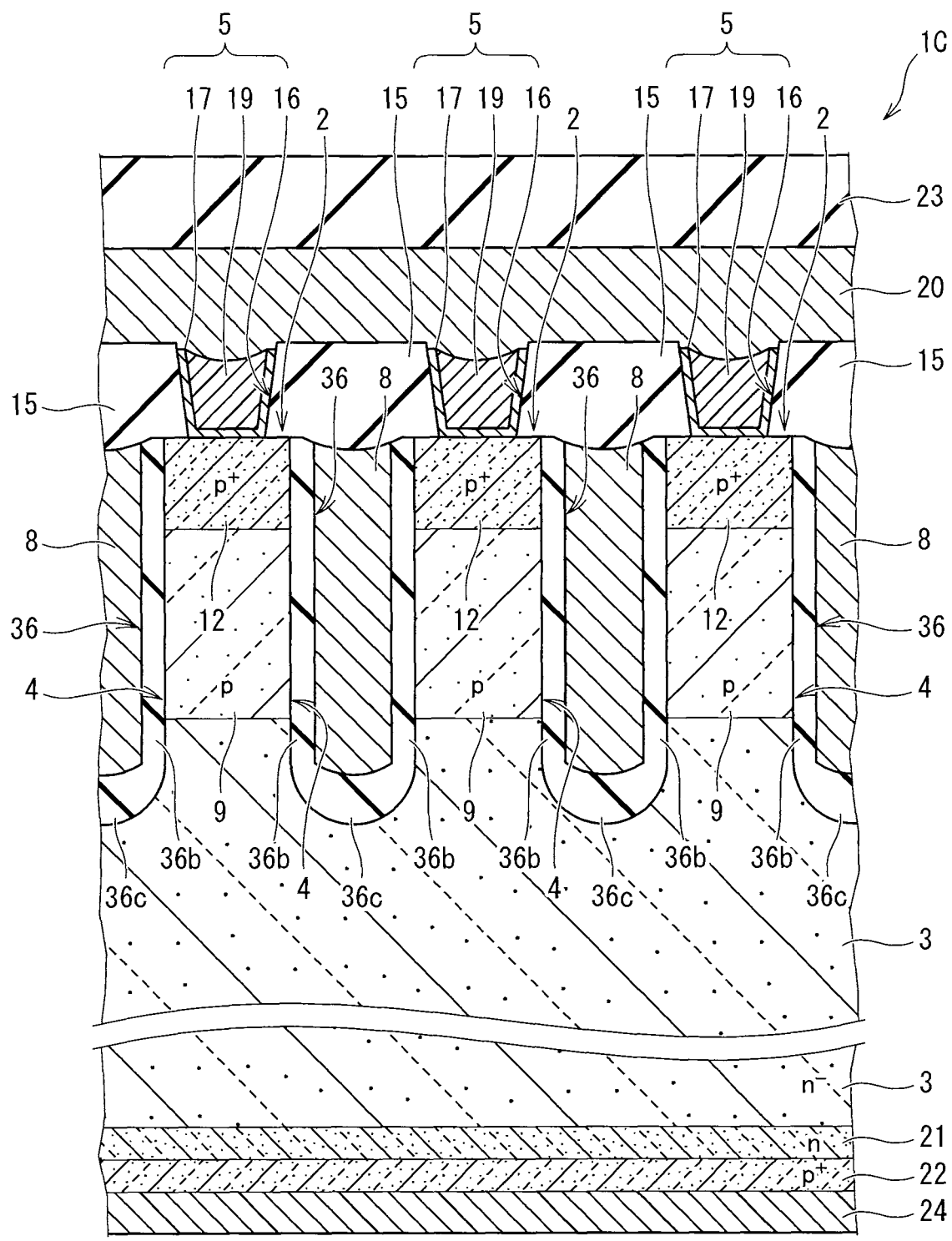
FIG. 34 is a cross-sectional view illustrating a main portion of a cross-sectional structure taken along the line VIb-VIb of FIG. 32.

A semiconductor device 1C according to a third embodiment of the present invention has substantially the same structure as the semiconductor device 1A according to the first embodiment of the present invention except for the structure of a gate insulating film 36, as illustrated in FIGS. 32 to 34. The semiconductor device 1C according to the third embodiment includes the gate insulating film 36 having a thickness that is different from that of the gate insulating film 6 according to the first embodiment.

As illustrated in FIGS. 32 to 34, the semiconductor device 1C according to the third embodiment of the present invention includes a drift layer 3 which is a portion of a semiconductor substrate, similarly to the semiconductor device 1A according to the first embodiment. In addition, the semiconductor device 1C according to the third embodiment includes a mesa region 5 which is interposed and partitioned between trenches 4 adjacent to each other in the X direction on the drift layer 3 and a gate electrode 8 buried in the trench 4 through the gate insulating film 36.

The semiconductor device 1C according to the third embodiment further includes a p-type base region 9 which is buried in a surface layer portion of the mesa region 5 and a plurality of n$^+$ emitter regions 11 which are periodically buried in the surface layer portion of the base region 9 along the Y direction.

In addition, the semiconductor device 1C according to the third embodiment includes a plurality of p$^+$ contact regions 12 which are alternately arranged in the Y direction together with the emitter regions 11 such that the emitter region 11 is interposed between the contact regions 12, are deeper than the emitter region 11, and extend immediately below the emitter region 11 so as to be separated from each other.

The semiconductor device 1C according to the third embodiment further includes an interlayer insulating film 15 that is deposited on the drift layer 3 so as to cover the emitter region 11 and the contact region 12. Contact holes 16 are buried in the interlayer insulating film 15 so as to face the emitter region 11 and the contact region 12.

The semiconductor device 1C according to the third embodiment further includes a barrier-metal film 17 buried in the contact hole 16 and is selectively deposited on the inner wall of the contact hole 16 and the surfaces of the emitter region 11 and the contact region 12 which are exposed through the bottom of the contact hole 16.

The semiconductor device 1C according to the third embodiment further includes a contact plug 19 buried in the contact hole 16 through the barrier-metal film 17 and an emitter electrode 20 that is deposited on the interlayer insulating film 15 so as to be connected to the contact plug 19.

As can be seen from FIGS. 32 to 34, the gate insulating film 36 includes a first portion 36a, which is referred in FIGS. 32 and 33, that is provided at least between the gate electrode 8 and the base region 9 immediately below the emitter region 11. In addition, the gate insulating film 36 includes a second portion 36b, which is referred in FIGS. 32 and 34, that is provided at least between the gate electrode 8 and the base region 9 immediately below the contact region 12.

In other words, the gate insulating film 36 includes the first portion 36a that is provided at least on the sidewalls of the trenches 4 between which the base region 9 immediately below the emitter region 11 is interposed. In addition, the gate insulating film 36 includes the second portion 36b which is thicker than the first portion 36a and is provided at least on the sidewalls of the trenches 4 between which the base region 9 immediately below the contact region 12 is interposed.

As illustrated in FIGS. 33 and 34, the gate insulating film 36 further includes a third portion 36c which is thicker than the first portion 36a and is provided at least at the bottom of the trench 4—between the drift layer 3 and the gate electrode 8—. The first portion 36a, the second portion 36b, and the third portion 36c are continuously and integrally provided.

As illustrated in FIGS. 32 and 33, the first portion 36a is provided so as to extend from a portion between the gate electrode 8 and the base region 9 immediately below the emitter region 11 to a portion between the gate electrode 8 and the base region 9 immediately below the contact region 12. A part of the first portion 36a protrudes to the base region 9 immediately below the contact region 12 in the Y direction and is connected to the second portion 36b.

As illustrated in FIG. 33, the first portion 36a is provided so as to extend from a portion between the gate electrode 8 and the base region 9 immediately below the emitter region 11 to a portion between the emitter region 11 and the gate electrode 8. A part of the first portion 36a protrudes to the emitter region 11 and is terminated by the upper surface of the mesa region 5.

The first portion 36a is provided so as to extend from a portion between the gate electrode 8 and the base region 9 immediately below the emitter region 11 to a portion between the bottom of the trench 4 and the gate electrode 8—between the drift layer 3 and the gate electrode 8 —. A part of the first portion 36a protrudes to the bottom of the trench 4—to the drift layer 3—and is connected to the third portion 36c.

As illustrated in FIG. 34, similarly to the first portion 36a, the second portion 36b is provided so as to extend from a portion between the gate electrode 8 and the base region 9 immediately below the contact region 12 to a portion between the contact region 12 and the gate electrode 8. A part of the second portion 36b protrudes to the contact region 12 and is terminated by the surface of the mesa region 5.

Similarly, the second portion 36b is provided so as to extend from a portion between the gate electrode 8 and the base region 9 immediately below the contact region 12 to a portion between the bottom of the trench 4 and the gate electrode 8—between the drift layer 3 and the gate electrode 8 —. A part of the second portion 36b protrudes to the bottom of the trench 4—to the drift layer 3—and is connected to the third portion 36c.

The first portion 36a is, for example, a $SiO_2$ film which is a thermally oxidized film deposed by a thermal oxidation method. The second portion 36b and the third portion 36c are, for example, a $SiO_2$ film which is a deposited film formed by a deposition method such as a CVD method.

The first portion 36a has a thickness of, for example, about 100 nanometers. The second portion 36b has a thickness of, for example, about 150 nanometers. The third portion 36c has a thickness of, for example, about 200 nanometers.

In the semiconductor device 1C according to the third embodiment, channel charge is induced in the base region 9 immediately below the emitter region 11 through the gate insulating film 36 that is provided between the gate electrode 8 and the base region 9 immediately below the emitter region 11. Therefore, the first portion 36a that is provided between the gate electrode 8 and the base region 9 immediately below the emitter region 11 substantially functions as a gate film that induces channel charge.

The second portion 36b provided between the gate electrode 8 and the base region 9 immediately below the contact region 12 or the third portion 36c provided at the bottom of the trench 4 does not function as the gate film that substantially induces channel charge. In the semiconductor device 1C according to the third embodiment, the second portion 36b and the third portion 36c are thicker than the first portion 36a.

Therefore, reducing the capacitance between the gate and the emitter and the capacitance between the gate and the collector, as compared to the earlier technology in which the first portion 36a, the second portion 36b, and the third portion 36c are uniformly provided with the same thickness, is possible. As a result, reducing the switching time and switching loss of the trench IGBT is possible. In addition, increasing the switching speed of the trench IGBT is possible.

In particular, in the trench IGBT, the width of the mesa region 5 tends to be reduced to increase the number of mesa regions 5, in order to improve current density. Then, the number of trenches 4 increases, which results in an inevitable increase in the number of second portions 36b and third portions 36c which do not function as the gate film that substantially induces channel charge. Therefore, the structure in which the second portion 36b and the third portion 36c are thicker than the first portion 36a as in the semiconductor device 1C according to the third embodiment is useful to increase the switching speed of the IGBT.

<Method for Manufacturing Semiconductor Device According to Third Embodiment>

Next, a method for manufacturing the semiconductor device 1C according to the third embodiment will be described with reference to FIGS. 35 to 44. In the method for manufacturing the semiconductor device 1C according to the third embodiment, steps are substantially the same as those in the method for manufacturing the semiconductor device 1A according to the first embodiment except for deposing the gate insulating film 36. Therefore, the description is focused on the step of deposing the gate insulating film 36 and the detailed description of the other steps will not be repeated.

(a1) First, an n⁻ semiconductor substrate $3_{SUB}$ is prepared. Then, as illustrated in FIG. 8, the trenches 4 are dug in the main surface of the semiconductor substrate $3_{SUB}$ and the mesa region 5 which is interposed and partitioned between adjacent trenches 4 in the X direction is buried in the same steps as those in the first embodiment.

Figure 35:
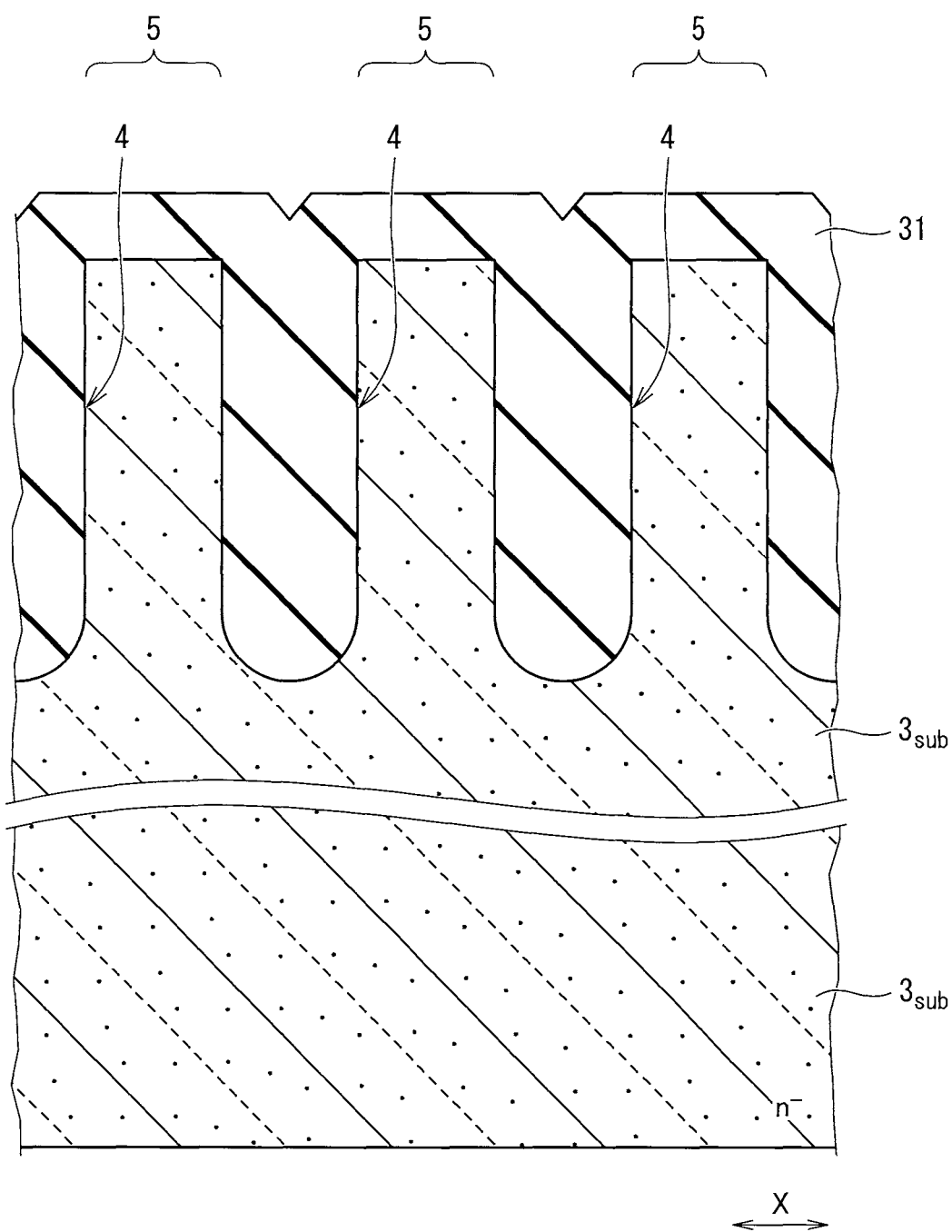
FIG. 35 is a diagram illustrating a method for manufacturing the semiconductor device according to the third embodiment of the present invention and a cross-sectional view illustrating a main portion at a position corresponding to the line VIa-VIa of FIG. 32.

(b1) Then, as illustrated in FIG. 35, a deposited film 31 which is a $SiO_2$ film is deposed on the main surface of the semiconductor substrate $3_{SUB}$ by, for example, a CVD method so as to fill the trenches 4. The deposited film 31 is deposed with a thickness of about 1 micro meters, for example, with respect to a trench width of 1 micro meters.

Figure 36:
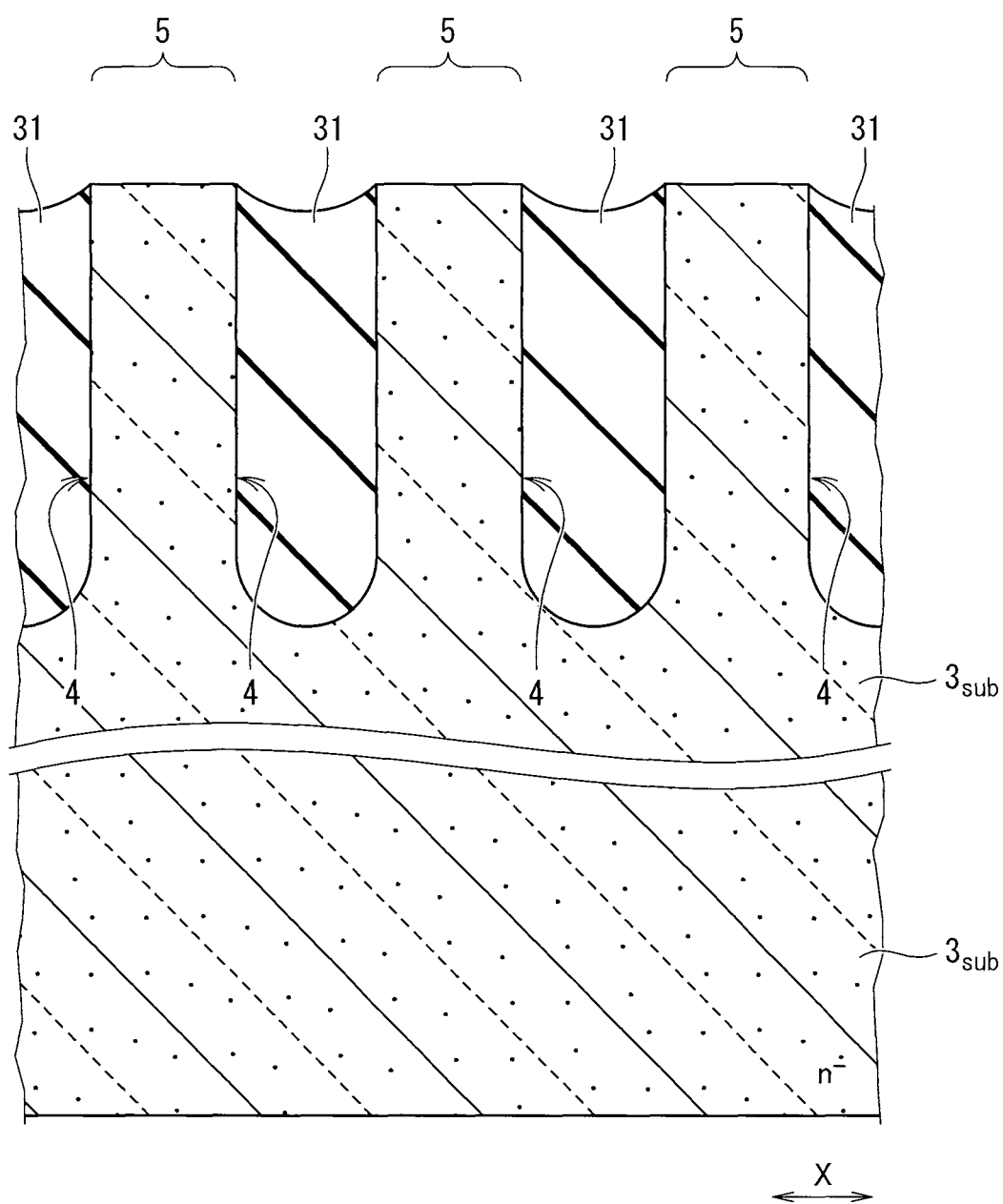
FIG. 36 is a diagram illustrating the method for manufacturing the semiconductor device according to the third embodiment of the present invention and a cross-sectional view illustrating the main portion at the position corresponding to the line VIa-VIa of FIG. 32.

(c1) Then, the deposited film 31 is etched back by dry etching such as RIE. As illustrated in FIG. 36, the deposited film 31 on the main surface of the semiconductor substrate $3_{SUB}$, that is, on the trench 4 and the mesa region 5 is selectively removed by the etching and the deposited film 31 buried in the trench 4 is dug.

Figure 37:
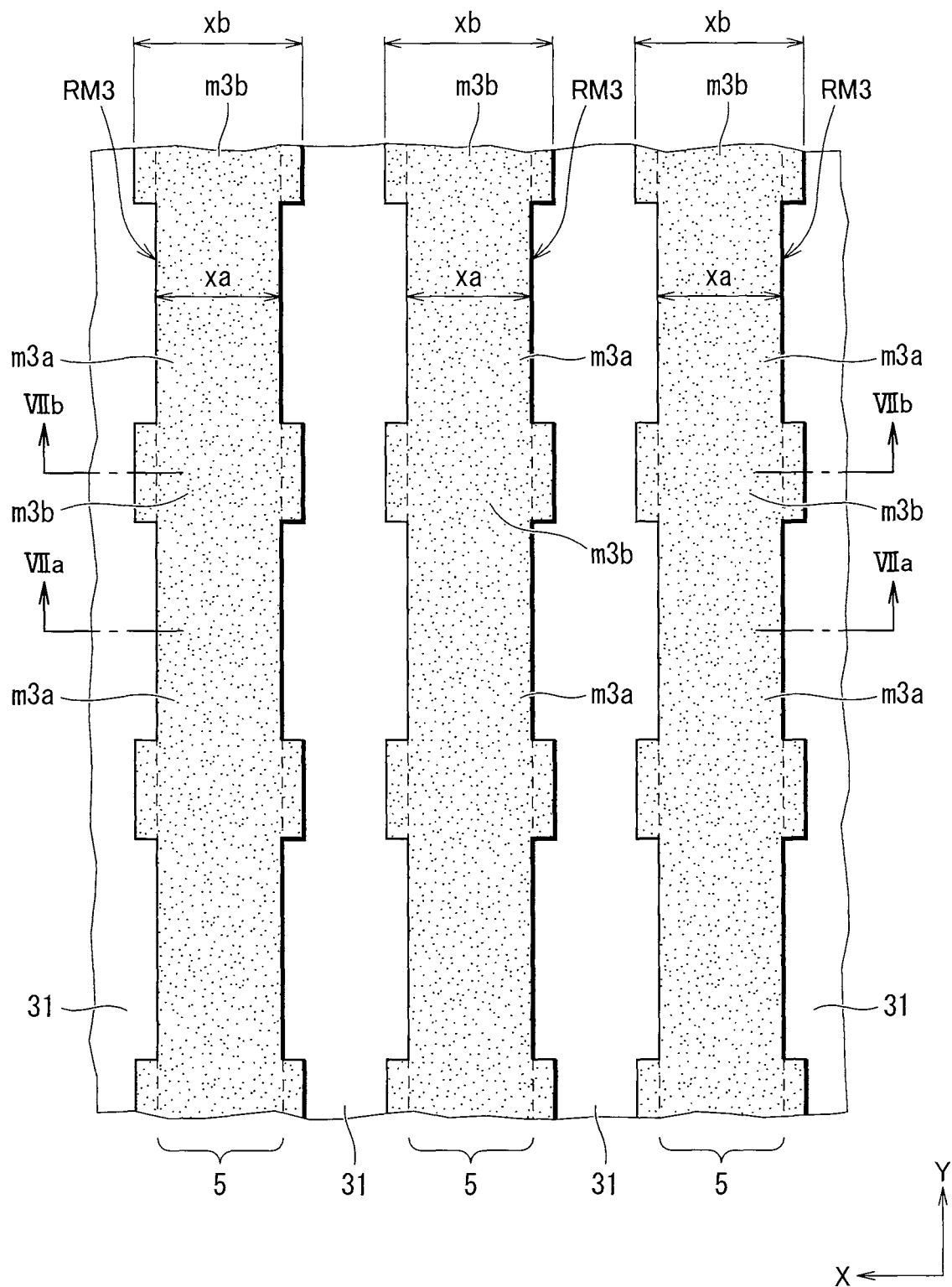
FIG. 37 is a diagram illustrating the method for manufacturing the semiconductor device according to the third embodiment of the present invention and a plan view illustrating a main portion of the plane pattern of an etching mask.
Figure 38:
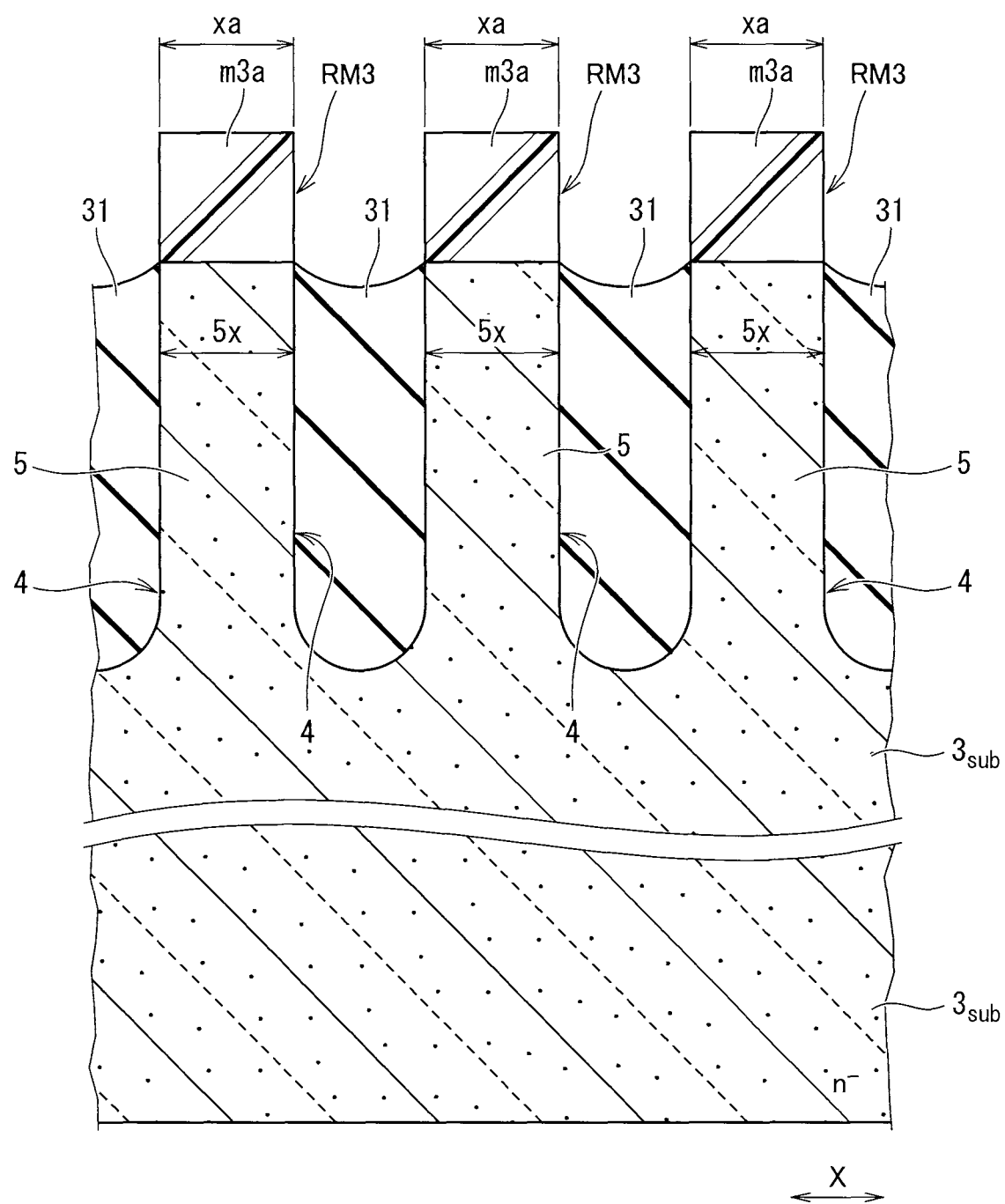
FIG. 38 is a cross-sectional view illustrating a main portion of a cross-sectional structure taken along the line VIIa-VIIa of FIG. 37.
Figure 39:
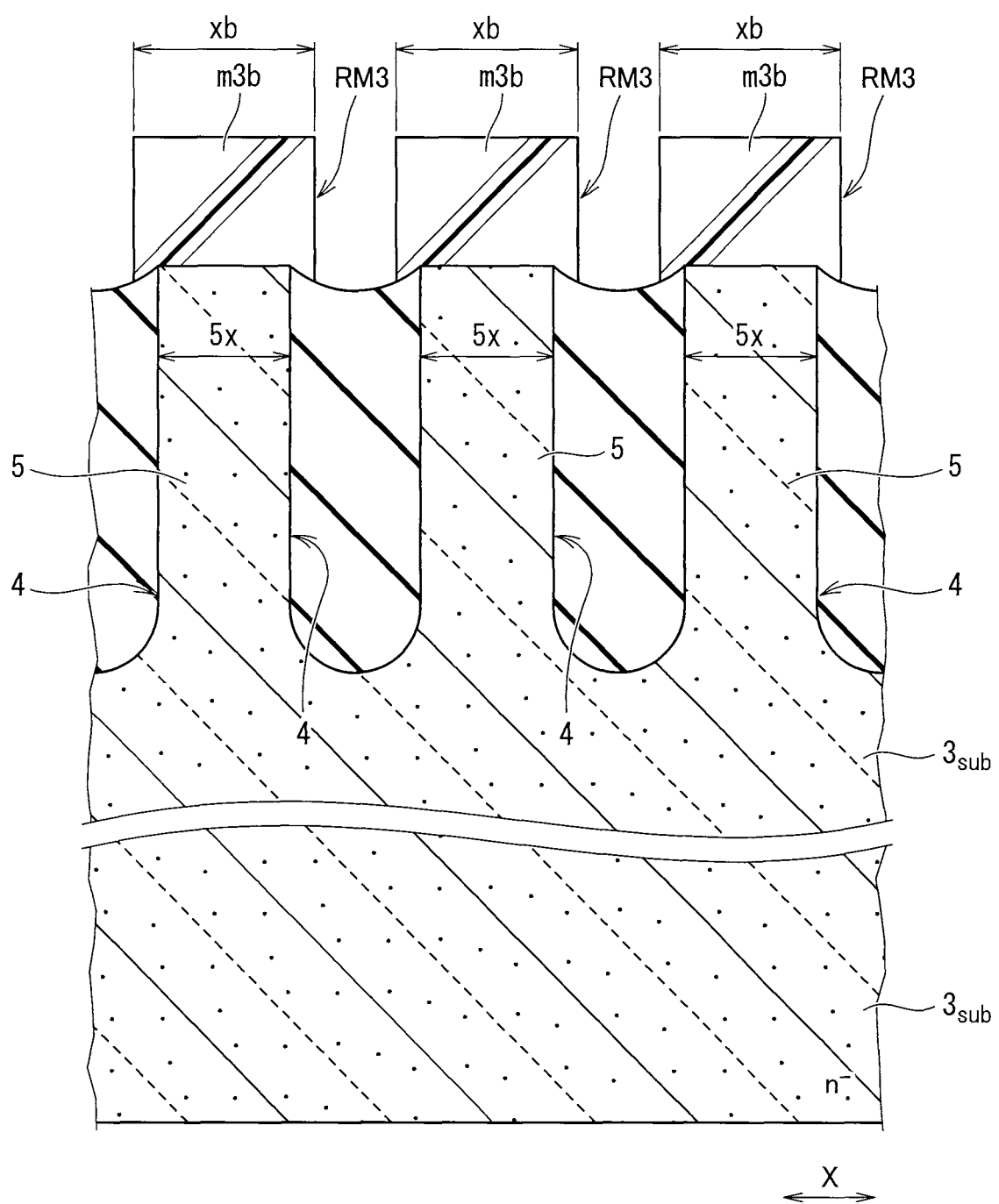
FIG. 39 is a cross-sectional view illustrating a main portion of a cross-sectional structure taken along the line VIIb-VIIb of FIG. 37.

(d1) Then, as illustrated in FIGS. 37 to 39, a third mask RM3 as an etching mask is deposited on the mesa region 5 by a photolithography technique. Here, FIG. 37 is a plan view illustrating a main portion of the plane pattern of the etching mask. FIG. 38 is a cross-sectional view illustrating a main portion of a cross-sectional structure taken along the line VIIa-VIIa of FIG. 37. FIG. 39 is a cross-sectional view illustrating a main portion of a cross-sectional structure taken along the line VIIb-VIIb of FIG. 37.

The third mask RM3 is buried in a stripe-shaped parallel plane pattern in which a first portion m3a illustrated in FIGS. 37 and 38 and a second portion m3b illustrated in FIGS. 37 and 39 are alternately and repeatedly arranged in the Y direction.

The width xa of the first portion m3a in the X direction is substantially equal to the width 5x of the mesa region 5 in the X direction and the width xb of the second portion m3b in the X direction is greater than the width 5x of the mesa region 5 in the X direction.

As illustrated in FIG. 38, the side surfaces of the first portion m3a which are opposite to each other in the X direction are flush with the side surfaces of the mesa region 5 which are opposite to each other in the X direction. As illustrated in FIG. 39, the side surfaces of the second portion m3b which are opposite to each other in the X direction are located outside the side surfaces of the mesa region 5 which are opposite to each other in the X direction.

A dimensional difference between the position of the side surface of the second portion m3b and the position of the side surface of the mesa region 5 corresponds to the thickness of the second portion 36b of the gate insulating film 36. The width xa of the first portion m3a is, for example, about 0.5 micro meters and the width xb of the second portion m3b is, for example, about 0.7 micro meters.

Similarly to the first mask RM1 or the second mask RM2 according to the first embodiment, the third mask RM3 is provided by processing a photosensitive resist film that is deposed on the entire main surface of the semiconductor substrate $3_{SUB}$ into a certain pattern.

Figure 40:
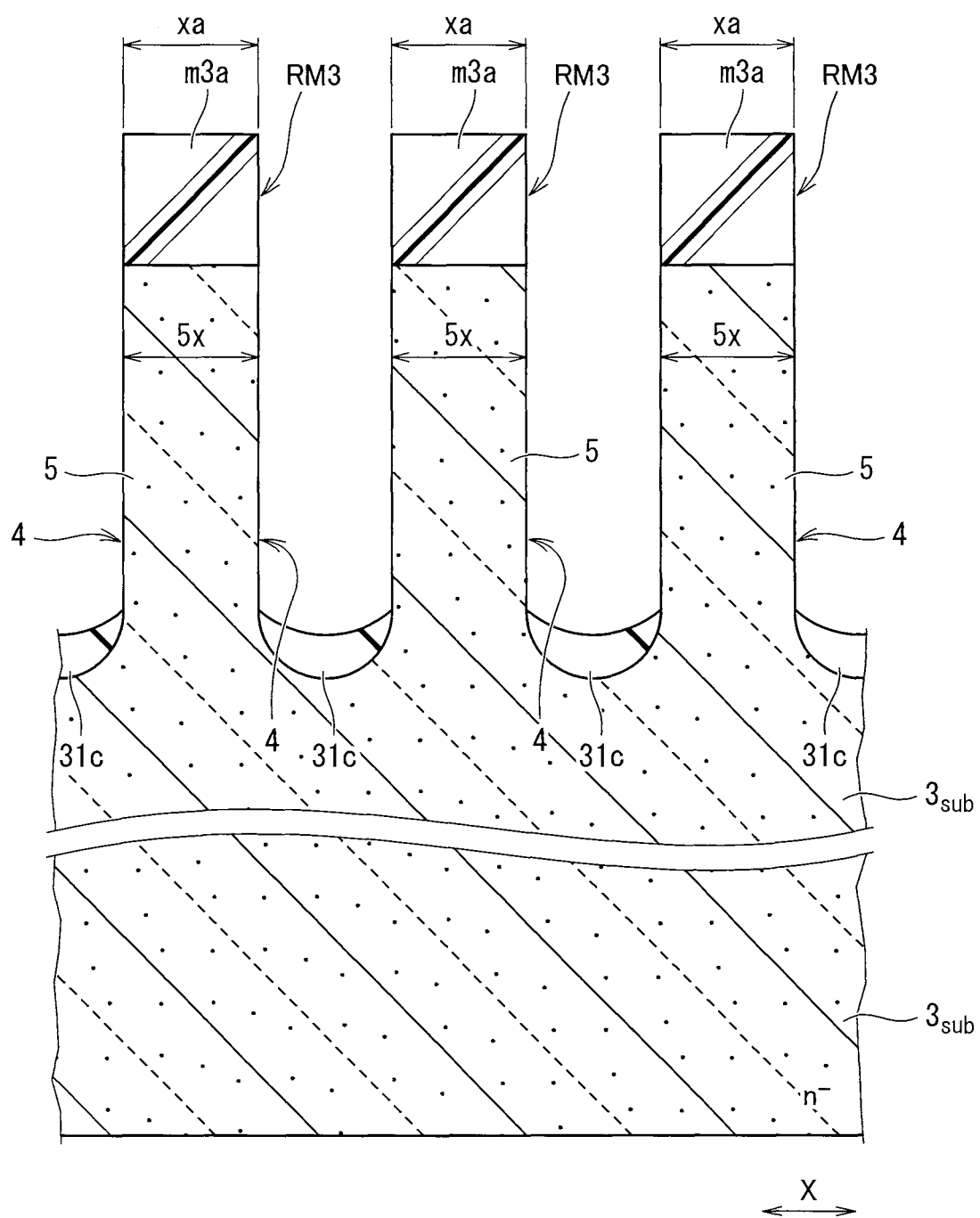
FIG. 40 is a diagram illustrating the method for manufacturing the semiconductor device according to the third embodiment of the present invention and a cross-sectional view illustrating the main portion at the position corresponding to the line VIa-VIa of FIG. 32.
Figure 41:
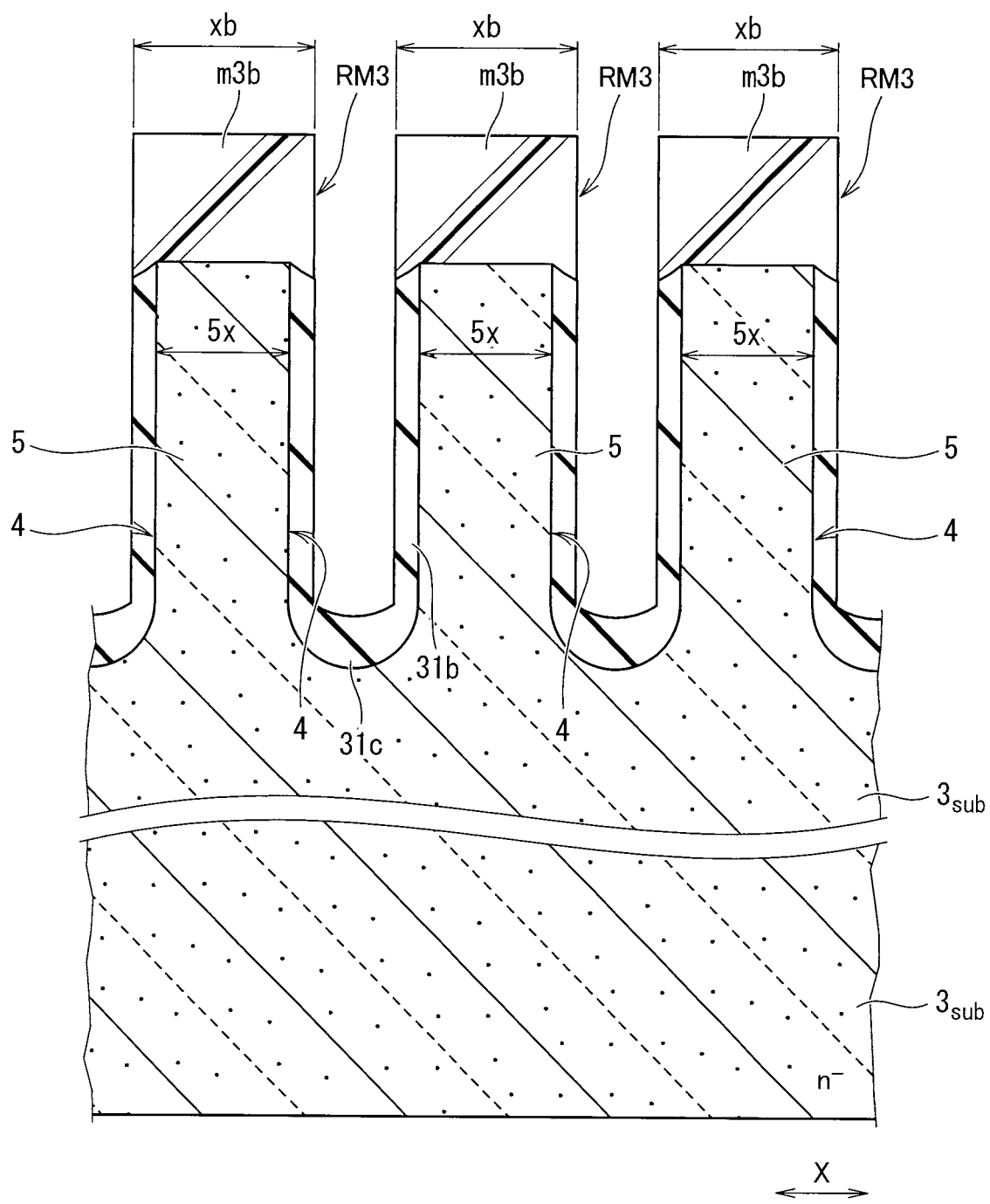
FIG. 41 is a diagram illustrating the method for manufacturing the semiconductor device according to the third embodiment of the present invention and a cross-sectional view illustrating the main portion at the position corresponding to the line VIa-VIa of FIG. 32.

(e1) Then, the deposited film 31 buried in the trench 4 is sequentially etched from the surface by dry etching with high directivity, such as RIE or ion milling, using the third mask RM3 as the etching mask. As illustrated in FIGS. 40 and 41, a deposited film 31c that remains with a thickness of, for example, about 200 nanometers is disposed at the bottom of the trench 4 between the third masks RM3 by the etching.

As illustrated in FIG. 41, a deposited film 31b that remains with a thickness of, for example, about 150 nanometers is disposed on the sidewall of the mesa region 5 immediately below the second portion m3b of the third mask RM3. The deposited film 31c is buried in a stripe shape along the longer direction—Y direction—of the trench 4 and the mesa region 5. The deposited film 31b extends from the upper side to the lower side of the mesa region 5 and is integrally connected to the deposited film 31c. As illustrated in FIG. 40, the deposited film 31b is not deposited on the sidewall of the mesa region 5 immediately below the first portion m3a of the third mask RM3.

That is, the deposited film 31c is deposited on the sidewall of the mesa region 5 in a pattern in which the sidewall of the mesa region 5 is periodically exposed along the longer direction—Y direction—of the mesa region 5.

Figure 42:
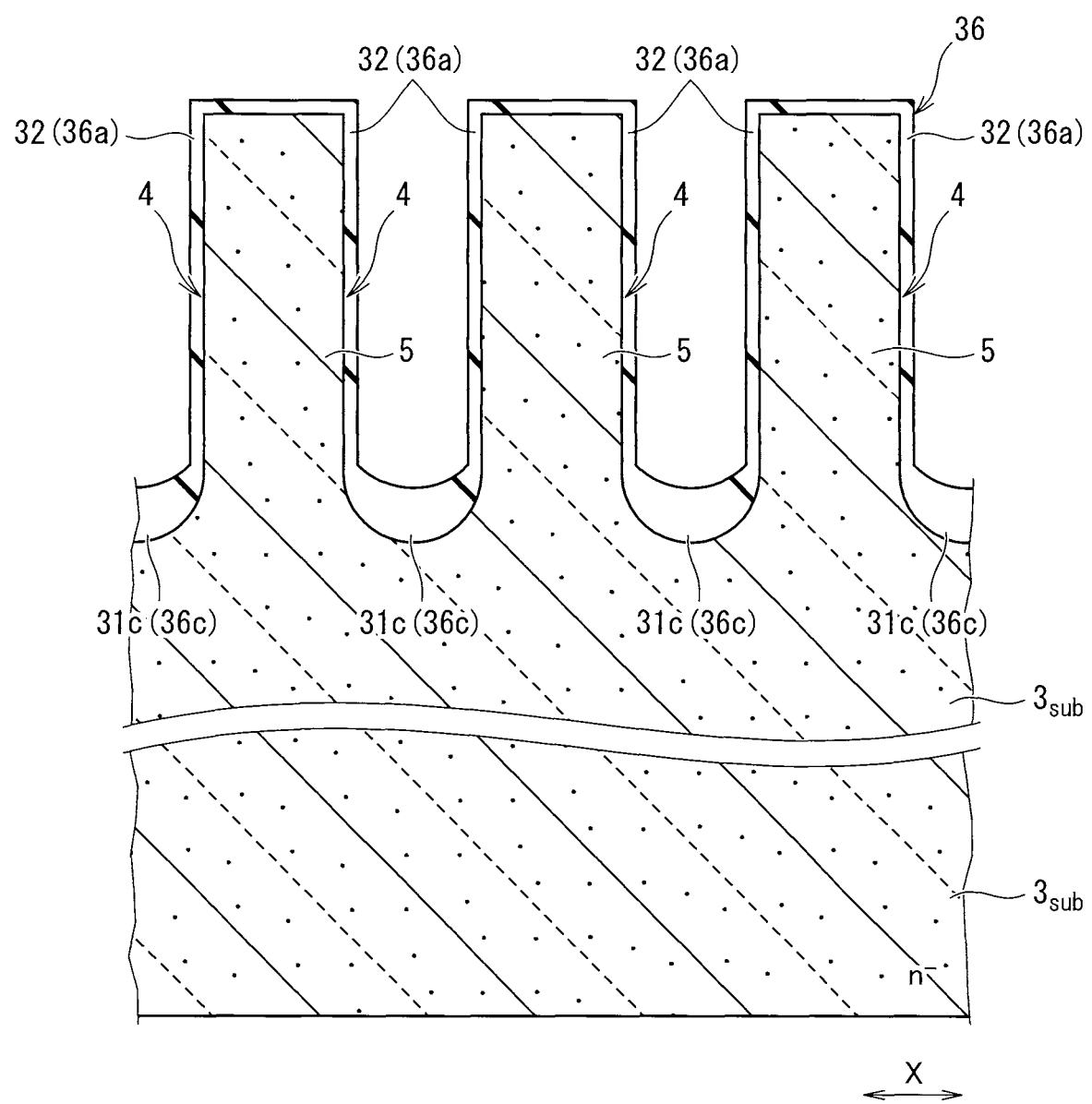
FIG. 42 is a diagram illustrating the method for manufacturing the semiconductor device according to the third embodiment of the present invention and a cross-sectional view illustrating the main portion at the position corresponding to the line VIa-VIa of FIG. 32.

(f1) Then, after the third mask RM3 is removed, a thermal oxidation process is performed to depose a thermally oxidized film 32 which is a $SiO_2$ film with a thickness of, for example, about 100 nanometers in a portion of the sidewall of the mesa region 5 which is not covered with the deposited film 31b and the deposited film 31c, as illustrated in FIG. 42.

Figure 43:
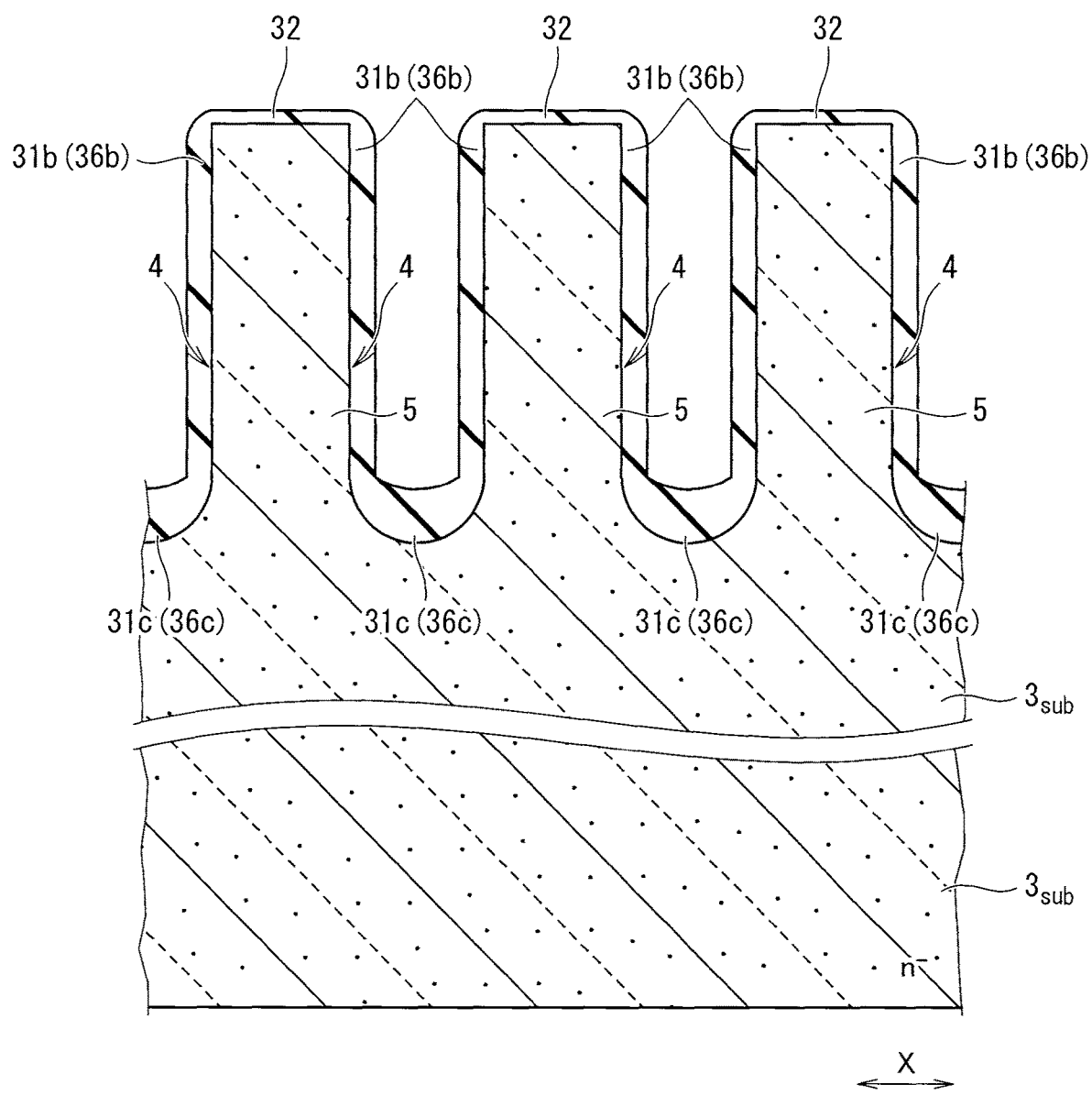
FIG. 43 is a diagram illustrating the method for manufacturing the semiconductor device according to the third embodiment of the present invention and a cross-sectional view illustrating the main portion at the position corresponding to the line VIa-VIa of FIG. 32.

That is, the thermally oxidized film 32 that is thinner than the deposited film 31b and the deposited film 31c is buried in an exposed portion of the sidewall of the mesa region 5 between the deposited films 31b which are adjacent to each other in the longer direction—Y direction—of the mesa region 5. In the deposing, as illustrated in FIGS. 42 and 43, the thermally oxidized film 32 is also deposited on the surface of an upper part of the mesa region 5.

In the deposing, the gate insulating film 36 including the first portion 36a which is the thermally oxidized film 32, the second portion 36b which is the deposited film 31b, and the third portion 36c which is the deposited film 31c is provided.

Figure 44:
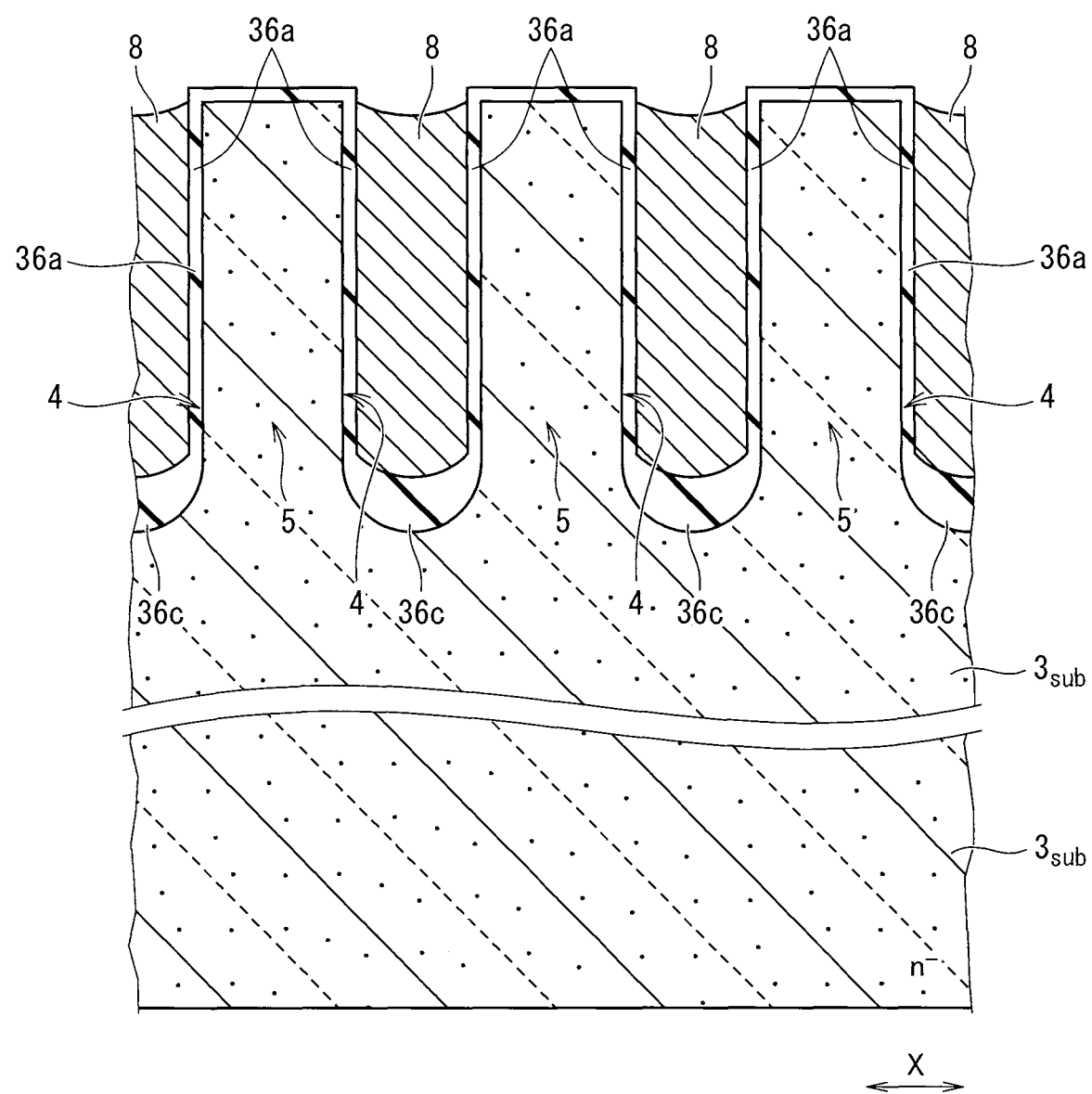
FIG. 44 is a diagram illustrating the method for manufacturing the semiconductor device according to the third embodiment of the present invention and a cross-sectional view illustrating the main portion at the position corresponding to the line VIa-VIa of FIG. 32.

Then, referring to FIG. 9, the gate material 7 is disposed on the main surface of the semiconductor substrate $3_{SUB}$ so as to fill the trench 4, similarly to the first embodiment. Then, the gate material 7 is etched back by dry etching, such as RIE, to provide the gate electrode 8 in the trench 4, as illustrated in FIG. 44.

In the disposing, the thermally oxidized film 32 is deposed on the surface of the upper part of the mesa region 5. Similarly to the first embodiment, the gate material 7 is etched back at an etching rate having selectivity with respect to the thermally oxidized film 32. Therefore, the thermally oxidized film on the mesa region 5 functions as an etching stopper and can prevent the surface of the upper part of the mesa region 5 from being etched.

Then, the same steps as that in the first embodiment are performed to provide, for example, the p-type base region 9, the $n^+$ emitter region 11, the $p^+$ contact region 12, the interlayer insulating film 15, the contact hole 16, the barrier-metal film 17, and the contact plug 19.

In addition, the same steps as that in the first embodiment are performed to provide, for example, the emitter electrode 20, the n-type buffer layer 21, the $p^+$ collector region 22, the protective film 23, and the collector electrode 24.

Then, the lifetime control step in S14 and the hydrogen anneal step in S15 are performed. Therefore, a wafer process for the semiconductor device 3C according to the third embodiment of the present invention is substantially completed.

As described above, according to the method for manufacturing the semiconductor device according to the third embodiment of the present invention, deposing the gate insulating film 36 with a non-uniform thickness is possible.

In the semiconductor device 1C according to the third embodiment, the first portion 36a of the gate insulating film 36 is provided so as to extend from a portion between the gate electrode 8 and the base region 9 immediately below the emitter region 11 to a portion between the gate electrode 8 and the base region 9 immediately below the contact region 12. As illustrated in FIGS. 32 and 33, a part of the first portion 36a of the gate insulating film 36 protrudes to the base region 9 immediately below the contact region 12 and is connected to the second portion 36b. However, the present invention is not limited to the above-mentioned structure.

Figure 45:
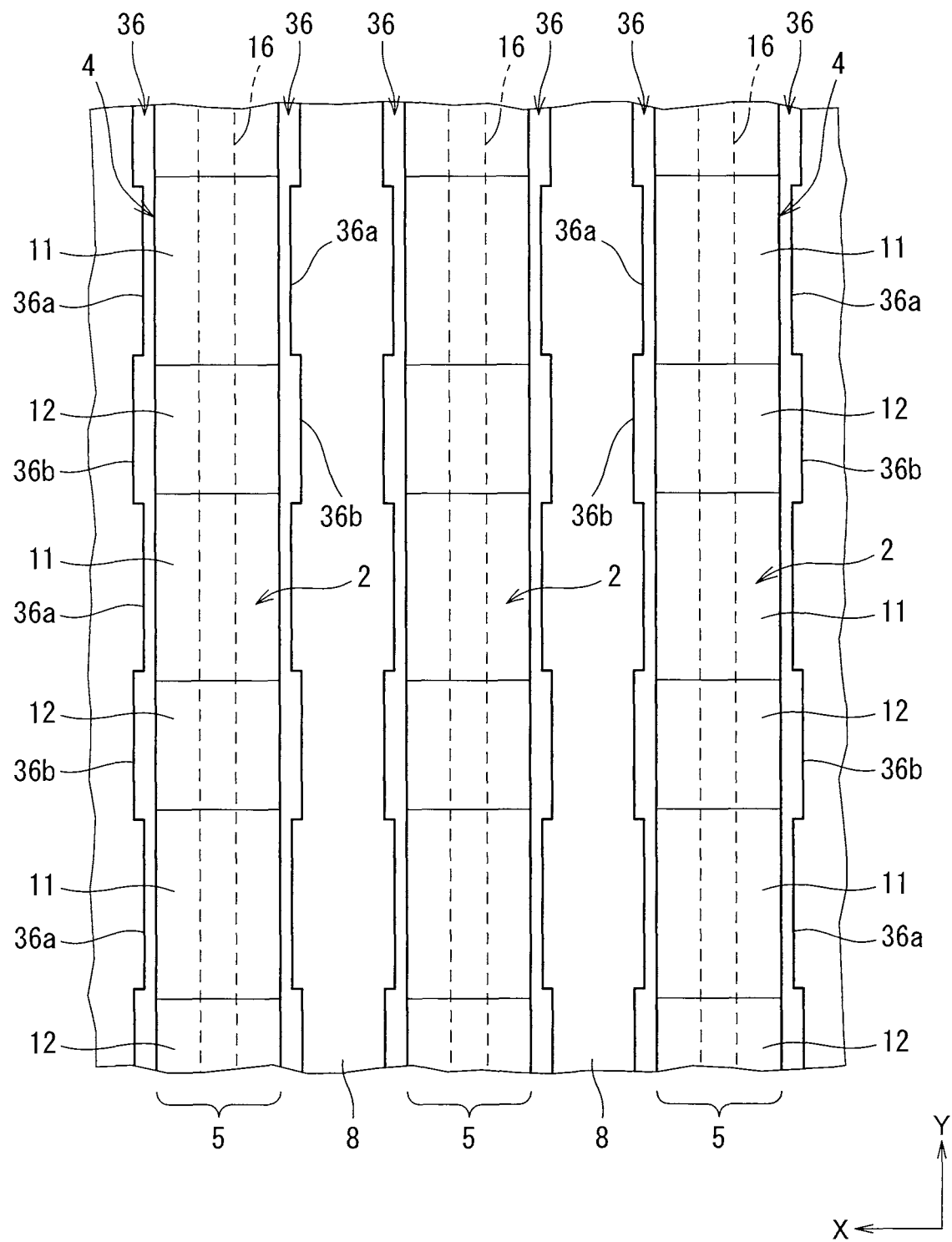
FIG. 45 is a plan view illustrating a main portion of a modification example of the semiconductor device according to the third embodiment of the present invention.

As illustrated in FIG. 45, the gate insulating film 36 may be provided such that the second portion 36b extends from a portion between the gate electrode 8 and the base region 9 immediately below the contact region 12 to a portion between the gate electrode 8 and the base region 9 immediately below the emitter region 11. A part of the gate insulating film 36 may protrude to the base region 9 immediately below the emitter region 11 and may be connected to the first portion 36a.

In the case that a part of the gate insulating film 36 may protrude to the base region 9 immediately below the emitter region 11 and may be connected to the first portion 36a, in the third mask RM3 illustrated in FIG. 37, the width of the second portion m3b in the Y direction is increased and the width of the first portion 3ma in the Y direction is reduced. Therefore, increasing the width of the second portion 36b of the gate insulating film 36 in the Y direction easily is possible. In addition, reducing the width of the first portion 36a in the Y direction is possible.

Fourth Embodiment

Figure 46:
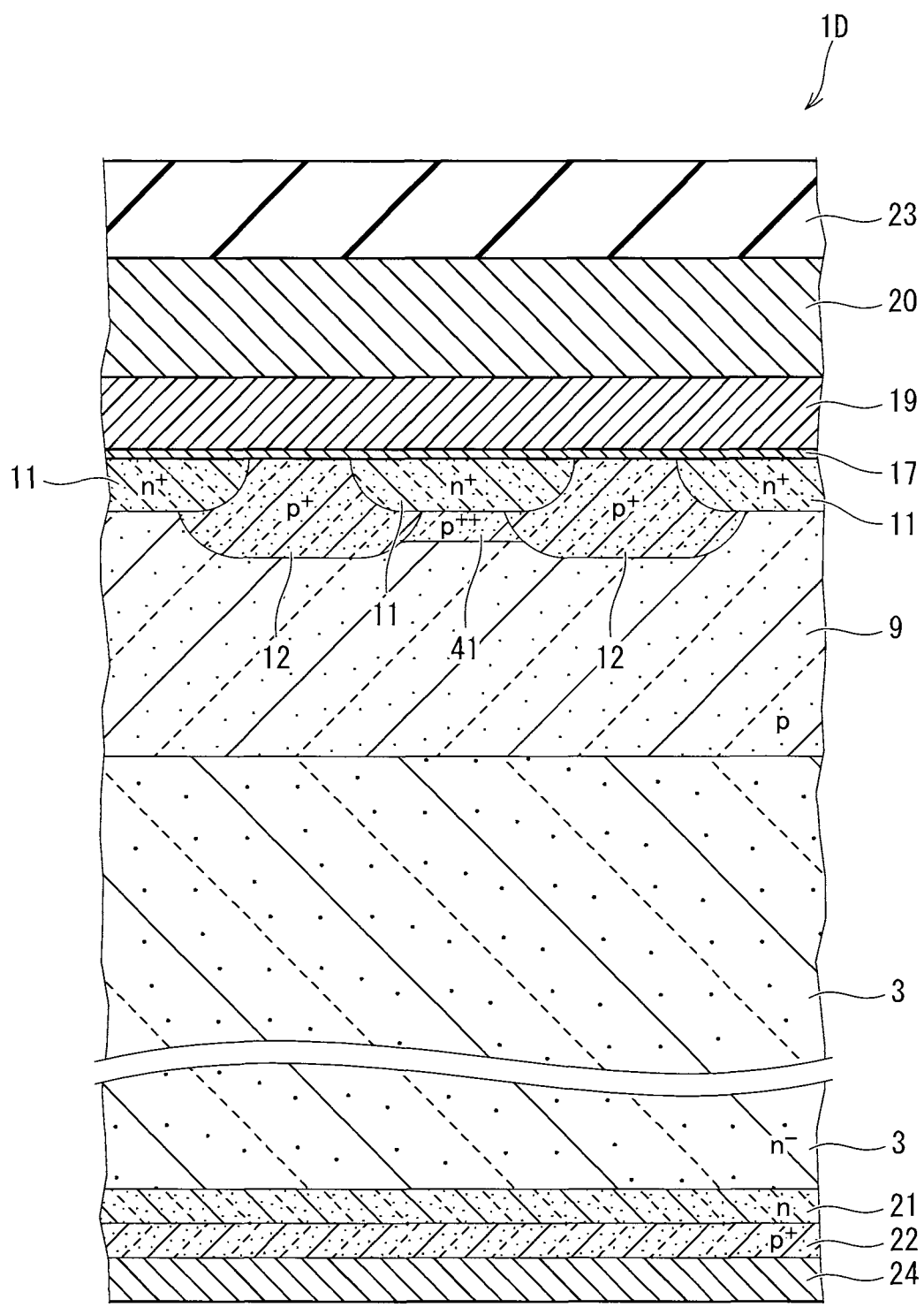
FIG. 46 is a cross-sectional view illustrating a main portion of a semiconductor device according to a fourth embodiment of the present invention.

A semiconductor device 1D according to a fourth embodiment is characterized in that it includes a resistance reducing layer 41 which is provided immediately below an emitter region as illustrated in FIG. 46 and a gate insulating film 46 in which a portion corresponding to a region that comes into contact with the resistance reducing layer 41 is thinner than the other portion.

In the semiconductor device 1D according to the fourth embodiment, the resistance reducing layer 41 is buried in the upper part of the base region 9 with a higher concentration ($p^{++}$) than the base region 9 so as to extend between adjacent contact regions 12. FIG. 46 is a cross-sectional view illustrating a main portion at a position corresponding to the line IIc-IIc of FIG. 1.

Figure 47:
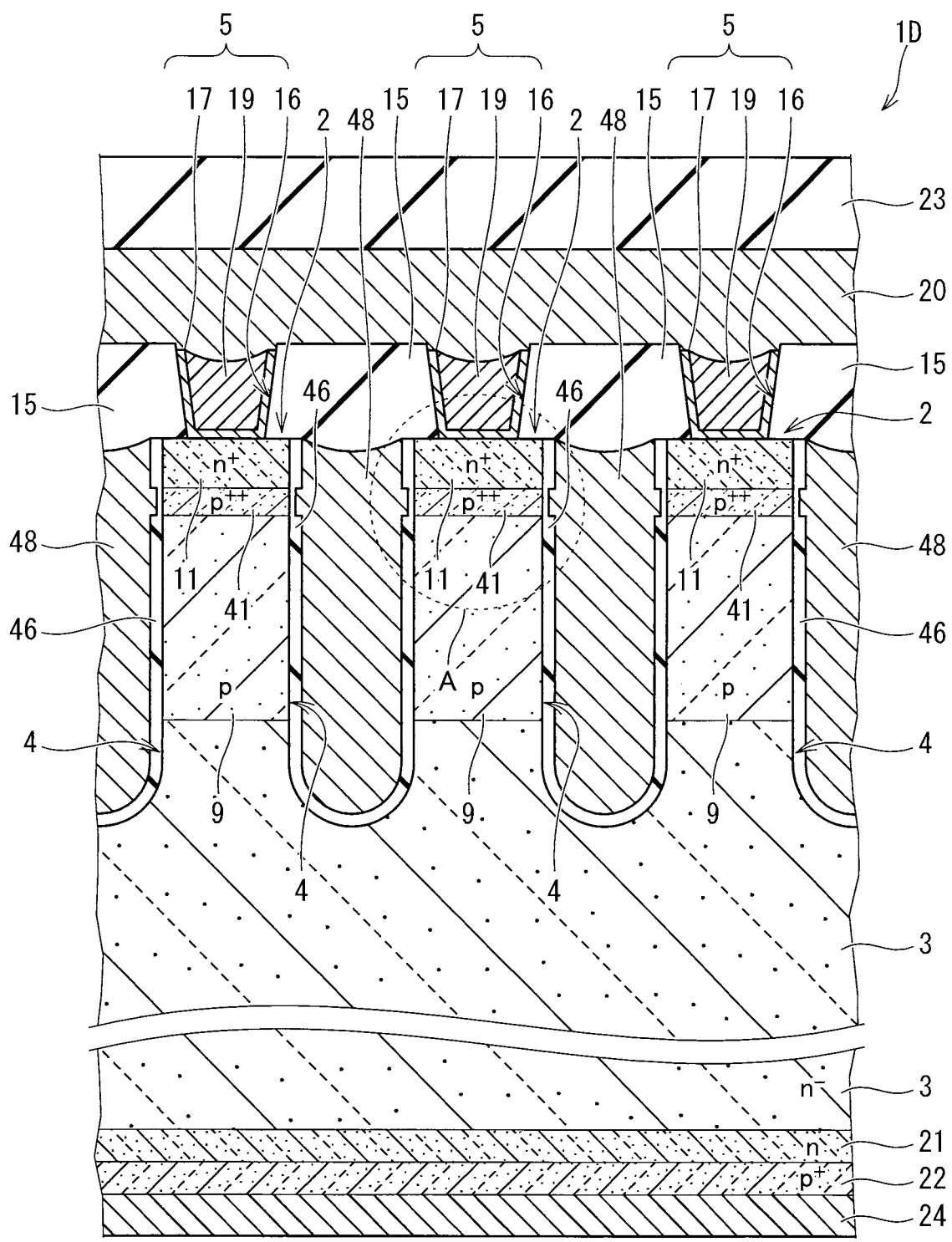
FIG. 47 is a cross-sectional view illustrating a main portion of the semiconductor device according to the fourth embodiment of the present invention.

FIG. 47 is a cross-sectional view illustrating a main portion at a position corresponding to the line IIa-IIa of FIG. 1. As illustrated in FIG. 47, in the semiconductor device according to the fourth embodiment, that the thickness of a portion of the gate insulating film 46 which is positioned at the same height as the resistance reducing layer 41 be less than the thickness of the other portion of the gate insulating film 46 is preferable.

Specifically, the thickness of a region of the gate insulating film 46 which is positioned at the same height as the resistance reducing layer 41 is less than the thickness of a region of the gate insulating film 46 which comes into contact with the emitter region 11 on the resistance reducing layer 41, the base region 9 underneath the resistance reducing layer 41, and the drift layer 3 underneath the base region 9.

Figure 48:
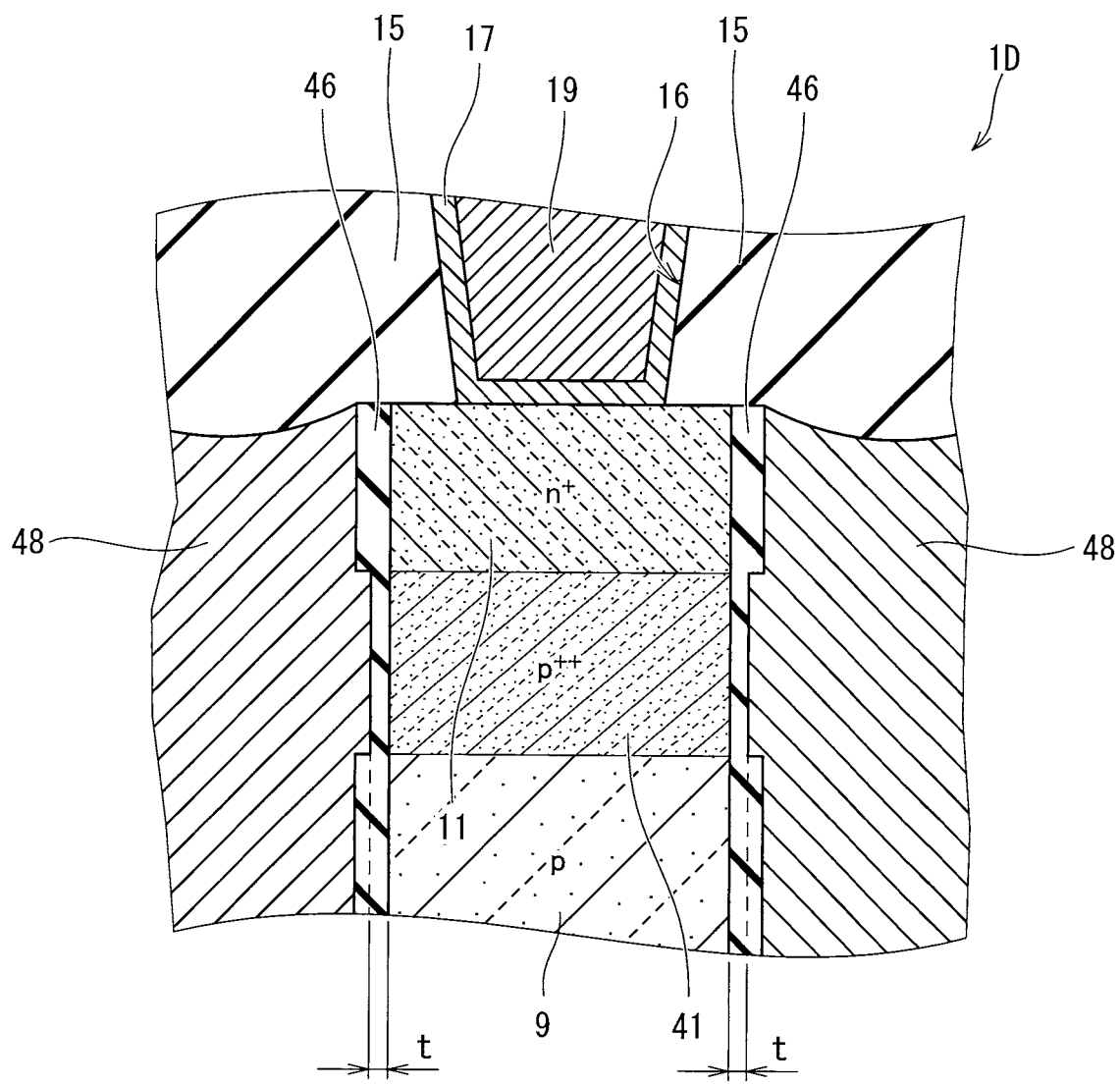
FIG. 48 is an enlarged view illustrating a portion A in FIG. 47.

A concave portion that is recessed to the resistance reducing layer 41 buried in an interface with a gate electrode 48 to reduce the thickness of a region of the gate insulating film 46 which is positioned at the same height as the resistance reducing layer 41, as illustrated in FIG. 48. The thickness t of the thinned region is set such that the potential of the surface of the resistance reducing layer 41 on the sidewall side of the trench 4 varies when a gate voltage is applied and a desired inversion layer is deposed.

In the semiconductor device 1D according to the fourth embodiment, the structures other than the resistance reducing layer 41 and the gate insulating film 46 are equivalent to the members, the layers, or the regions denoted by the same or similar reference numerals in the semiconductor devices according to the first to third embodiments and thus the description of the fourth embodiment will not be repeated.

In the semiconductor device 1D according to the fourth embodiment, since the high-concentration-state resistance reducing layer 41 is provided below the emitter region 11, the resistance of a region below the emitter region 11 is reduced and current is difficult to flow through a p-n junction. Therefore, when hole current flows during a turn-off operation, an increase in potential in the region of the resistance reducing layer 41 is prevented and occurring in the semiconductor device 1D according to the fourth embodiment is difficult for latch-up.

The emitter-region contact-width $W_e$ can be increased to increase channel integration density and thus to reduce an on-state voltage.

In the semiconductor device 1D according to the fourth embodiment, the thickness of a portion of the gate insulating film 46 which comes into contact with the resistance reducing layer 41 is small.

When the thickness of the gate insulating film 46 on the sidewall of the trench 4 is uniform, an inversion layer is less likely to be deposed on the surface of the resistance reducing layer 41 below the emitter region 11 and a gate threshold voltage increases. Therefore, the semiconductor device is less likely to be turned on.

Therefore, the thickness of a portion of the gate insulating film 46 which comes into contact with the resistance reducing layer 41 is less than the thickness of an end portion of the gate insulating film 46. Therefore, controlling the surface potential of the resistance reducing layer 41 and preventing an increase in the gate threshold voltage are easy. As such, a combination of the formation of the resistance reducing layer 41 and the control of the thickness of the gate insulating film 46 makes it possible to provide the semiconductor device according to the fourth embodiment in which latch-up is less susceptible to occur and an increase in the gate threshold voltage is prevented.

Here, a method in which a portion of the gate insulating film between the emitter region 11 and the base region 9 is not thin, but a portion of the gate insulating film which is positioned below the emitter region 11, is positioned further below the base region 9, and comes into contact with the upper part of the drift layer 3 is thinner than the other portion, has been known. The thinning method is disclosed in, for example, JP 6-13621 A.

The thinning method has the advantage that, when a reverse bias is applied to the gate electrode, the conductivity type of a portion of the drift layer 3 close to the gate is reversed to obtain a high breakdown voltage. However, when the concentration of the base region 9 is low and resistance increases, a current is likely to flow through the p-n junction and latch-up occurs. As a result, the semiconductor device is likely to be broken.

Here, in the semiconductor device according to the fourth embodiment, a portion of the gate insulating film 46 which comes into contact with the upper part of the drift layer 3 is not thinned, but a portion of the gate insulating film 46 between the emitter region 11 and the base region 9 is thinner than the other portion. Therefore, latch-up is less susceptible to occur. The other effects of the semiconductor device 1D according to the fourth embodiment are the same as those of the semiconductor device according to the first embodiment.

<Method for Manufacturing Semiconductor Device According to Fourth Embodiment>

Next, a method for manufacturing the semiconductor device 1D according to the fourth embodiment will be described with reference to FIGS. 49 to 59. FIGS. 49 to 59 are cross-sectional views illustrating a main portion at a position corresponding to the line IIa-IIa of FIG. 1.

In the method for manufacturing the semiconductor device 1D according to the fourth embodiment, steps other than the steps of forming the resistance reducing layer 41, the gate insulating film 46, and the gate electrode 48 are substantially the same as those in the method for manufacturing the semiconductor device 1A according to the first embodiment. Therefore, the description is focused on the steps of forming the resistance reducing layer 41, the gate insulating film 46, and the gate electrode 48 and the detailed description of the other steps will not be repeated.

Figure 49:
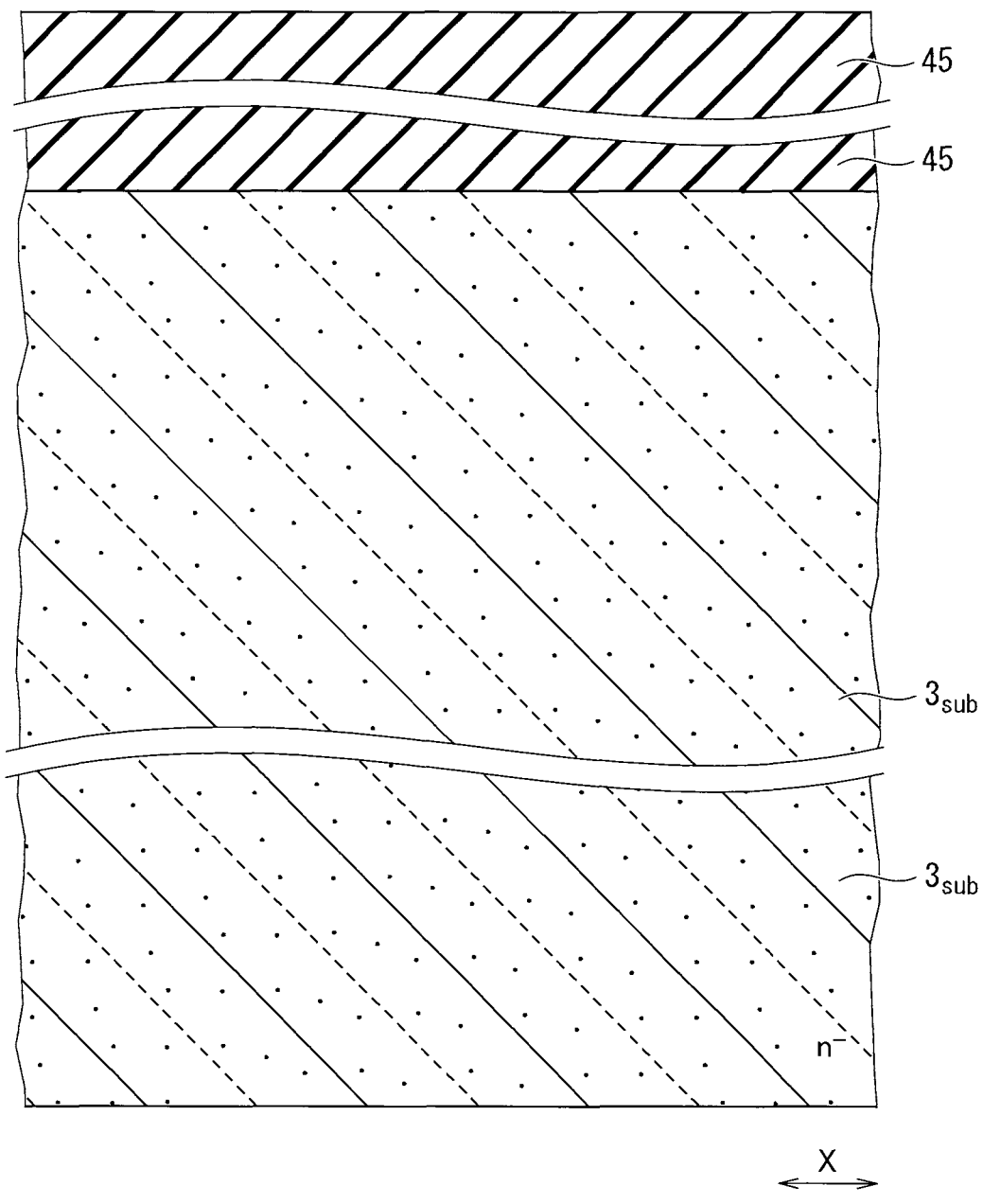
FIG. 49 is a diagram illustrating a method for manufacturing the semiconductor device according to the fourth embodiment of the present invention.

(a2) First, an n⁻ semiconductor substrate $3_{SUB}$ is prepared. Then, as illustrated in FIG. 49, an insulating film 45 is deposed on the upper surface of the semiconductor substrate $3_{SUB}$ by, for example, a thermal oxidation method. The insulating film 45 also functions as an etching stopper that can stand a plurality of insulating film deposing processes which will be described below. The insulating film 45 illustrated in FIG. 49 is deposed so as to be considerably thicker than a gate insulating film which will be described below.

Figure 50:
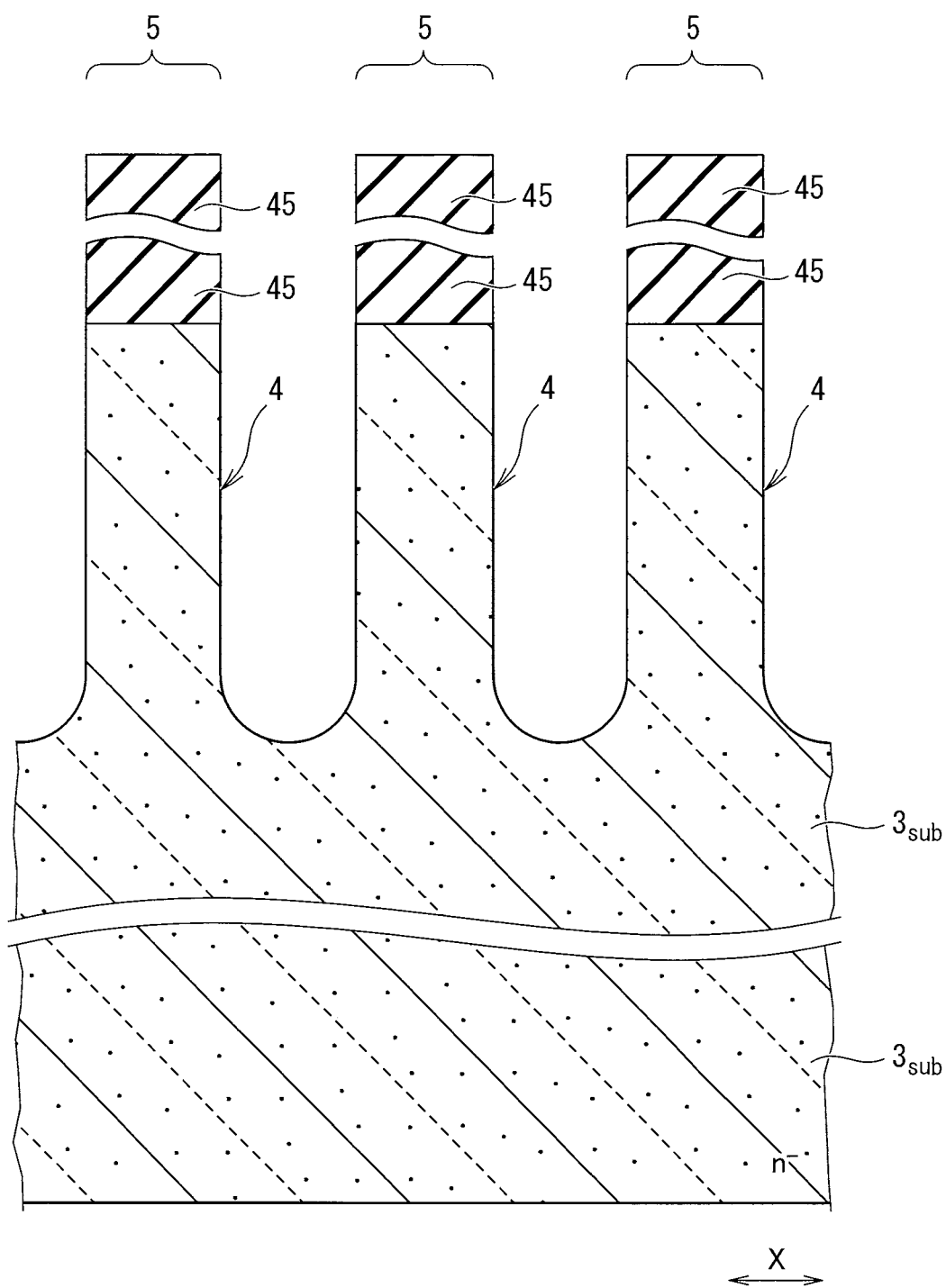
FIG. 50 is a diagram illustrating the method for manufacturing the semiconductor device according to the fourth embodiment of the present invention.

(b2) Then, as illustrated in FIG. 50, the same steps as those in the first embodiment are performed to dig the trench 4 in the main surface of the semiconductor substrate $3_{SUB}$, using the insulating film 45 as an etching mask, and to form the mesa region 5 which is interposed and partitioned between the trenches 4 adjacent to each other in the X direction.

Figure 51:
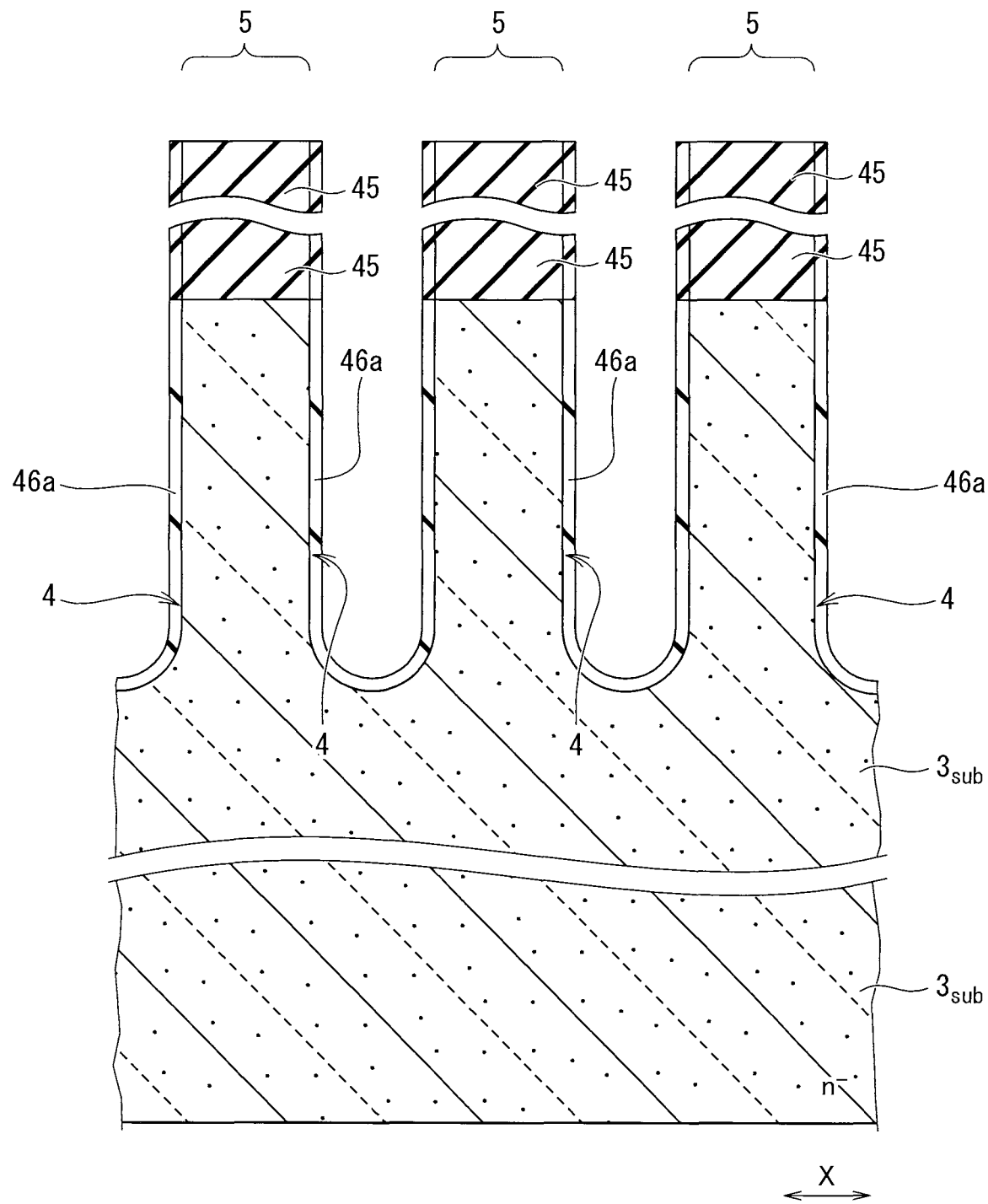
FIG. 51 is a diagram illustrating the method for manufacturing the semiconductor device according to the fourth embodiment of the present invention.

(c2) Then, as illustrated in FIG. 51, a first gate insulating film 46a which is a SiO₂ film is deposed with a constant thickness in the trench 4 by, for example, a thermal oxidation method. The thickness of a sidewall portion of the insulating film 45 on the semiconductor substrate $3_{SUB}$ is increased by thermal oxidation.

In FIG. 51, the thickness of a thermally oxidized film which is newly generated on the sidewall portion of the insulating film 45 is equal to the thickness of the thermally oxidized film generated on the sidewall of the trench 4. However, the expression in FIG. 51 is schematically illustrated. In practice, the thickness of the thermally oxidized film grown on the sidewall portion of the insulating film 45 is less than the thickness of the thermally oxidized film grown on the sidewall of the trench 4.

(d2) Then, a doped-polysilicon film with low resistivity is deposited as a first gate electrode 48a on the first gate insulating film 46a to fill the trench 4.

Figure 52:
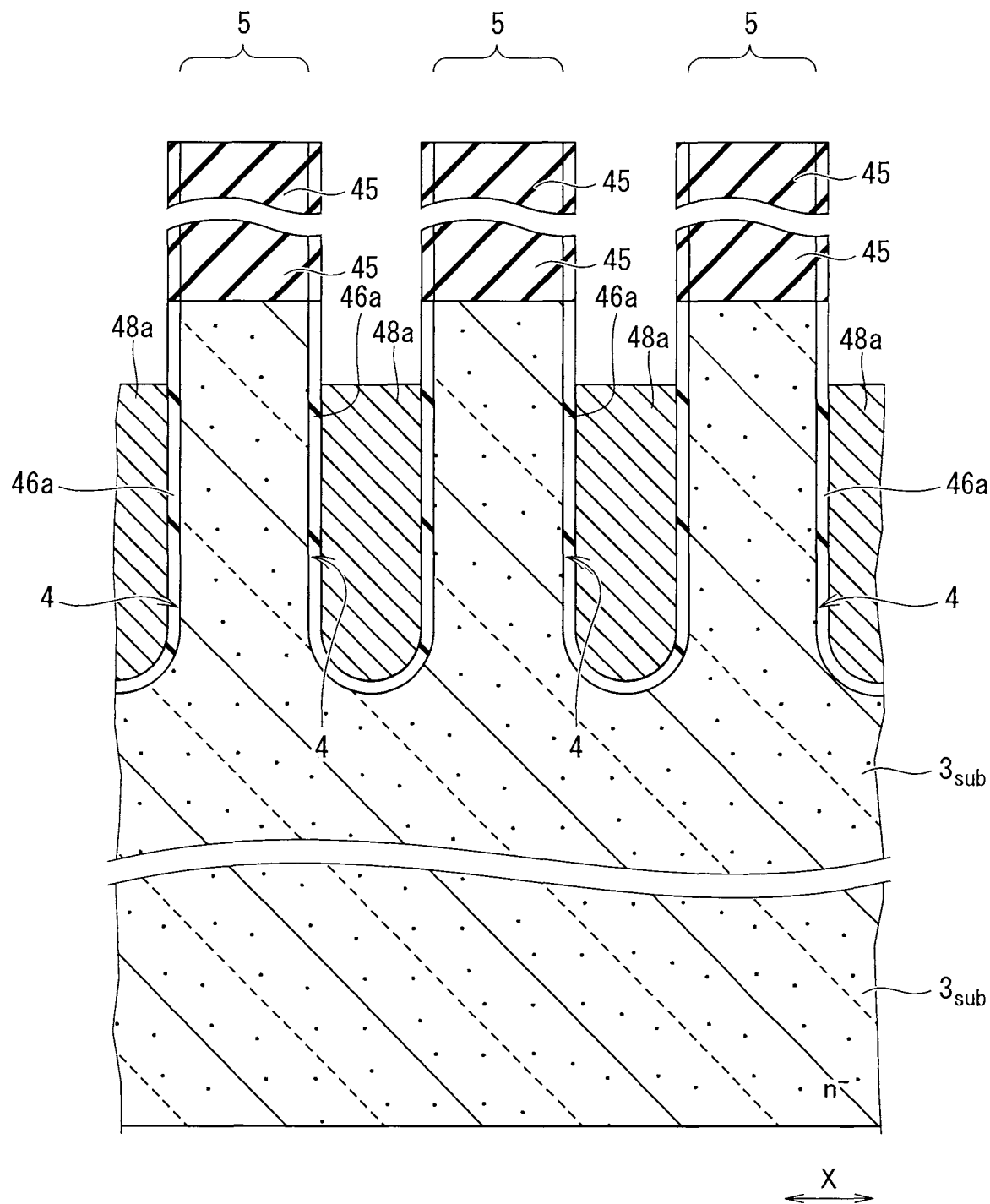
FIG. 52 is a diagram illustrating the method for manufacturing the semiconductor device according to the fourth embodiment of the present invention.

Then, as illustrated in FIG. 52, the doped-polysilicon film is etched back by, for example, RIE and the amount of doped-polysilicon film etched back is adjusted such that the upper surface of the doped-polysilicon film is located at a position corresponding to the lower surface of the resistance reducing layer 41 which is scheduled to be buried in the following step. The doped-polysilicon film which remains after the etching-back becomes the first gate electrode 48a.

Figure 53:
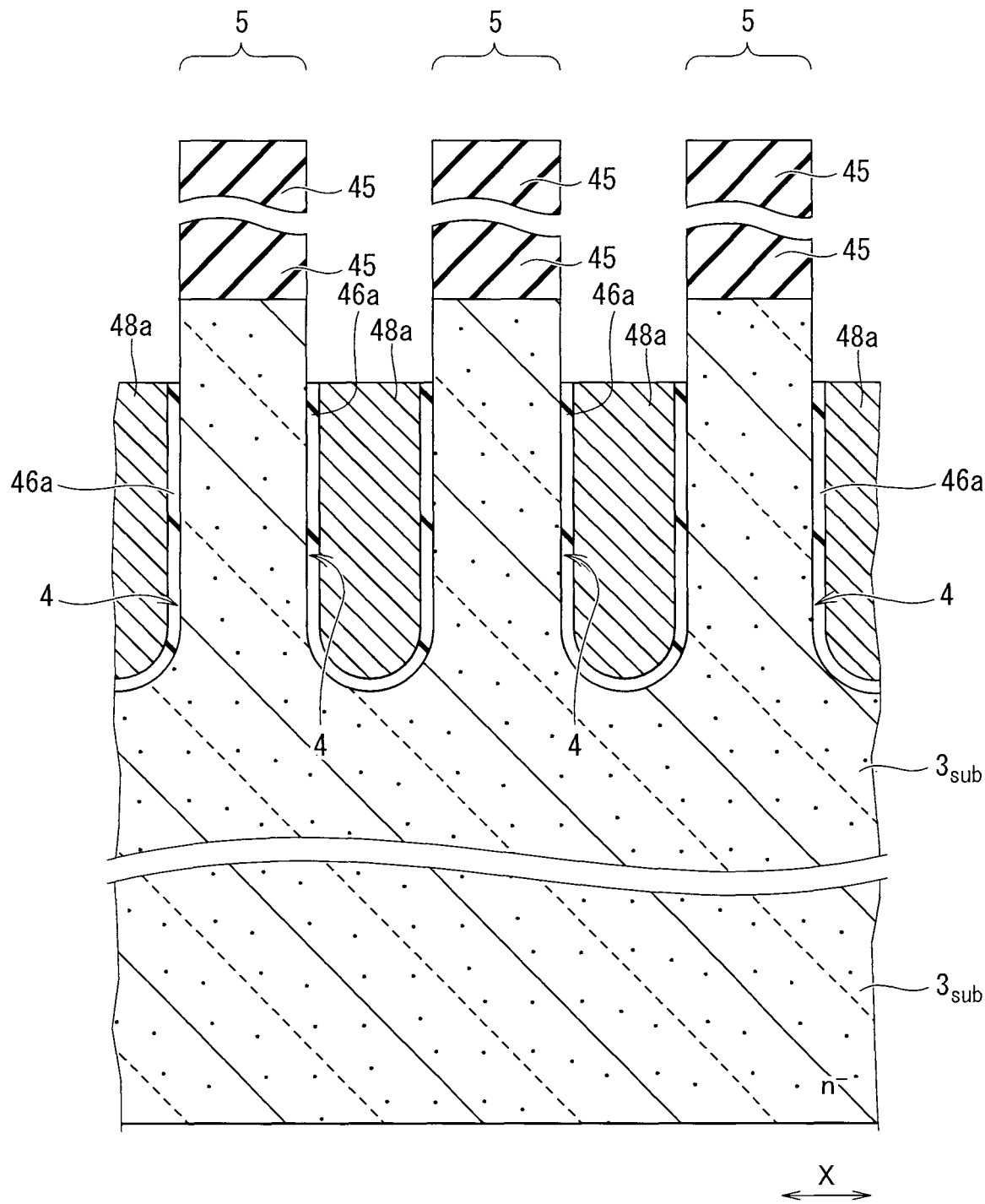
FIG. 53 is a diagram illustrating the method for manufacturing the semiconductor device according to the fourth embodiment of the present invention.

(e2) Then, as illustrated in FIG. 53, a portion of the first gate insulating film 46a which is exposed from the doped-polysilicon film is selectively removed by overall etching using a difference between the etching speeds of the oxide film and the doped-polysilicon film.

Figure 54:
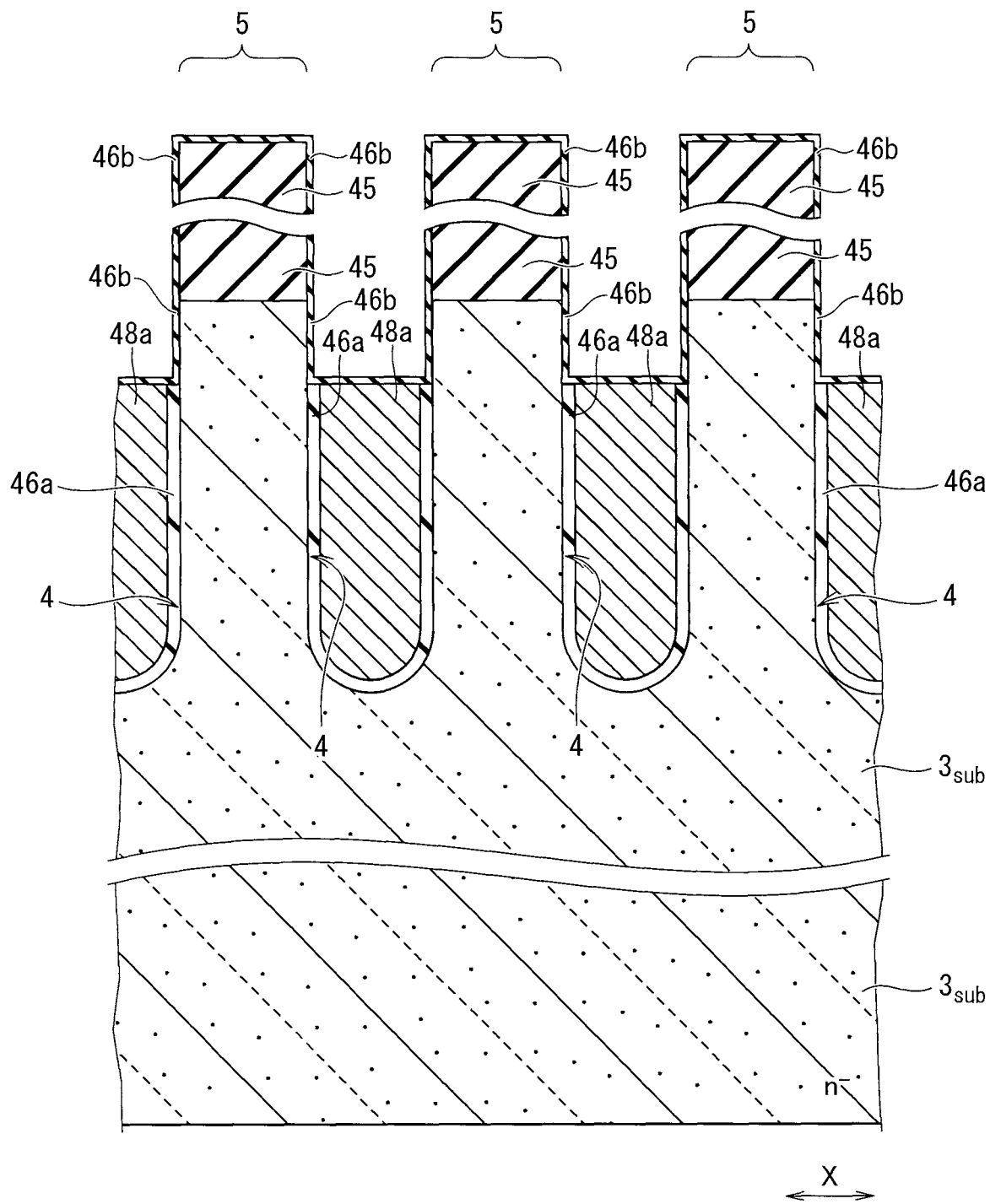
FIG. 54 is a diagram illustrating the method for manufacturing the semiconductor device according to the fourth embodiment of the present invention.

(f2) Then, as illustrated in FIG. 54, for example, a second gate insulating film 46b which is a $SiO_2$ film is deposited with a constant thickness in the trench 4 by a thermal oxidation method. The second gate insulating film 46b is deposited on the upper surface and side surface of the insulating film 45, the inner wall surface of the upper part of the trench 4, the upper end surface of the first gate insulating film 46a, and the upper surface of the first gate electrode 48a. The second gate insulating film 46b illustrated in FIG. 54 is thinner than the first gate insulating film 46a.

Figure 55:
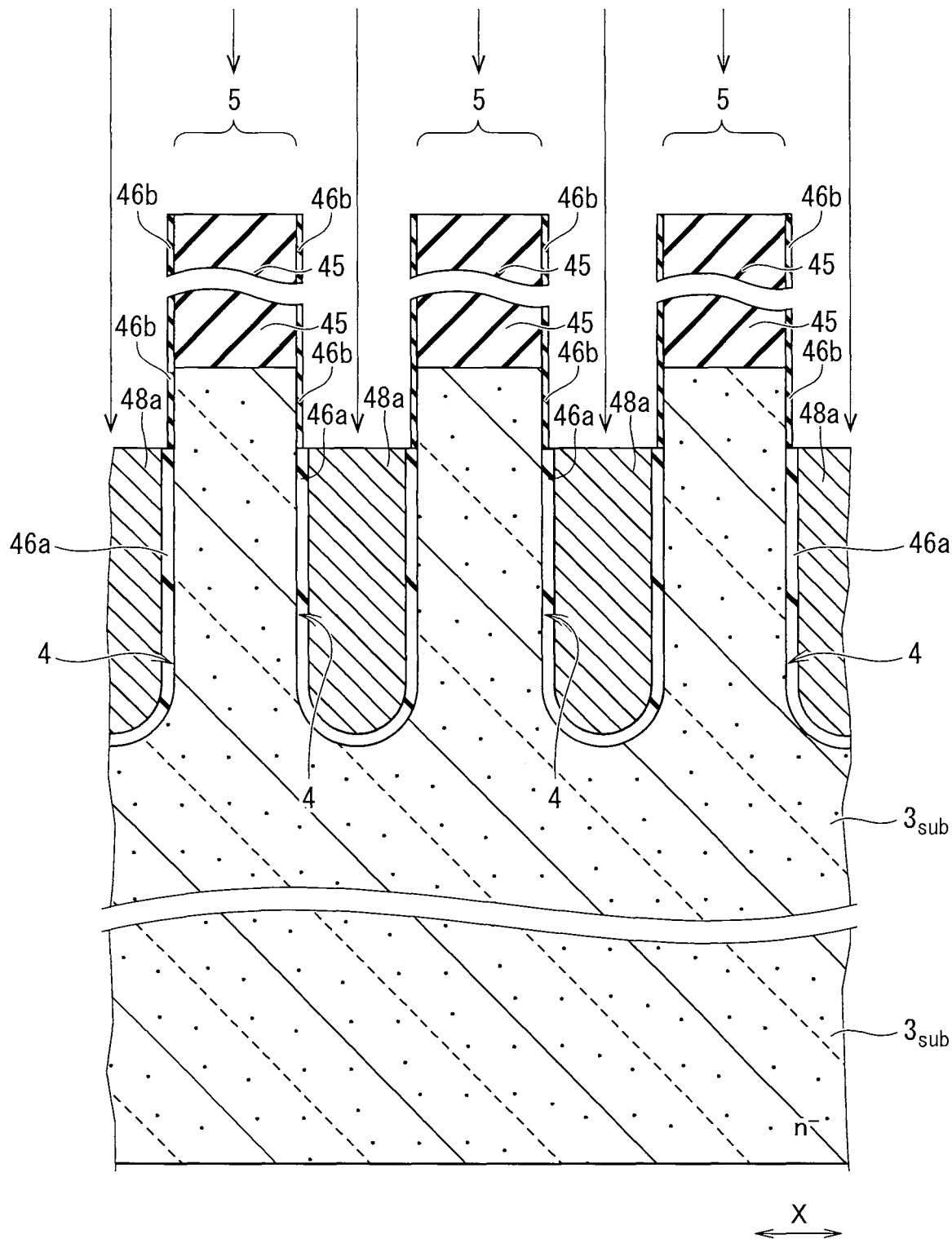
FIG. 55 is a diagram illustrating the method for manufacturing the semiconductor device according to the fourth embodiment of the present invention.

(g2) Then, as illustrated in FIG. 55, in the second gate insulating film 46b deposited in the trench 4, only a portion that is deposited on the upper surface of the first gate electrode 48a is selectively removed. The removal process is performed by dry etching with high directivity, such as RIE.

That is, directivity etching is performed such that the upper surface of the first gate electrode 48a is exposed and the lower end of the second gate insulating film 46b is continuous with the upper end of the first gate insulating film 46a. Since directional etching is performed, the set thickness t of the second gate insulating film 46b can be maintained after etching. The thickness of the second gate insulating film 46b at which an inversion layer is likely to be deposited in the high-concentration-state resistance reducing layer 41 can be maintained.

(h2) Then, a gate material that is scheduled to function as the second gate electrode 48b is deposited on the first gate electrode 48a of which the upper surface is exposed and the first gate insulating film 46a of which the upper surface is exposed by, for example, a CVD method to fill the trench 4. In addition to doped-polysilicon, for example, high-melting-point metal, such as tungsten (W), molybdenum (Mo), or titanium (Ti), can be used as the gate material.

Figure 56:
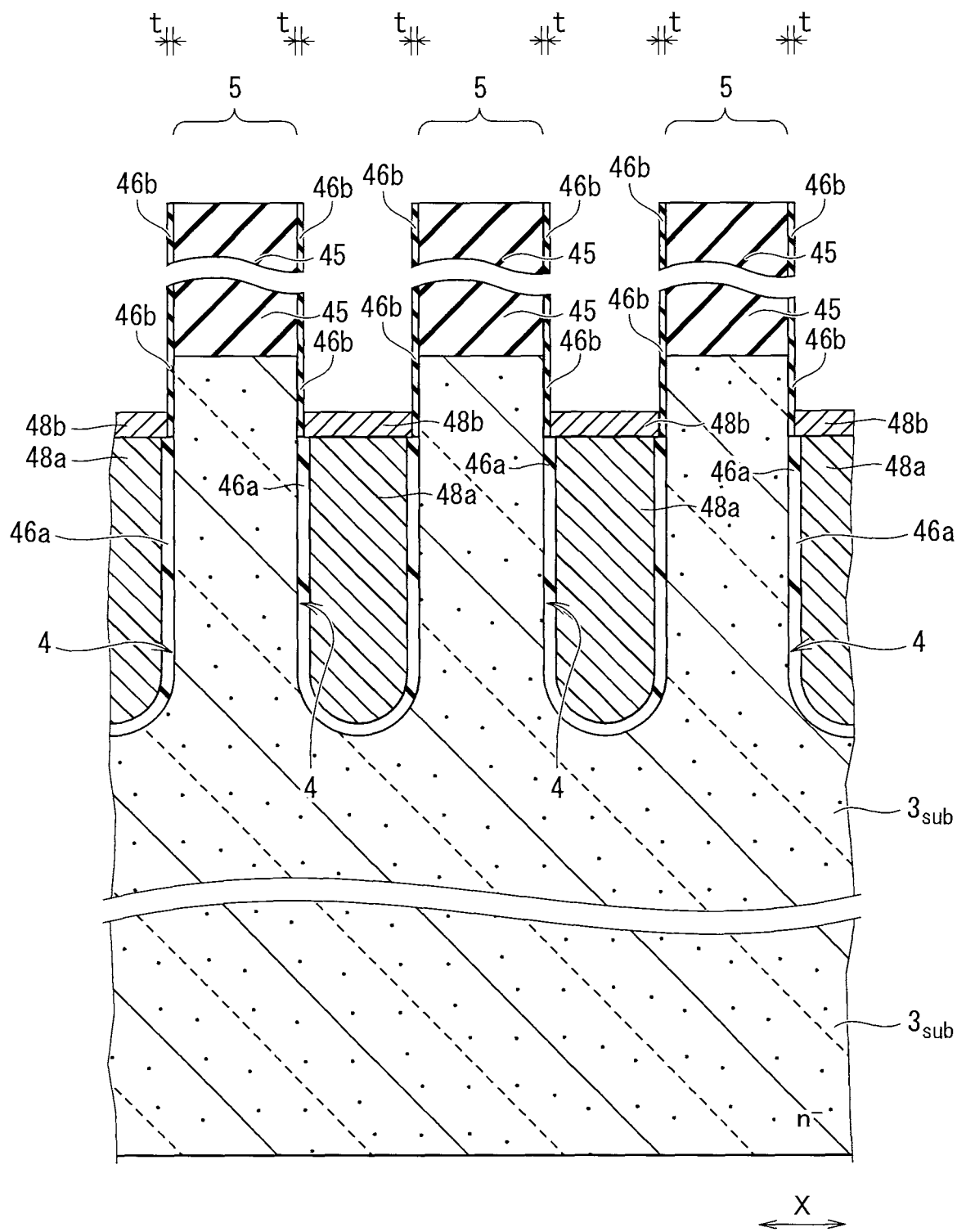
FIG. 56 is a diagram illustrating the method for manufacturing the semiconductor device according to the fourth embodiment of the present invention.

Then, an upper part of the gate material is etched back to provide the second gate electrode 48b. As illustrated in FIG. 56, the thickness of the second gate electrode 48b is controlled to a certain value. That is, the thickness of the second gate electrode 48b is set by the etching-back such that the upper surface of the second gate electrode 48b is aligned with the upper surface of the resistance reducing layer 41 which is scheduled to be deposited in the following step.

Figure 57:
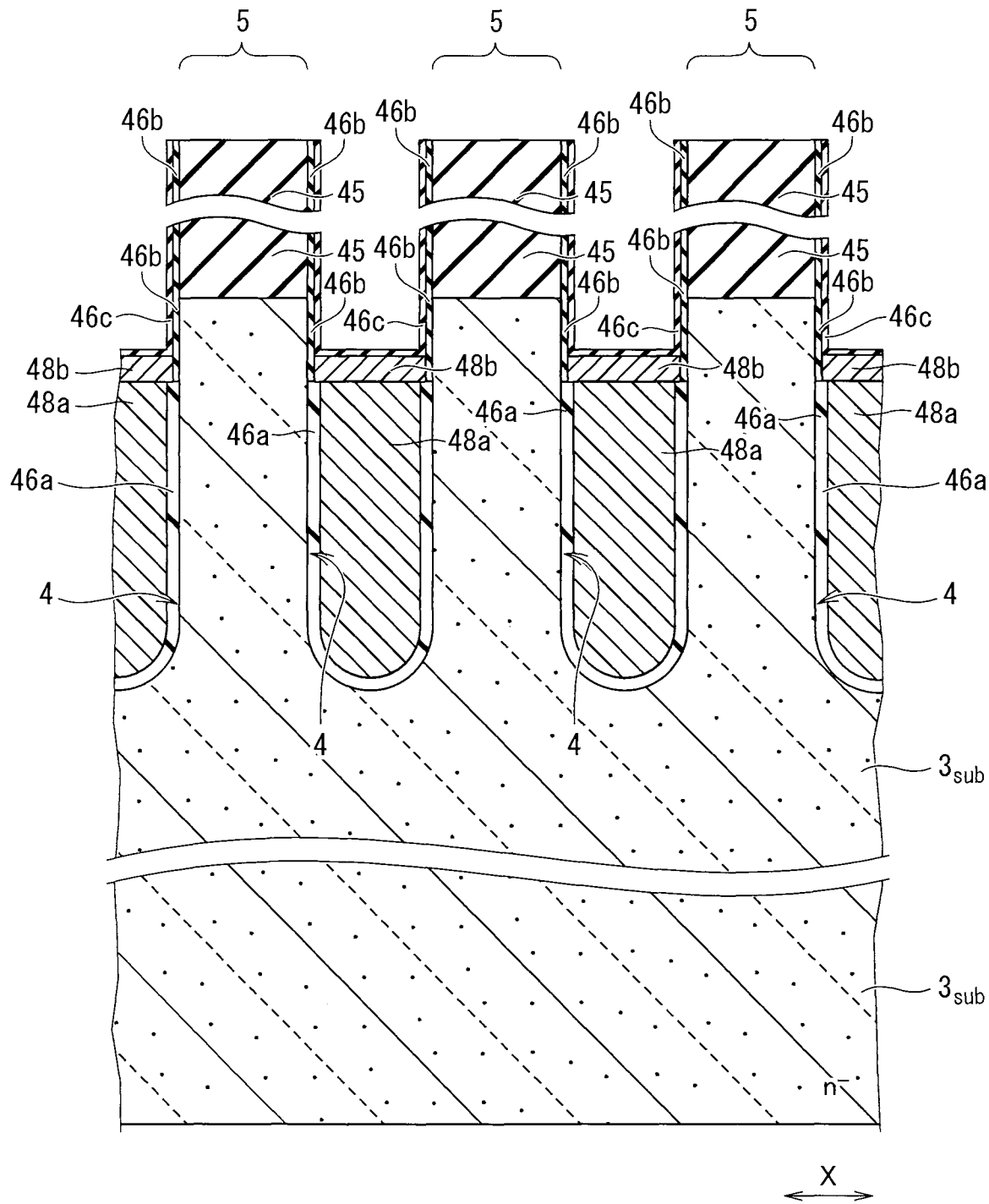
FIG. 57 is a diagram illustrating the method for manufacturing the semiconductor device according to the fourth embodiment of the present invention.

(i2) Then, as illustrated in FIG. 57, a third gate insulating film 46c, which is, for example, a $SiO_2$ film or a silicon nitride film ($Si_3N_4$ film), is deposited with a constant thickness in a portion of the trench 4 which is exposed to the etched-back space by a CVD method. The third gate insulating film 46c is deposed on the surface of the second gate insulating film 46b and the upper surface of the second gate electrode 48b.

As illustrated in FIG. 57, the sum of the thickness of the third gate insulating film 46c and the thickness t of the second gate insulating film 46b may be substantially equal to the thickness of the first gate insulating film 46a or may be greater than the thickness of the first gate insulating film 46a.

Figure 58:
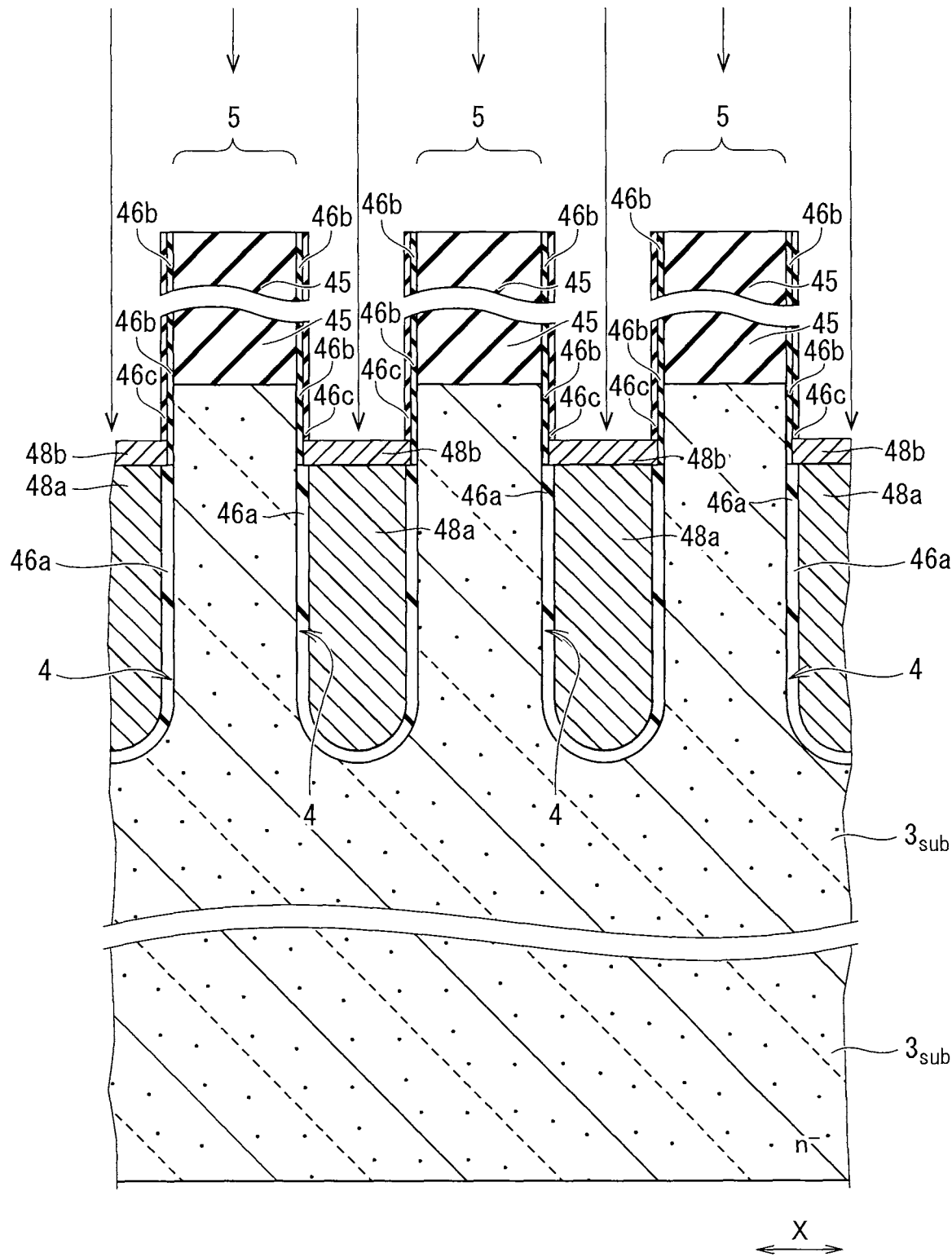
FIG. 58 is a diagram illustrating the method for manufacturing the semiconductor device according to the fourth embodiment of the present invention.

(j2) Then, as illustrated in FIG. 58, in the third gate insulating film 46c deposited in the trench 4, a portion that is deposited on the upper surface of the second gate electrode 48b is selectively removed by dry etching with high directivity, such as RIE, such that the upper surface of the second gate electrode 48b is exposed.

The third gate insulating film 46c that remains after the selective etching, the first gate insulating film 46a, and the second gate insulating film 46b depose the gate insulating film 46 illustrated in FIG. 47.

(k2) Then, a gate material that is scheduled to function as a third gate electrode 48c is deposited on the second gate electrode 48b of which the upper surface is exposed by, for example, a CVD method so as to be continuous with the second gate electrode 48b and a space above the trench 4 is filled by the deposition. For example, doped-polysilicon, high-melting-point metal, or high-melting-point metal silicide or polycide can be used as the gate material.

Figure 59:
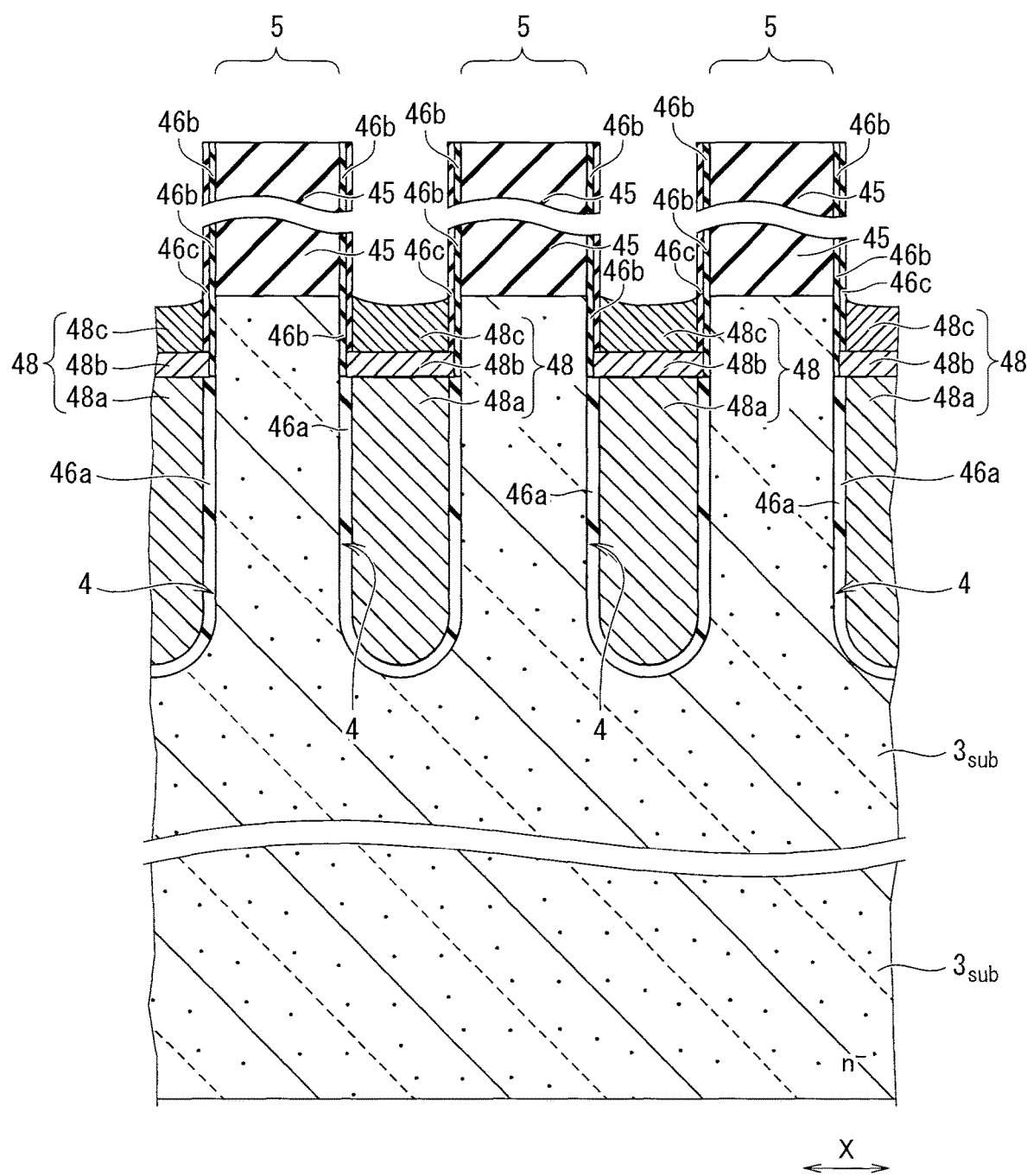
FIG. 59 is a diagram illustrating the method for manufacturing the semiconductor device according to the fourth embodiment of the present invention.

The upper surface of the gate material is etched back to the level illustrated in FIG. 59 to provide the third gate electrode 48c. The third gate electrode 48c that remains after the etching-back, the first gate electrode 48a, and the second gate electrode 48b provide the gate electrode 48 illustrated in FIG. 47.

Then, similarly to the process described in FIGS. 12 to 14, p-type first impurity ions are selectively implanted in the Y direction such that the contact region 12 is provided, although the illustration of the ion-implantation in the drawing is omitted. Then, p-type first impurity ions are selectively implanted between the regions into which a plurality of first impurity ions have been implanted such that the resistance reducing layer 41 is deposited.

Then, n-type second impurity ions are selectively implanted such that the emitter region 11 is provided. When the ions are implanted, the diffusion coefficient and projection distances of the first impurity ions and the second impurity ions are selected to depose the resistance reducing layer 41 below the emitter region 11.

Then, the same steps as those described in FIGS. 15 to 27 are performed. In the same steps as those described in FIGS. 15 to 27, an activation process is performed such that the activated resistance reducing layer 41 is positioned at the same height as the second gate electrode 48b and the second gate insulating film 46b.

The semiconductor device 1D according to the fourth embodiment illustrated in FIGS. 46 to 48 can be manufactured by the above-mentioned steps.

First Modification Example of Fourth Embodiment

In the semiconductor device according to the fourth embodiment, only a portion of the gate insulating film 46 which comes into contact with the resistance reducing layer 41 is selectively thinned, which makes it easy to depose an inversion layer. However, as in a semiconductor device 1E according to a first modification example of the fourth embodiment illustrated in FIG. 60, the thickness of a region of a gate insulating film 56 which comes into contact with the emitter region 11 may be small as long as an inversion layer can be easily deposed in the resistance reducing layer 41.

Figure 60:
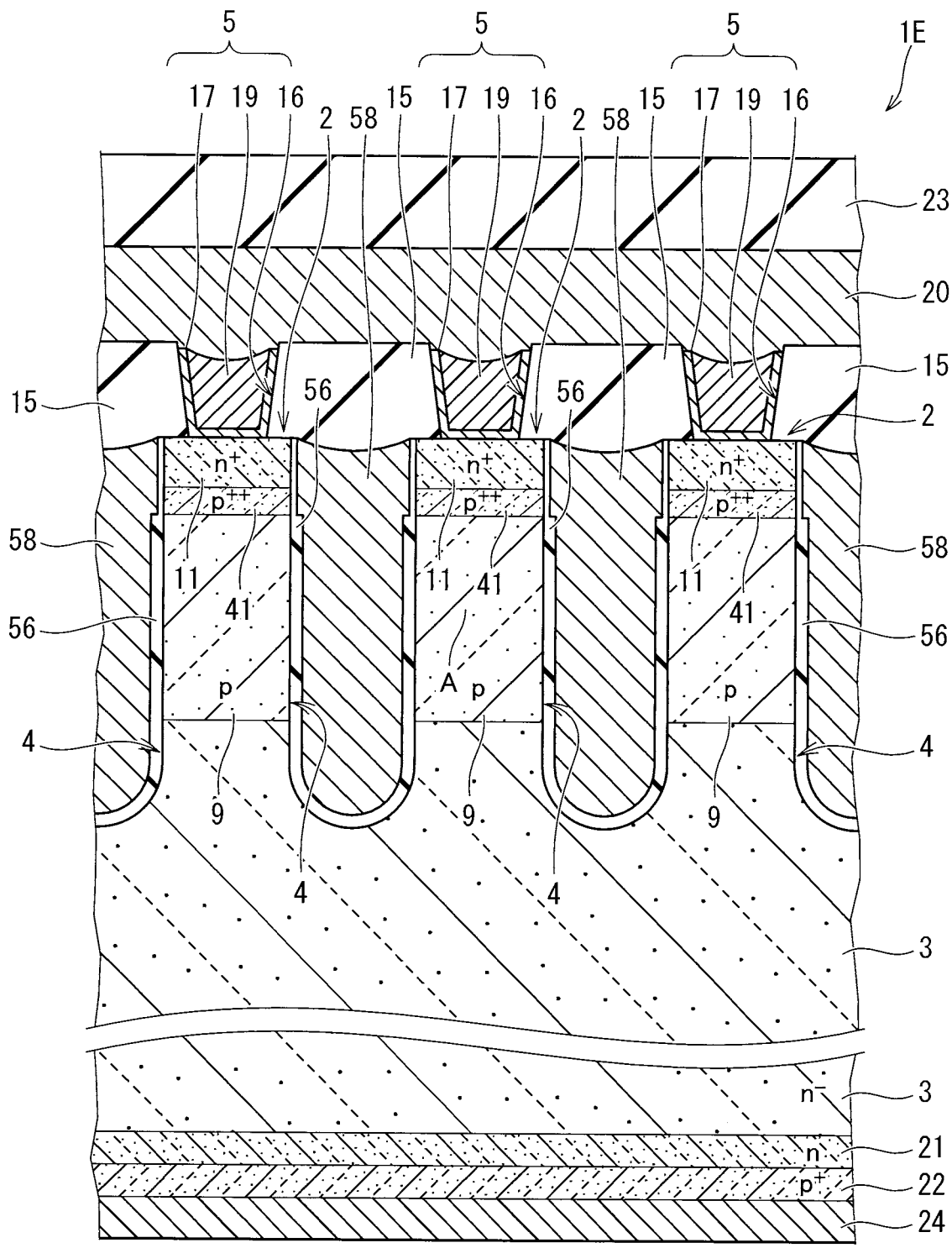
FIG. 60 is a cross-sectional view illustrating a main portion of a modification example of the semiconductor device according to the fourth embodiment of the present invention.

FIG. 60 is a cross-sectional view illustrating a main portion at a position corresponding to the line IIa-IIa of FIG. 1. FIG. 60 illustrates a state in which a region of the gate insulating film 56 which comes into contact with the resistance reducing layer 41 and the emitter region 11 is thinner than another portion of the gate insulating film 56 which comes into contact with the base region 9 and extends with a constant thickness in the vertical direction.

As such, in a structure in which, in the gate insulating film 56, not only the thickness of a region which comes into contact with the resistance reducing layer 41 but also the thickness of a region which comes into contact with the resistance reducing layer 41 and the emitter region 11 is small, manufacturing the gate insulating film 56 and a gate electrode 58 is simplified.

Specifically, depositing the third gate insulating film 46c illustrated in FIG. 57 is not necessary. In addition, manufacturing the third gate electrode 48c illustrated in FIG. 59 is not performed separately from manufacturing the second gate electrode 48b and the third gate electrode 48c and the second gate electrode 48b can be integrally provided by one manufacturing step. Therefore, simplifying the method for manufacturing the semiconductor device according to the fourth embodiment and thus to improve productivity is possible.

Second Modification Example of Fourth Embodiment

In the semiconductor device according to the fourth embodiment, the gate electrode 48 is provided with a depth at which the uppermost surface of the gate electrode 48 is flush with the upper surface of the emitter region 11. However, the gate electrode 48 may be provided at a position that is lower than that in FIG. 47 such that the upper surface of the gate electrode is flush with the upper surface of the resistance reducing layer 41.

In a method for manufacturing the semiconductor device according to the second modification example of the fourth embodiment, for example, the third gate insulating film 46c illustrated in FIG. 57 is deposed with a sufficient thickness to fill the trench 4. Then, a contact hole—via hole—is buried in the third gate insulating film 46c so as to reach the second gate electrode 48b. Therefore, the second gate electrode 48b functions as the uppermost layer of the gate electrode.

Then, the contact hole—via hole—is filled with a via plug. Therefore, connecting the second gate electrode 48b to a surface wire electrically is possible. The other steps are the same as those in the method for manufacturing the semiconductor device 1D according to the fourth embodiment of the present invention.

As such, according to the second modification example of the fourth embodiment in which the upper surface of the gate electrode is lower than the lower surface of the emitter region 11, reducing the parasitic capacitance between the emitter and the gate is possible and deposing an inversion layer easily in the resistance reducing layer 41 is possible.

Third Modification Example of Fourth Embodiment

In the description of the method for manufacturing the semiconductor device 1D according to the fourth embodiment, after the trench 4 is dug, the surface structure, such as the emitter region 11 or the resistance reducing layer 41, illustrated in FIG. 60 is deposed. However, the present invention is not limited to the semiconductor device 1D according to the fourth embodiment. For example, the order of the steps may be changed such that, after the surface structure, such as the emitter region 11 or the resistance reducing layer 41, is deposed, the trench 4 illustrated in FIG. 50 is dug. By the change, flexibility in selecting a gate electrode material is improved.

The present invention has been described in detail above on the basis of the first to fourth embodiments. The present invention is not limited to the above-described embodiments and various modifications and changes of the present invention can be made without departing from the scope and spirit of the present invention.

What is claimed is:

1. A semiconductor device comprising:
a plurality of trenches with each trench of the plurality of trenches having a stripe-shape and a pair of linear sidewalls continuously provided from a surface of a semiconductor substrate to a curved interface in form of a curved bottom surface between the pair of linear sidewalls of each trench of the plurality of trenches in a depth direction, each trench of the plurality of trenches extending in parallel to each other in which a polysilicon electrode is provided through an insulating film;
a plurality of mesa regions between adjacent trenches of the plurality of trenches, the plurality of mesa regions constituted by a minute-pattern in a range with a width of 0.1 micro meters to 1.0 micro meter;
an interlayer insulating film covers a top surface of the plurality of mesa regions;
a plurality of contact holes in the interlayer insulating film between the adjacent trenches,
each contact hole of the plurality of contact holes corresponds to a mesa region of the plurality of mesa regions above the top surface of the mesa region between the adjacent trenches,
each contact hole of the plurality of contact holes penetrates the interlayer insulating film to the top surface of each mesa region of the plurality of mesa regions, and
each contact hole of the plurality of contact holes extends along the plurality of trenches in a longitudinal direction in a plan view;
a metal material buried in the plurality of contact holes;
a plurality of emitter regions of a first conductivity type periodically provided in the plurality of mesa regions along the longitudinal direction so as not to overlap the polysilicon electrode in the plan view;
a base region of a second conductivity type provided immediately below the plurality of emitter regions; and
a plurality of contact regions of the second conductivity type having a higher impurity concentration than the base region, provided in the longitudinal direction so as not overlap the polysilicon electrode in the plan view, wherein
a length of a surface of an emitter region, among the plurality of emitter regions, in the longitudinal direction in the plan view is greater than a length of a surface of a contact region, among the plurality of contact regions, between two emitter regions among the plurality of emitter regions,
a length of an interface of a contact region, among the plurality of contact regions, with the base region in the longitudinal direction is greater than a length of an interface of the emitter region with the base region in the longitudinal direction, and the metal material buried in a contact hole among the plurality of contact holes includes:
a barrier-metal film covering at least a part of an inner wall of the contact hole; and
tungsten plug including a tungsten film in contact with the barrier-metal film and provided in the contact hole, so that the tungsten plug is in contact with the mesa region constituted by the minute-pattern via the barrier-metal film, resulting in a contact area of the tungsten plug with the emitter region being larger than that with the contact region.

2. The semiconductor device according to claim 1, wherein aspect ratio of a width of one of the plurality of contact holes in a second direction substantially perpendicular to the longitudinal direction in the plan view to a depth from a top surface of the interlayer insulating film to a bottom surface of the metal material is 0.8. to 1.5.

3. The semiconductor device according to claim 1, wherein a portion of the barrier-metal film is selectively removed in one of the plurality of contact holes to form an edge.

4. The semiconductor device according to claim 1, wherein the contact plug has a concave surface portion formed by recessing a surface of the contact plug.

5. The semiconductor device according to claim 4, further comprising an emitter electrode in contact with the concave surface portion of the contact plug.

6. The semiconductor device according to claim 5, wherein at least a part of a contact portion between the emitter electrode and the concave surface portion is provided in one of the plurality of contact holes.

7. The semiconductor device according to claim 1, wherein the barrier-metal film includes at least any one of a titanium film and a titanium nitride film.

8. The semiconductor device according to claim 1, wherein the tungsten plug results in the semiconductor device having a cross section in which a bottom surface of the tungsten plug is in contact with only the emitter region via the barrier-metal film and passes through the emitter region in a direction substantially perpendicular to the longitudinal direction in the plan view.

9. The semiconductor device according to claim 5, wherein the emitter electrode includes an aluminum film or an aluminum alloy film including any one of an aluminum-silicon alloy, an aluminum-copper alloy, and an aluminum-copper-silicon alloy.

10. The semiconductor device according to claim 1, wherein a trench of the plurality of trenches has a depth of 5 micro meters to 10 micro meters.

11. The semiconductor device according to claim 1, wherein the insulating film provided inside each trench of the plurality of trenches has a substantially constant film thickness.

12. The semiconductor device according to claim 1, wherein a width of a mesa region among the plurality of mesa regions is substantially constant in a depth direction.

13. The semiconductor device according to claim 1, wherein the contact region has an impurity concentration of about $3 \times 10^{18}/cm^3$ to $3 \times 10^{19}/cm^3$.

14. The semiconductor device according to claim 1, wherein the emitter region or the contact region is exposed through a bottom of the contact hole.

15. The semiconductor device according to claim 1, wherein a width of the emitter region or the contact region in a second direction substantially perpendicular to the longitudinal direction in the plan view is equal to a width of one of the plurality of mesa regions.

16. The semiconductor device according to claim 1, wherein a bottom of the contact region is deeper than a bottom of the emitter region.

17. The semiconductor device according to claim 16, wherein the plurality of contact regions are periodically provided in the longitudinal direction in the plan view.

18. The semiconductor device according to claim 17, wherein two contact regions of the plurality of contact regions wrap around and sandwich a bottom of the emitter region.

19. The semiconductor device according to claim 1, wherein a thickness of the insulating film at a portion contacting each emitter region of the plurality of emitter regions is substantially equal to or greater than a thickness at other portions of the insulating film.

20. The semiconductor device according to claim 1, where a bottom of the contact hole is located substantially at a surface of an upper part of the mesa region.

21. The semiconductor device according to claim 1, wherein the contact hole has angled sidewalls so that a top of the contact hole is wider than a bottom of the contact hole.

22. A semiconductor device comprising:
a plurality of trenches with each trench of the plurality of trenches having a stripe-shape and a pair of linear sidewalls continuously provided from a surface of a semiconductor substrate to a curved interface in form of a curved bottom surface between the pair of linear sidewalls of each trench of the plurality of trenches in a depth direction, each trench of the plurality of trenches extending in parallel to each other in which a polysilicon electrode is provided through an insulating film;
a plurality of mesa regions between adjacent trenches of the plurality of trenches, the plurality of mesa regions constituted by a minute-pattern in a range with a width of 0.1 micro meters to 1.0 micro meter;
an interlayer insulating film covers a top surface of the plurality of mesa regions;
a plurality of contact holes in the interlayer insulating film between the adjacent trenches,
each contact hole of the plurality of contact holes corresponds to a mesa region of the plurality of mesa regions above the top surface of the mesa region between the adjacent trenches,
each contact hole of the plurality of contact holes penetrates the interlayer insulating film to the top surface of each mesa region of the plurality of mesa regions, and
each contact hole the plurality of contact holes extends along the plurality of trenches in a longitudinal direction in a plan view;
a metal material buried in the plurality of contact holes;
a plurality of emitter regions of a first conductivity type periodically provided in the plurality of mesa regions along the longitudinal direction so as not to overlap the polysilicon electrode in the plan view;
a base region of a second conductivity type provided immediately below the plurality of emitter regions; and
a plurality of contact regions of the second conductivity type having a higher impurity concentration than the base region, provided in the longitudinal direction so as not to overlap the polysilicon electrode in the plan view wherein a length of a surface of an emitter region, among the plurality of emitter regions, in the longitudinal direction in the plan view is less than a length of a surface of a contact region, among the plurality of contact regions, between two emitter regions, among the plurality of emitter regions, a length of an interface of a contact region, among the plurality of contact regions, with the base region in the longitudinal direction is greater than a length of an interface of the emitter region with the base region in the longitudinal direction, and the metal material buried in a contact hole among the plurality of contact holes includes:
- a barrier-metal film covering at least a part of an inner wall of the contact hole; and
- a tungsten plug including a tungsten film in contact with the barrier-metal film and provided in the contact hole, so that the tungsten plug results in the semiconductor device having a cross section in which a bottom surface of the tungsten plug is in contact with only the emitter region via the barrier-metal film and passes through the emitter region in a direction substantially perpendicular to the longitudinal direction in the plan view.

23. The semiconductor device according to claim 22, where a bottom of the contact hole is located substantially at a surface of an upper part of the mesa region.

24. The semiconductor device according to claim 22, wherein the contact hole has angled sidewalls so that a top of the contact hole is wider than a bottom of the contact hole.

25. A semiconductor device comprising a transistor portion including:
- a plurality of trenches, each trench of the plurality of trenches having a stripe-shape and a pair of linear sidewalls continuously provided from a surface of a semiconductor substrate to a curved interface in form of a curved bottom surface between the pair of linear sidewalls of each trench of the plurality of trenches in a depth direction, each trench of the plurality of trenches extending in parallel to each other in which a polysilicon electrode is provided through an insulating film;
- a plurality of mesa regions between adjacent trenches of the plurality of trenches, the plurality of mesa regions constituted by a minute-pattern in a range with a width of 0.1 micro meters to 1.0 micro meter;
- an interlayer insulating film covers a top surface of the plurality of mesa regions; and
- a plurality of contact heleholes in the interlayer insulating film between the adjacent trenches,
  each contact hole of the plurality of contact holes corresponds to the mesa region above the top surface of the mesa region between the adjacent trenches,
  each contact hole of the plurality of contact holes penetrates the interlayer insulating film to the top surface of the mesa region,
  each contact hole of the plurality of contact holes extends along the plurality of trenches in a longitudinal direction in a plan view, and
- a metal material buried in the plurality of contact holes, wherein
  the metal material buried in a contact hole among the plurality of contact holes includes:
  - a barrier-metal film covering at least a part of an inner wall of the contact hole; and
  - a tungsten plug including a tungsten film contacting with the barrier-metal film and provided in the contact hole, so that the tungsten plug is in contact with the mesa region constituted by the minute-pattern via the barrier-metal film, resulting in a contact area with the emitter region being larger than that with the contact region, the mesa region comprises:
  - emitter regions of a first conductivity type periodically provided along the plurality of trenches in the longitudinal direction so as not to overlap the polysilicon electrode in the plan view;
  - contact regions of a second conductivity type provided such that each emitter region of the emitter regions is interposed between the contact regions along the longitudinal direction so as not to overlap the polysilicon electrode in the plan view; and
  - a base region of the second conductivity type provided immediately below the emitter regions and the contact regions, and in a cross-section along the longitudinal direction in the plan view, a structure of an emitter region, among the emitter regions, and a contact region, among the contact regions, adjacent to the emitter region, is so that a distance that is half of an emitter-injection width, which is a length of a boundary between a bottom of the emitter region and the base region in the longitudinal direction in the plan view, is less than a creeping distance of an emitter-contact p-n junction interface at a boundary between the emitter region and the contact region adjacent to the emitter region.

* * * * *

UNITED STATES PATENT AND TRADEMARK OFFICE
CERTIFICATE OF CORRECTION

PATENT NO. : 12,419,067 B2
APPLICATION NO. : 17/403666
DATED : September 16, 2025
INVENTOR(S) : Hitoshi Abe et al.

Page 1 of 1

It is certified that error appears in the above-identified patent and that said Letters Patent is hereby corrected as shown below:

In the Claims

Column 37, Line 7:
In Claim 1, before "tungsten" insert -- a --.

Column 37, Line 20:
In Claim 2, delete "0.8. to 1.5" and insert -- 0.8 to 1.5 --.

Column 39, Line 49:
In Claim 25, delete "heleholes" and insert -- holes --.

Signed and Sealed this
Third Day of February, 2026

John A. Squires
*Director of the United States Patent and Trademark Office*